(12) United States Patent  (10) Patent No.: US 9,404,677 B2
Sankrithi  (45) Date of Patent: *Aug. 2, 2016

(54) INFLATABLE LINEAR HELIOSTATIC CONCENTRATING SOLAR MODULE

(75) Inventor: Mithra M. K. V. Sankrithi, Lake Forest Park, WA (US)

(73) Assignee: RIC Enterprises, Late Forest Park, WA (US)

( * ) Notice: Subject to any disclaimer, the term of this patent is extended or adjusted under 35 U.S.C. 154(b) by 1347 days.

This patent is subject to a terminal disclaimer.

(21) Appl. No.: 12/781,610

(22) Filed: May 17, 2010

(65) Prior Publication Data

US 2011/0277815 A1  Nov. 17, 2011

(51) Int. Cl.
  *F24J 2/54* (2006.01)
  *F24J 2/14* (2006.01)
  *F24J 2/52* (2006.01)
  *H01L 31/054* (2014.01)

(52) U.S. Cl.
  CPC .. *F24J 2/541* (2013.01); *F24J 2/14* (2013.01); *F24J 2/5271* (2013.01); *H01L 31/0547* (2014.12); *Y02E 10/45* (2013.01); *Y02E 10/47* (2013.01); *Y02E 10/52* (2013.01)

(58) Field of Classification Search
  CPC .............................. H01L 31/0547; F24J 2/541
  USPC .......................................................... 136/246
  See application file for complete search history.

(56) References Cited

U.S. PATENT DOCUMENTS

| | | | |
|---|---|---|---|
| 4,296,731 A * | 10/1981 | Cluff | 126/578 |
| 4,581,897 A | 4/1986 | Sankrithi | |
| 5,404,868 A | 4/1995 | Sankrithi | |
| 6,100,600 A * | 8/2000 | Pflanz | 290/54 |
| 6,994,082 B2 * | 2/2006 | Hochberg et al. | 126/696 |
| 7,750,491 B2 | 7/2010 | Sankrithi | |
| 7,997,264 B2 | 8/2011 | Sankrithi | |
| 8,127,760 B2 | 3/2012 | Sankrithi | |

FOREIGN PATENT DOCUMENTS

AU  2010200072  10/2010

OTHER PUBLICATIONS

Joe Coventry, Performance of a concentrating photovotlaic/thermal solar collector, 2005, Solar Energy, 78, 211-222.*

(Continued)

*Primary Examiner* — Shannon Gardner

(57) ABSTRACT

Increased utilization of solar power is highly desirable as solar power is a readily available renewable resource with power potential far exceeding total global needs; and as solar power does not contribute to pollutants associated with fossil fuel power, such as unburned hydrocarbons, NOx and carbon dioxide. The present invention provides low-cost inflatable heliostatic solar power collectors, which a range of embodiments suitable for flexible utilization in small, medium, or utility scale applications. The inflatable heliostatic power collectors use a reflective surface or membrane "sandwiched" between two inflated chambers, and attached solar power receivers which are of concentrating photovoltaic and optionally also concentrating solar thermal types. Floating embodiments are described for certain beneficial applications on. Modest concentration ratios enable benefits in both reduced cost and increased conversion efficiency, relative to simple prior-art flat plate solar collectors.

6 Claims, 44 Drawing Sheets

(56) References Cited

OTHER PUBLICATIONS

M. Sankrithi & U. Sankrithi, "Prototype Development and Testing of Inflatable Concentrating Solar Power Systems," SOLAR 2010 Conference, Phoenix, Az, SOLAR2010_0251, May 18, 2010.

M. Sankrithi & U. Sankrithi, "Beneficial Applications of Inflatable Heliostatic Mirrors," World Renewable Energy Forum, Denver, CO, WREF_2012_0273, May 14, 2012.

* cited by examiner

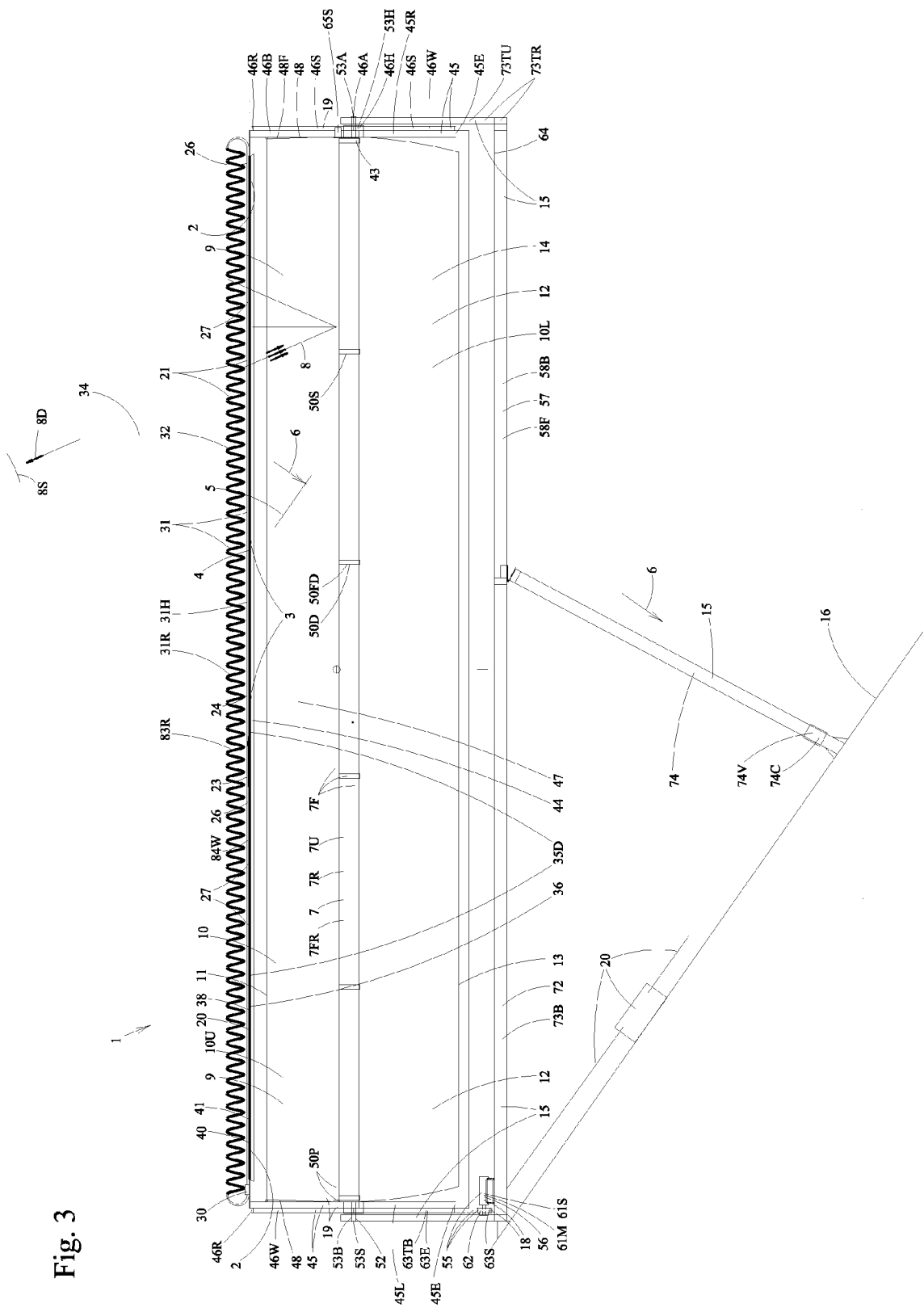

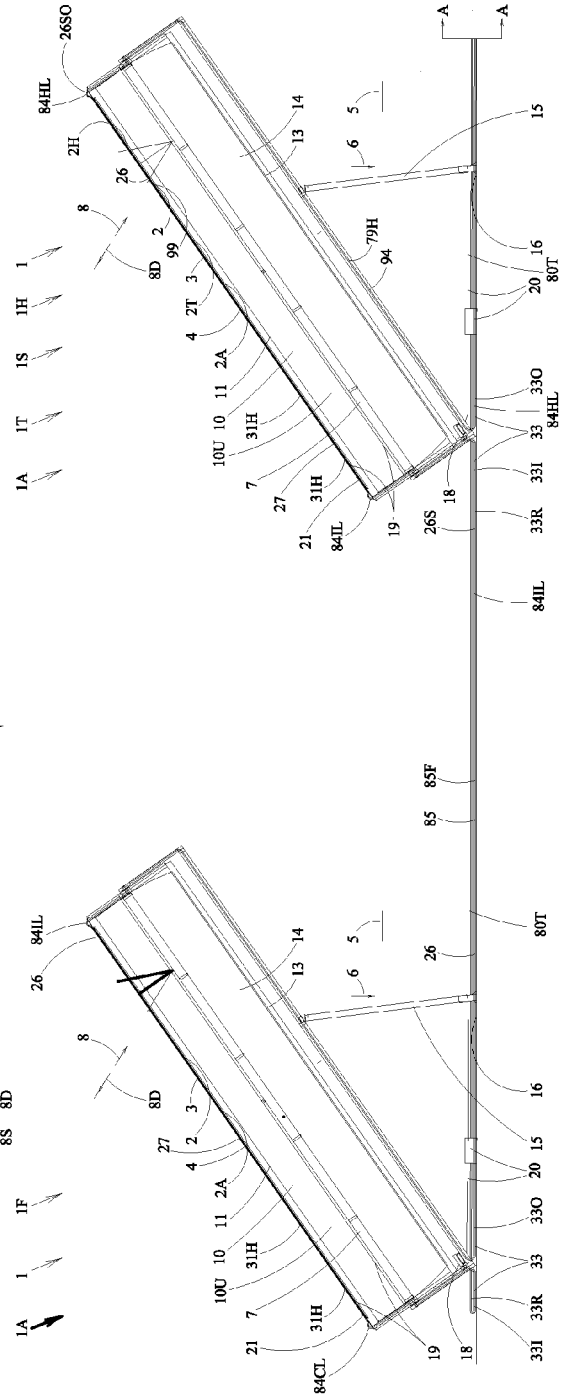
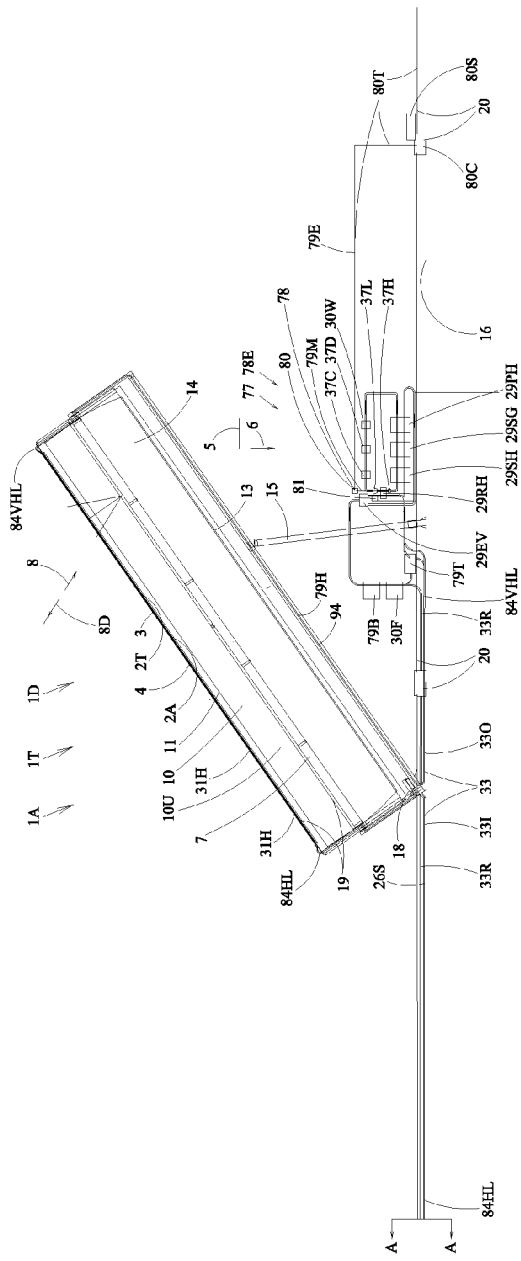
Fig. 6B

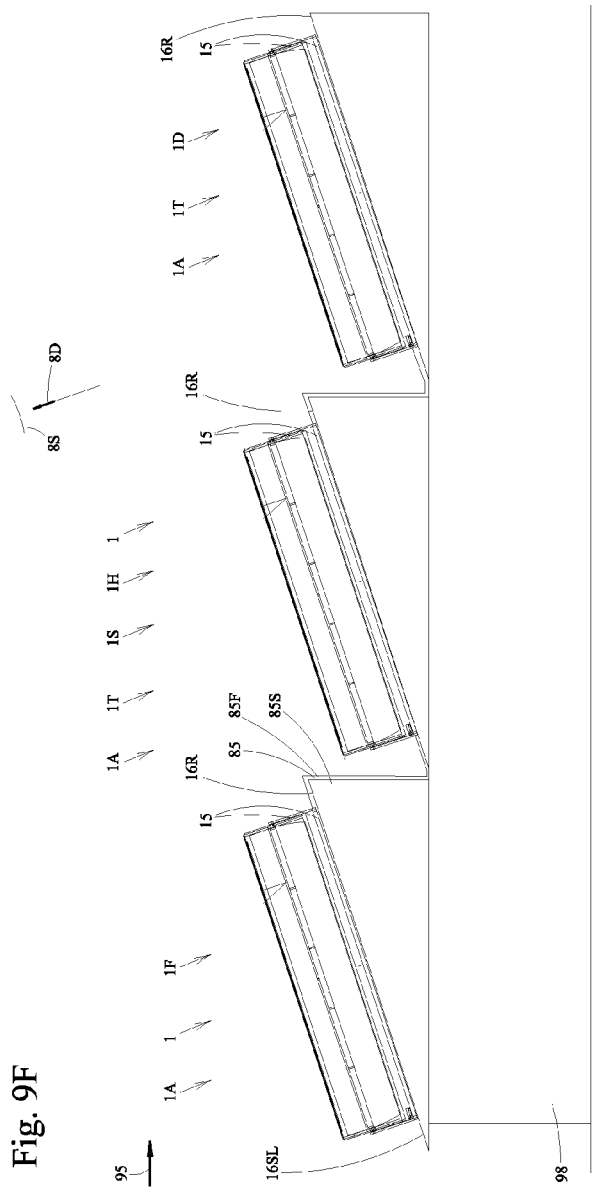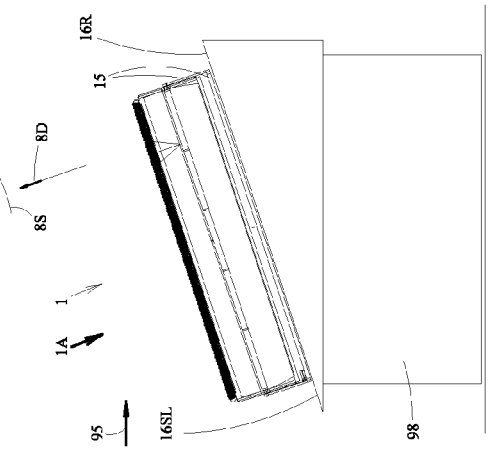

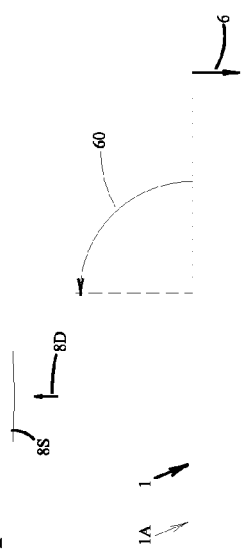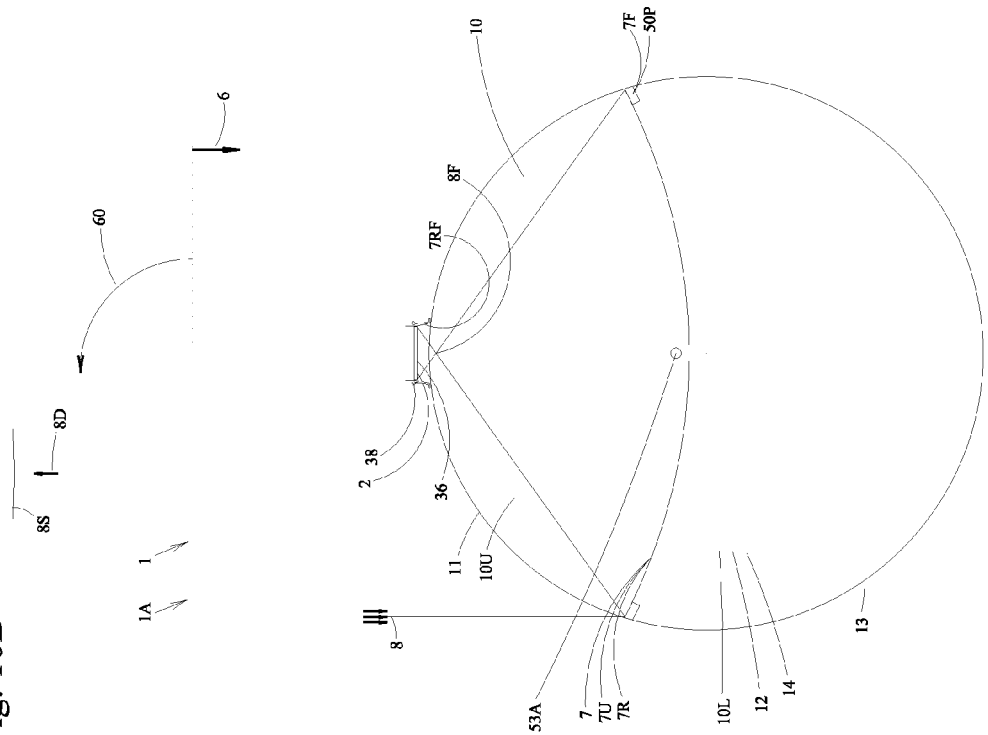
Fig. 10A
Fig. 10B

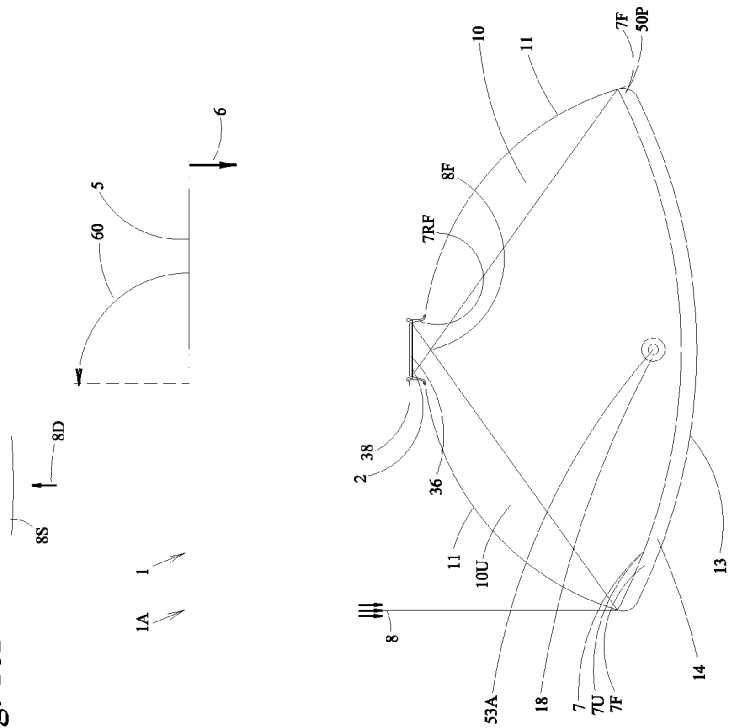
Fig. 10E
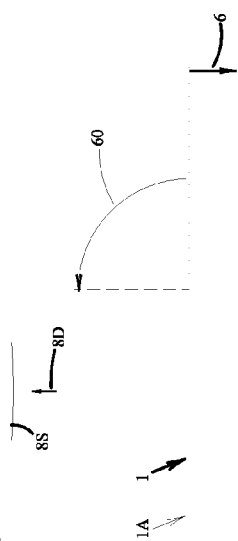
Fig. 10F
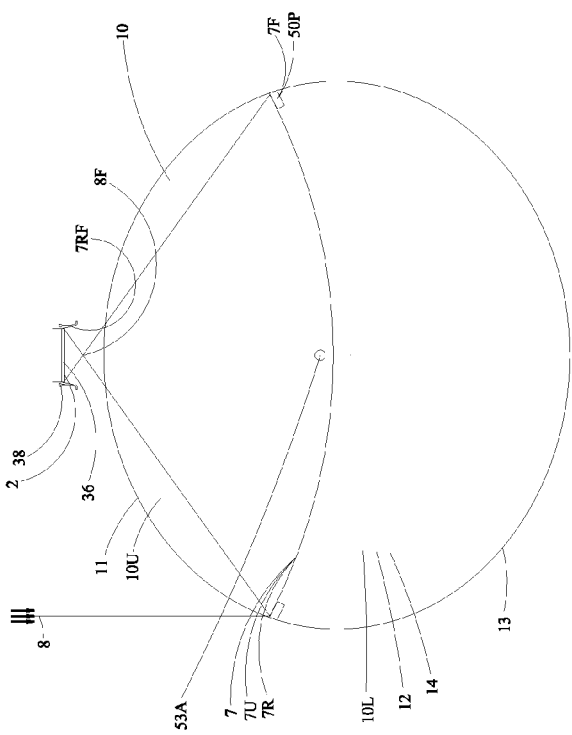

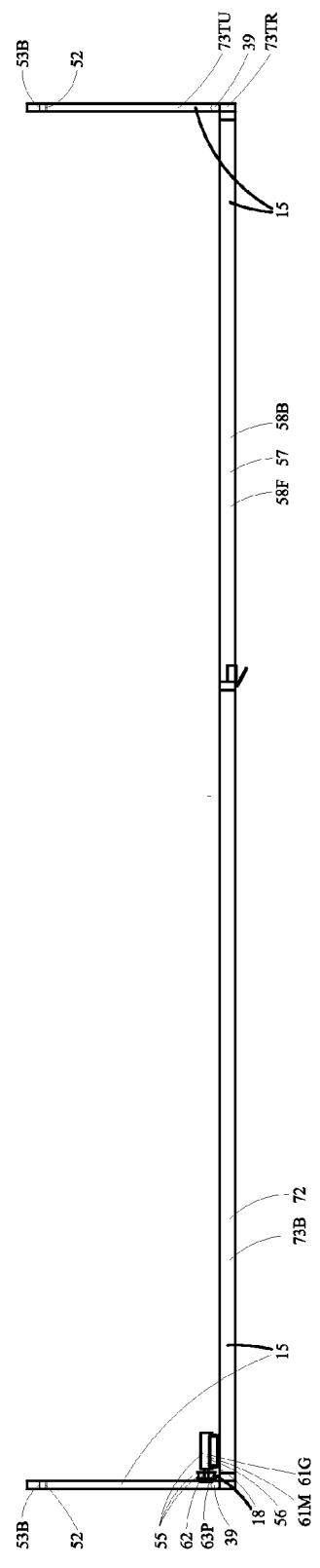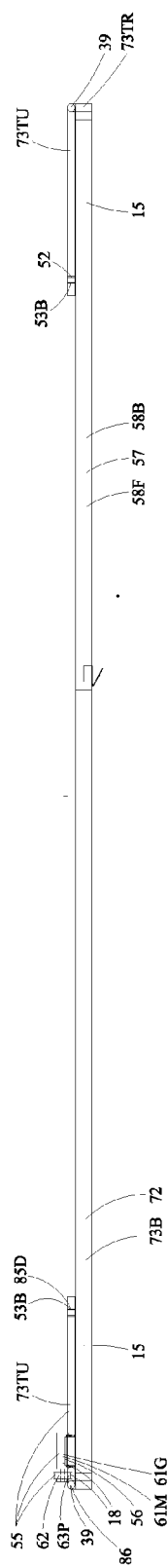
Fig. 16A
Fig. 16B

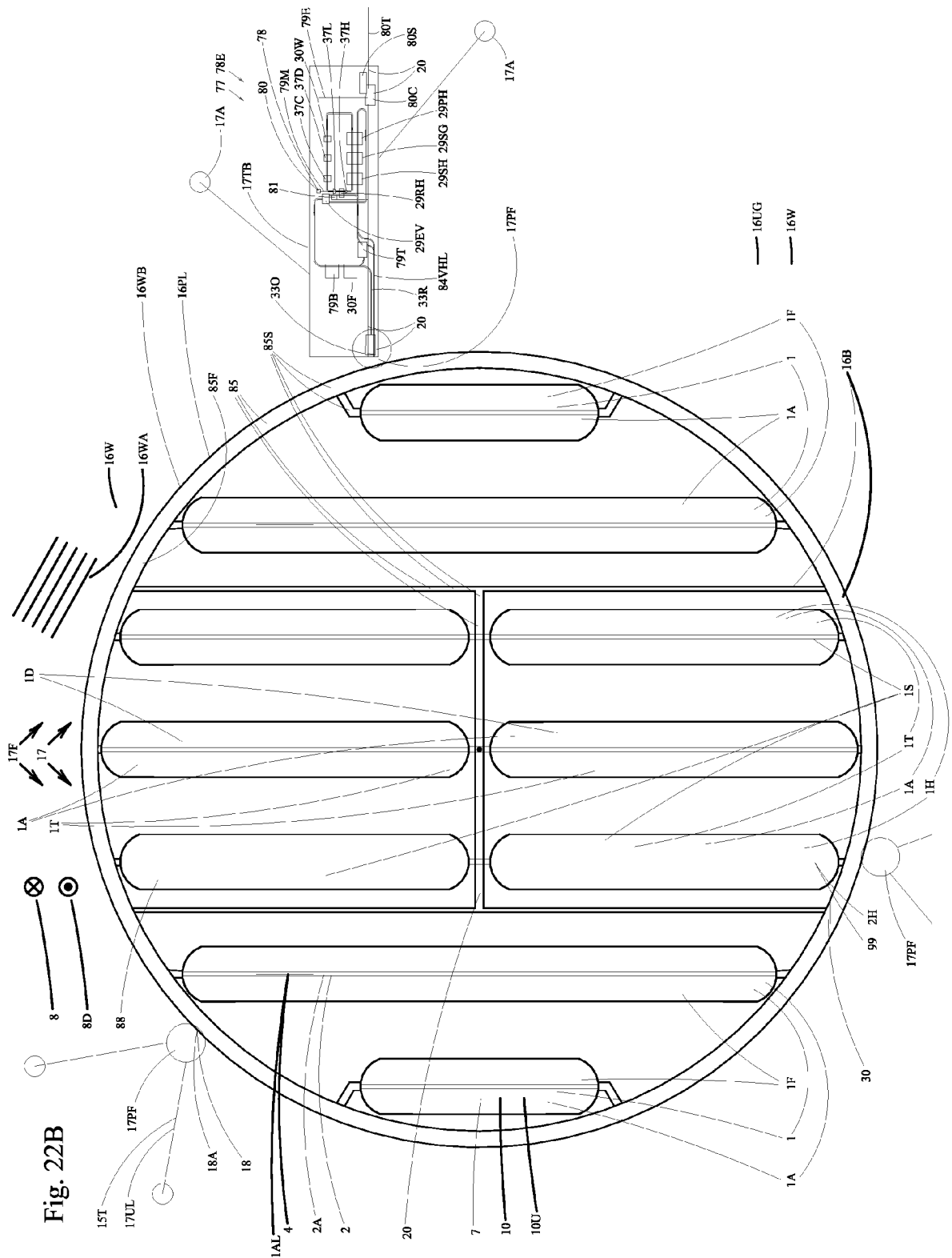

INFLATABLE LINEAR HELIOSTATIC CONCENTRATING SOLAR MODULE

BACKGROUND OF THE INVENTION

Increased utilization of solar power is highly desirable as solar power is a readily available renewable resource with power potential far exceeding total global needs; and as solar power does not contribute to pollutants associated with fossil fuel power, such as unburned hydrocarbons, NOx and carbon dioxide. Solar powerplants produce no carbon dioxide that contributes as a greenhouse gas to global warming-in sharp contrast to fossil fuel powerplants such as coal, oil and even natural gas powerplants. Limitations to the widespread deployment of solar power has largely been a consequence of higher power cost per kilowatt-hour for traditional solar power systems as compared with fossil fuel power systems, driven in large part by the cost to make these solar power systems.

BRIEF SUMMARY OF THE INVENTION

The present invention provides inventive development of inflatable heliostatic solar collector devices. More specifically, the present invention provides for low-cost inflatable heliostatic solar power collectors, which are stand-alone units suitable for use in small, medium, or utility scale applications, as opposed to prior art "power tower" concepts best suited for utility scale application. In one preferred embodiment the inflatable heliostatic power collector uses a reflective surface or membrane "sandwiched" between two inflated chambers, and an elongated linear solar power receiver which receives solar insolation reflected and concentrated by this reflective surface.

The power receiver includes a photovoltaic receiver and may optionally also include a solar thermal receiver element, in preferred embodiments of the invention. The utilization of modest concentration ratios enables benefits in both reduced cost and increased conversion efficiency, relative to simple prior-art flat plate solar panels using silicon solar cells.

In a preferred embodiment the inflatable structure includes inventive application of simple lightweight and low cost frame members, and polar axis heliostatic aiming for Sun tracking, using simple and low cost motorized pointing control means. The polar axis will typically be oriented in a North-South orientation, with a tilt corresponding to latitude or a value within 25 degrees of the latitude. Air or liquid cooling means will preferably be utilized to keep temperatures in the photovoltaic receiver from exceeding limit values. The invention is intended to provide great flexibility and value in tailored applications using varying numbers of the low-cost inflatable heliostatic power collectors, of varying scalable size designs, for optimal use in applications ranging from (i) one or a few units for private home installations on a rooftop or back-yard, to (ii) estate/farm/ranch/commercial building installations with a small/medium field of units, to (iii) utility scale installations with medium/large/very large field(s) of units.

BRIEF DESCRIPTION OF THE DRAWINGS

FIG. 3 shows a side view of a preferred embodiment similar to the embodiment of FIG. 2A, but also fitted with a pump.

FIGS. 6A and 6B show side views of combinations of plural solar modules of different types in sequence.

FIGS. 9A through 9H show side views of alternate embodiments of the invention.

FIGS. 10A through 10J show partial cross-sectional views of alternate embodiments of an inflatable linear heliostatic concentrating solar module, illustrated as a solar photovoltaic module, without limitation.

FIGS. 16A and 16B show partial side views of deployed and shipping configurations of a lower module of an inflatable linear heliostatic concentrating solar module that is a solar photovoltaic module, similar to that shown and described in detail earlier in the context of FIG. 1A.

FIGS. 22A through 22G show plan views of various floating embodiments of the invention.

DETAILED DESCRIPTION

Figure 1A:
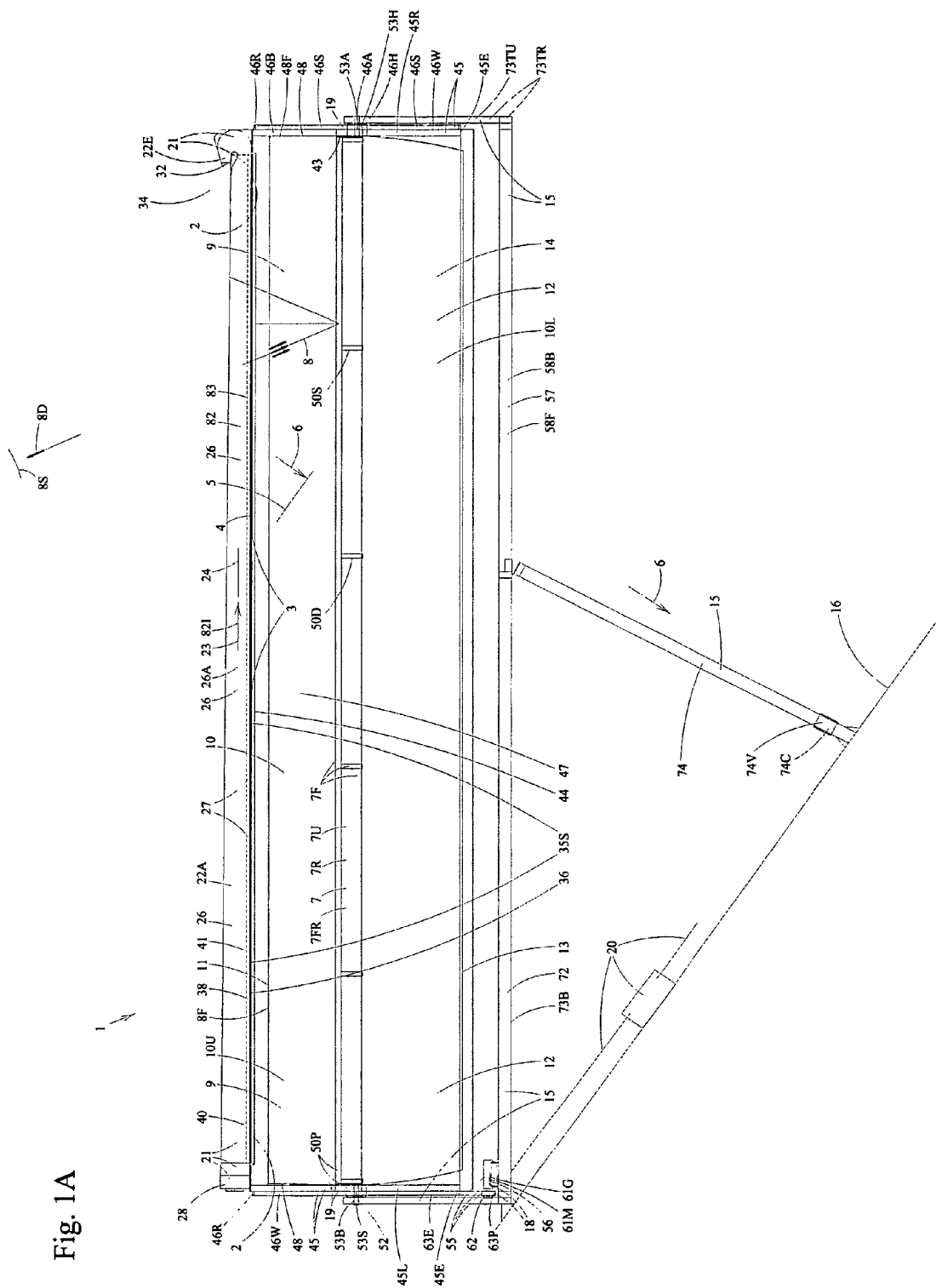
FIG. 1A shows a side view of a preferred air-cooled embodiment of the inflatable concentrating photovoltaic module invention.

FIG. 1A shows a tilted side view of a preferred air-cooled embodiment of the inflatable concentrating photovoltaic module invention.

FIG. 1A shows a tilted inflatable linear cooled heliostatic concentrating solar photovoltaic module 1, comprising: an elongated solar photovoltaic receiver 2 including a portion of substantially linear geometry 3 with a linear axis 4 in its installed orientation being tilted up from a horizontal plane 5 that is perpendicular to the local gravity vector 6; a reflection and concentration surface 7 for reflecting and concentrating sunrays 8; an elongated upper inflatable volume 9 above said reflection and concentrating surface 7, with a substantially transparent surface 11 above said upper inflatable volume 9; an elongated lower inflatable volume 12 below said reflection and concentrating surface 7, with a bottom surface 13 below said lower inflated volume 12; support structure 15 for supporting said solar photovoltaic module 1 on a supporting surface 16; heliostatic control means 18 for aiming a rotatable portion 19 of said solar photovoltaic module 1 as a function of at least one of time and other parameters, such that incoming sunrays 8 from a sunward direction 8D will be reflected and concentrated by said reflection and concentration surface 7, onto said elongated solar photovoltaic receiver 2 at a concentration ratio of at least two suns; electrical power means 20 for collecting and transmitting electrical power from said elongated solar photovoltaic receiver 2; and cooling means 21 for removing excess heat 27 from said elongated solar photovoltaic receiver 2, said cooling means 21 including a tilted fluid path 23 that is tilted up in an orientation 24 including a component along said linear axis 4, wherein buoyancy force acting on heated cooling fluid 26 that is heated by heat 27 from said elongated photovoltaic receiver 2, contributes to moving said heated cooling fluid 26 upward in said tilted fluid path 23.

In the illustrated embodiment the linear axis 4 is tilted from the horizontal plane 5 by a value corresponding substantially to the latitude of the installation of the solar photovoltaic module 1, such that incoming sunrays would be substantially perpendicular or normal to the linear axis 4 at the time of the vernal and autumnal equinoxes, and tilted at the time of the summer and winter solstices. The illustrated angle of the incoming sunrays 8 coming from a sunward direction 8D, corresponds approximately to winter solstice at solar noon, when the Sun's effective location will be lower or Southward towards the horizon for Northern Hemisphere installations, and lower or Northward towards the horizon in the Southern Hemisphere installations. Note that the sunrays 8 penetrate through the substantially transparent upper surface 11, get reflected by the reflection and concentration surface 7 and then go through the transparent upper surface 11 again, before impinging on an elongated linear capture area on the typically downward facing solar cells of the elongated photovoltaic receiver 2. The sunrays reflected by the reflecting and concentration surface 7 converge towards a focal line of reflected sunrays 8F and diverge after passing this focal line of reflected sunrays 8F. It should be noted that a true focal line exists when the reflective surface is a true parabola in shape, but for typical approximate circular section reflectors we define the focal line of reflected sunrays 8F as the centerline in the middle of the narrowest width part of the reflected beams of sunlight that occurs between where the reflected beams converge and diverge. The location of the focal line of reflected sunrays 8F is just very slightly below the crown (top) line of the transparent upper surface 11 in the illustrated embodiment in FIG. 1A, and will be seen with greater clarity in FIG. 1B following. The transparent upper surface 11 will preferably utilize a transparent material system that has very high transmissivity, is durable and tough, does not deteriorate when exposed to light and temperature variations and weather elements, and has a "self cleaning" attribute when naturally washed with rainwater. An example material that meets these attributes is ETFE, also known as Tefzel or Fluon, that has already found application in demanding applications in buildings, greenhouses, etc. The reflection and concentration surface should be highly reflective, light weight and low cost, and a reflectorized membrane such as mirror aluminized mylar could be used. The bottom surface 13 should be low cost, rugged and tough and hard to puncture, and suitable for protecting the solar module from hail or damage from storm induced falling twigs etc, when the device is in an inverted storm stow mode. Some examples, without limitation, are (i) a bottom surface material such as thick gage reinforced polyethylene membrane such as the material used in pond liners, and (ii) bubble wrap sandwich plus an external strong skin for the lower surface of the bottom surface 13.

FIG. 1A also shows a tilted inflatable linear cooled heliostatic concentrating solar photovoltaic module 1, comprising: an elongated solar photovoltaic receiver 2 including a portion of substantially linear geometry 3 with a linear axis 4 in its installed orientation being tilted up from a horizontal plane 5 that is perpendicular to the local gravity vector 6; a reflection and concentration surface 7 for reflecting and concentrating sunrays 8; a substantially enclosed elongated inflatable volume 10 comprising (i) an upper inflatable volume 10U above said reflection and concentrating surface 7, with a substantially transparent surface 11 above said upper inflatable volume 10U, and further comprising (ii) a lower volume 14 below said reflection and concentrating surface 7, with a bottom surface 13 below said lower volume 14; support structure 15 for supporting said solar photovoltaic module 1 on a supporting surface 16 with said linear axis 4 in its installed orientation being tilted up from a horizontal plane 5 that is perpendicular to the local gravity vector 6; heliostatic control means 18 for aiming a rotatable portion 19 of said solar photovoltaic module 1 as a function of at least one of time and other parameters, such that incoming sunrays 8 from a sunward direction 8D will be reflected and concentrated by said reflection and concentration surface 7, onto said elongated solar photovoltaic receiver 2 at a concentration ratio of at least two suns; electrical power means 20 for collecting and transmitting electrical power from said elongated solar photovoltaic receiver 2; and cooling means 21 for removing excess heat 27 from said elongated solar photovoltaic receiver 2, said cooling means 21 including a tilted fluid path 23 that is tilted up in an orientation 24 including a component along said linear axis 4, wherein buoyancy force acting on heated cooling fluid 26 that is heated by heat 27 from said elongated photovoltaic receiver 2, contributes to moving said heated cooling fluid 26 upward in said tilted fluid path 23.

In the embodiment of FIG. 1A the fan 28 blows cool ambient air up a air cooling pipe 22A, which is preferably made of heat conductive material such as aluminum or copper alloys, to cite a couple of examples without limitation. The air cooling pipe 22A conducts excess heat 27 from the elongated solar photovoltaic receiver 2 to a stream of air flowing up the air cooling pipe 22A, to the right in FIG. 1A. The air serves as the heated cooling fluid 26 in this embodiment, and is driven in part to the right in FIG. 1A (upward and Northward in a typical Northern Hemisphere installation, upward and Southward in a typical Southern Hemisphere installation) by the natural buoyancy force that acts on heated fluid, and driven in part by the fan 28. The heated air exits the air cooling pipe 22A through an exhaust hood 22E that serves as heat transfer means 32, for venting the hot air which is the heated cooling fluid 26, out into the cool atmosphere which is the cooler environment 34. The illustrated exhaust hood 22E has a roof element to prevent rain or other precipitation from falling into the air cooling pipe 22A. The exhaust orifice of the exhaust hood 22E and the intake orifice to the fan 28 may optionally covered with grille, mesh or screen material that allows mostly free flow of air, but prevents birds or insects or debris from entering into the air cooling pipe 22A. While a blowing fan located near the bottom of the air cooling pipe is shown in the illustrated embodiment, it will be understood that alternate fan locations in the cooling pipe, or a sucking fan located near the top of the air cooling pipe, could be employed alternatively or in combination in other embodiments of the invention as claimed.

FIG. 1A also illustrates a solar photovoltaic module 1, wherein the elongated solar photovoltaic receiver 2 includes at least one of (i) a single row 35S of solar cells 36 (shown), (ii) a double row of solar cells (not shown), and (iii) multiple substantially linear rows of solar cells (not shown); which solar cells 36 are connected together by wires 38 at least in one of in series, in parallel, and in a combination of series and parallel; and which solar cells 36 are attached to a substantially linear upper beam structure 40 that serves as conductive heat transfer means 41 for enabling conductive heat transfer from said solar cells 36 to said heated cooling fluid 26, which heated cooling fluid 26 is heated by heat from said elongated photovoltaic receiver 2 when the Sun 8S is shining and said solar photovoltaic module 1 is operating.

The upper beam structure 40 may incorporate heat sink extrusion members in its interior to facilitate cooling performance, and in a version with two sided solar cells at the bottom of the upper beam structure 40, the top of the upper beam structure 40 may be made of transparent material. Solar cells 36 may be monocrystalline or polycrystalline, or special high temp CPV cells known in the art; may have leads/connections in the back only or back and front; may have antireflective coatings and/or a protective film cover; may use encapsulant and/or side seals; and may have highly conductive wire side leads.

FIG. 1A also illustrates a solar photovoltaic module 1, wherein the heated cooling fluid 26 comprises heated cooling air 26A and wherein a fan 28 further contributes to moving said heated cooling fluid 26 upward in said tilted fluid path 23; said cooling means 21 further including heat transfer means 32 for transferring heat from said heated cooling fluid 26 to a cooler environment 34 outside said solar photovoltaic module 1, which heat transfer means 32 includes at least one of (i) a cooling tube 82 with internal air flow 82I at least partially driven by said fan 28, (ii) cooling fins 83, (iii) a cooling plate 83P (not shown), (iii) cooling spikes 83S (not shown), (iv) a cooling extrusion 83E (here the same as the cooling fins 83) and (v) a cooling radiator 83R (not shown).

FIG. 1A also illustrates a solar photovoltaic module 1, wherein the solar photovoltaic module 1 includes a central portion 44 with an approximately constant cross-section on planar cuts perpendicular to the axis of elongation of said elongated solar photovoltaic receiver 2, and further includes left and right end structures 45 attached at least one of (a) hingedly and (b) fixedly, near the left and right ends of said upper beam structure 40, which left and right end structures 45 each comprise at least one of (i) a beam member 46B (shown), (ii) a wheel member 46W (shown), (iii) a rim member 46R (shown), (iv) plural spoke members 46S (shown), (v) a hub member 46H (shown), (vi) an axle member 46A (shown), (vii) a plate member 46P (not shown), (viii) a dished plate member 46D (not shown) and (ix) a second beam member 46SB (not shown) substantially perpendicular to said beam member 46B.

The left and right end structures 45 provide end containment for at least one of normal and non-normal conditions, for the left and right ends of the reflection and concentrating surface 7 as well as for the left and right ends of the upper inflatable volume 9 and lower inflatable volume 12.

The embodiment illustrated in FIG. 1A also shows a solar photovoltaic module 1, wherein the elongated upper inflatable volume 9 includes an inflatable central portion 47 with an approximately constant cross-section on planar cuts perpendicular to the axis of elongation of said elongated upper inflatable volume 9, and further includes left and right end closure portions 48 on the left and right sides of said inflatable central portion 47, which left and right closure portions 48 serve to provide left and right side enclosure for said elongated upper inflatable volume 9, wherein said left and right end closure portions 48 are at least one of (a) transparent, (b) partially transparent, (c) reflective, (d) partially reflective or reflective on the inner side only, and (e) nontransparent; and wherein said left and right end closure portions 48 comprise at least one of (i) a membrane 48M, (ii) an at least partially framed membrane 48F (shown), (iii) an at least partially rigid dome segment 48R (not shown), (iv) a plate member 48P (not shown), and (v) a dished plate member 48D (not shown).

The left and right end closure portions 48 may optionally use single or double wall ETFE or polycarbonate or other transparent material. Optional end members that close the right and left ends of the lower inflatable volume 12 may be nontransparent, and may use the same material or sheeting that is used for the bottom surface 13.

FIG. 1A also shows a solar photovoltaic module 1, wherein the reflection and concentration surface 7 includes a frame 7F with perimeter structural members 50P supporting said reflection and concentration surface 7 along at least portions of the perimeter of said reflection and concentration surface 7; and further comprising structural connection means 43 for at least one of detachably and permanently structurally connecting said frame 7F to said left and right end structures 45.

The embodiment illustrated in FIG. 1A further illustrates a solar photovoltaic module 1, wherein the reflection and concentration surface 7 includes at least one of (i) a reflective membrane 7R which is reflective on its upper side and wherein an upwardly concave desired shape 7S (not visible in this view) of said reflective membrane 7R is at least in part maintained by the application of differential inflation pressure between said upper inflatable volume 9 and said lower inflatable volume 12, (ii) a mirror element 7M (not shown) which is reflective and concave on its upper side 7U, and (iii) a frame supported reflective membrane 7FR which is supported by a frame 7F and is reflective and concave on its upper side 7U, wherein said frame 7F comprises at least one of (a) perimeter structural members 50P supporting said reflection and concentration surface 7 along at least portions of the perimeter of said reflection and concentration surface 7, which perimeter structural members 50P also contribute to perimeter restraint of at least one of said substantially transparent surface 11 and said bottom surface 13; (b) shaping means 50S adjacent to said reflection and concentration surface 7 serving as shaping means for contributing to an upwardly concave desired shape 7S of said reflection and concentration surface 7; and (c) frame supported damping means 50FD (not designated but corresponding to the element shown by the designator 50D in the illustrated embodiment) adjacent to said reflection and concentration surface 7 serving as damping means 50D for damping undesirable motion of said reflection and concentration surface 7.

Note that the word "upwardly" refers to a direction with a sunward vector component, and typically best aligned with the direction vector to the Sun at solar noon. Note that the adjacent shaping means 50S may comprise at least one of connected substantially rigid shaping structure and connected shaping tension elements, and that the damping means 50FD may include viscoelastic damping materials or layer(s). Note also that undesirable motion may be induced by wind loads, by motor driven heliostatic pointing, by structural oscillations or vibrations, and by other causes.

The embodiment illustrated in FIG. 1A also illustrates a solar photovoltaic module 1, further comprising rotatable attachment means 52 for at least one of detachably and permanently rotatably attaching said left and right end structures 45 to said support structure 15 for supporting said solar photovoltaic module 1, wherein said rotatable attachment means 52 includes at least one of (i) a hub 53H, (ii) an axle 53A, (iii) a shaft 53S, (iv) a bearing 53B, (v) a pillow-block bearing 53PB (not shown), and (vi) a joint 53J (not shown); and wherein said heliostatic control means 18 for aiming a rotatable portion 19 of said solar photovoltaic module 1 includes powered means 55 for controllably rotating at least one of said left and right end structures 45, relative to said support structure 15 for supporting said solar photovoltaic module 1 on a supporting surface 16.

The illustrated powered means 55 provides means for controllably rotating the left end structure 45 and uses a motor driving a belt via a pulley, as illustrated. Different belt types such as timing belts, toothed belts or belt analogues such as chains can alternatively be used. The belt engages and drives the rim member 46R of a wheel member 46W in the illustrated embodiment of the invention, with a substantial gear reduction inherent in the belt drive as the wheel rim has a much larger diameter than the diameter of the pulley. This gear reduction is over and above any gear reduction built into the motor, which may for instance be a gearmotor (illustrated) or a stepper motor (an alternative).

Thus a solar photovoltaic module 1 is shown, wherein the heliostatic control means 18 for aiming a rotatable portion 19 of said solar photovoltaic module 1 as a function of at least one of time and other parameters, includes powered elevation control means 56 for orienting said rotatable portion 19 of said solar photovoltaic module 1 over varying elevation angle 60 (see view in FIG. 1B) to follow the apparent daily motion of the Sun 8S from East to West, wherein said powered elevation control means 56 comprises at least one of (a) a motor 61M, (b) a gear motor 61G, (c) a stepper motor 61S (not shown), and (d) an actuator 61A (not shown); and wherein said powered elevation control means 56 further comprises control linking means 62 serving as controllable means for variable-geometry linking between said support structure 15 on the first hand, and said rotatable portion 19 of said solar photovoltaic module 1 on the second hand; said control linking means 62 comprising at least one of (i) a powered pulley 63P engaging and driving an elevation control revolving drive element 63E selected from the group consisting of a belt 63B (not designated but corresponding to the element shown by the designator 63E in the illustrated embodiment) and a chain 63H (not shown) and a cable 63C (not shown), (ii) a powered sprocket 63S (not shown) engaging and driving an elevation control revolving drive element 63E selected from the group consisting of a chain 63H (not shown) and a toothed belt 63TB (not shown) and a belt with periodic holes 63BP (not shown) and a toothed cable 63TC (not shown), (iii) a powered gear element 63PG (not shown) engaging and driving a driven gear element 63DG (not shown), and (iv) an orientation drive linkage 63OD (not shown).

The embodiment illustrated in FIG. 1A also illustrates a solar photovoltaic module 1, further comprising ballast means 57 located at a lower end region 45E of at least one of said left end and right end structures 45, for acting at least in part as a counterbalancing weight to the weight of said upper beam structure 40, which ballast means 57 comprises at least one of (a) a ballast weight 58W (not shown) located at the lower end region 45E of left end structure 45L, (b) a ballast weight 58W (not shown) located at the lower end region 45E of right end structure 45R, (c) a ballast beam 58B that connects the lower end regions 45E of said left end structure 45L and said right end structure 45R, through at least one of detachable and permanent connection means, and (d) a fillable hollow ballast beam 58F that connects the lower end regions 45E of said left end structure 45L and said right end structure 45R, through at least one of detachable and permanent connection means.

FIG. 1A also shows a solar photovoltaic module 1, wherein the support structure 15 for supporting said solar photovoltaic module 1 on a supporting surface 16 comprises a base frame 72 including at least one of (i) tubular frame elements 73TU, (ii) beam elements 73B, (iii) a plate element 73P (not shown), (iv) a truss element 73TR, (v) a frame tilting structure 74, (vi) a variable height adjustable frame tilting structure 74V, (vii) a controllable height frame tilting structure 74C and (viii) at least one of a motorized and an actuated controllable height frame tilting structure 74MAC (not shown); wherein said supporting surface 16 comprises at least one of (a) a ground surface 16G (optional but not specifically called out in this Figure), (b) a paved surface 16P (optional but not specifically called out in this Figure), (c) a floor surface 16F (optional but not specifically called out in this Figure), (d) a roof surface 16R (optional but not specifically called out in this Figure), and (e) a water surface 16W (not shown) comprising at least one of (i) a frozen water surface and (ii) a liquid water surface on which said solar photovoltaic module 1 is supported at least in part by a buoyancy force 16B (not shown).

Note that a variable height adjustable frame tilting structure 74V, a controllable height frame tilting structure 74C, or a motorized or actuated controllable height frame tilting structure 74MAC, could be beneficially used to increase harvestable solar energy at seasons away from the vernal and autumnal equinoxes, when the Sun's apparent elevation angle can change by over 20 degrees from the nominal latitude tilt of the axis of rotation of the typical tilt frame structure with a North-South axis. The variable height adjustable frame tilting structure 74V may have fixed stops corresponding to discrete times, e.g. one position per month.

The legs of the frame tilting structure 74 may either stand on the supporting surface 16 optionally using some kind of nonskid leg cap or footing, or may be positively anchored to or in the supporting surface 16.

Figure 1B:
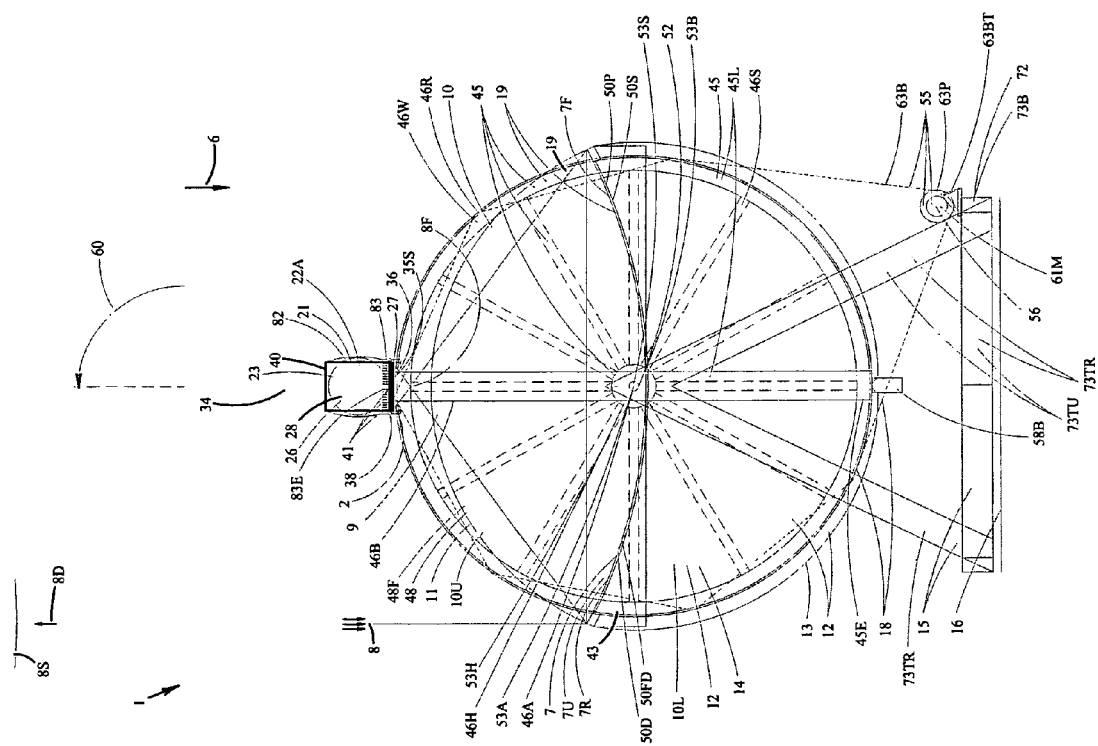
FIG. 1B shows an end view of the embodiment of FIG. 1A.

FIG. 1B shows a partial end view of the embodiment of FIG. 1A from the left end at approximately double the scale of FIG. 1A, and more clearly illustrates some of the features of the invention of FIG. 1A that can be better understood through the addition of this end view to supplement the side view of FIG. 1A. Examples of more clearly illustrated features include (i) the elevation angle 60 and (ii) the sunrays reflected by the reflecting and concentration surface 7 converging towards a focal line of reflected sunrays 8F and diverging after passing upward past this focal line of reflected sunrays 8F.

A few additional features are visible in the view of FIG. 1B, including: (i) a motor 61M driving a powered pulley 63P that in turn drives a drive belt 63B that rotates the rotatable portion 19 of the solar photovoltaic module 1 to perform heliostatic one-axis tracking; (ii) belt tensioning means 63BT for keeping the drive belt 63B for heliostatic control at an appropriate tension; (iii) the wheel member 46W with a hub member 46H engaging an axle member 46A, spoke members 46S connecting the hub member 46H with a rim member 46R that is ringed around its perimeter by a rim member 46R that is driven by the drive belt 63B; (iv) cooling means 21 using a fan 28 blowing cooling air into an air cooling pipe 22A that serves as a cooling tube 82, fitted with the illustrated cooling fins 83 here comprising cooling extrusions 83E; (v) an upper inflatable volume 10U above an upwardly concave reflection and concentrating surface 7 that is supported and shaped by perimeter structural members 50P and shaping means 50S, with a substantially transparent surface 11 above the upper inflatable volume 10U; and (vi) a lower inflatable volume 10L below the upwardly concave reflection and concentrating surface 7, with a bottom surface 13 below the lower inflated volume 10L.

Figure 1C:
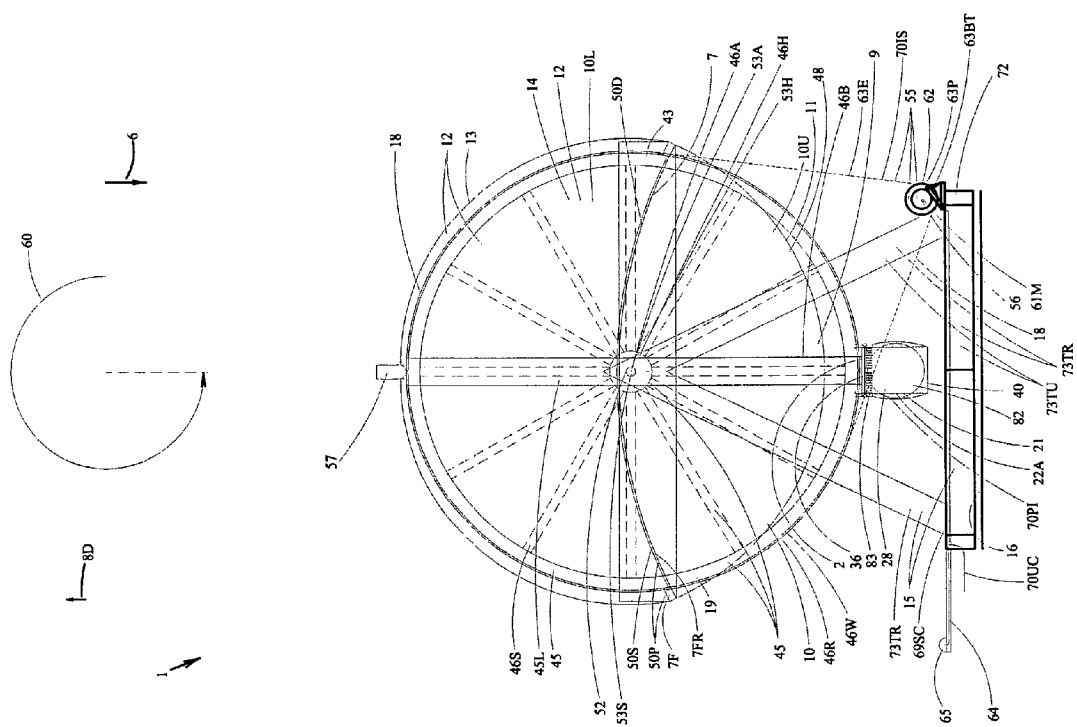
FIG. 1C shows an end view of the embodiment of FIGS. 1B and 1A, in an inverted stow configuration.

FIG. 1C shows an end view of the embodiment of FIGS. 1B and 1A, in an inverted stow configuration. FIG. 1C shows a solar photovoltaic module 1, wherein the heliostatic control means 18 for aiming a rotatable portion 19 of said solar photovoltaic module 1 as a function of at least one of time and other parameters, further includes inverted stow means 70IS for stowing said rotatable portion 19 of said solar photovoltaic module 1 in an at least partially inverted configuration 70PI, when commanded by at least one of (i) a user command 70UC, (ii) a protective stow command 69SC algorithmically computed from at least one signal 64 from a sensor 65 indicating a potentially hazardous environmental condition, and (iii) a protective stow command 69SC algorithmically computed from at least one signal 64 from a sensor 65 indicating a failure condition.

As an example, inverted stow can be beneficially used in a hailstorm where hail may fall on the solar photovoltaic module 1, or wind storm where blowing debris may fall on the solar photovoltaic module 1. Other threats for which inverted stow may be warranted include heavy rain, snow, sleet, a sandstorm, heavy bird droppings, and falling debris such as twigs and windfalls from trees. With inverted stow, the potentially damaging falling items would hit a puncture-resistant, tough/rugged and potentially multi-layer bottom surface 13 cushioned by the lower inflatable volume 10L, rather than the substantially transparent surface 11 bounding the upper inflatable volume 10U. In some conditions such as a sandstorm where an environmental threat is from the side rather than the top of the solar photovoltaic module 1, a sideward stow position could be commanded based on sensed/computed threat, with the bottom surface 13 facing the threat direction. Examples of a sensor 65 indicating a potentially hazardous environmental condition could include sensors for wind, precipitation, hail, impact, and load.

Figure 2A:
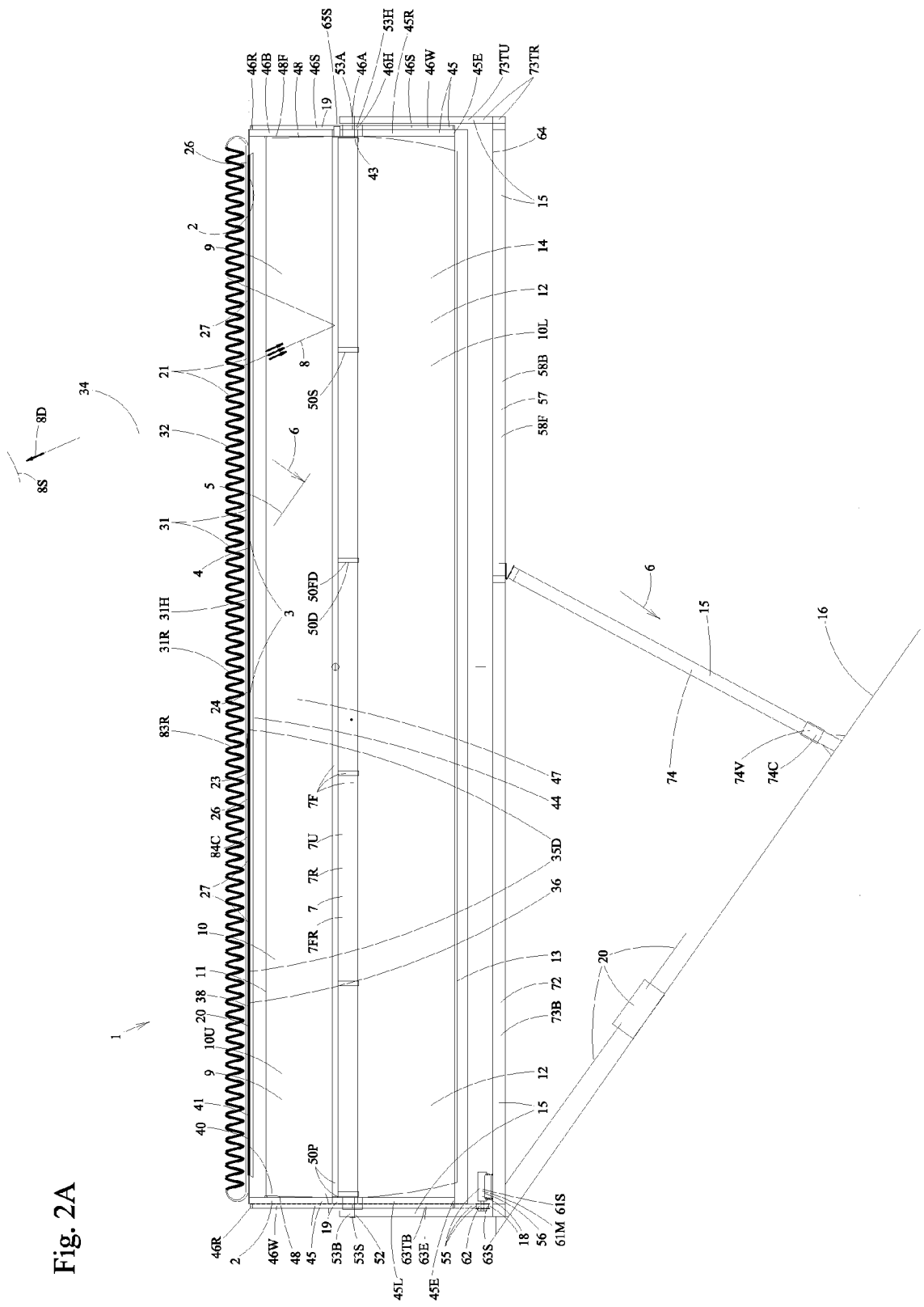
FIG. 2A shows a side view of a preferred thermosiphon (also spelled thermosyphon) cooled embodiment of the inflatable concentrating photovoltaic module invention.

FIG. 2A shows a side view of a preferred thermosiphon cooled embodiment of the inflatable concentrating photovoltaic module invention, that is similar to the embodiment of FIG. 1A but with the air cooling system replaced by a liquid cooling system.

FIG. 2A illustrates a solar photovoltaic module 1, wherein the heated cooling fluid 26 comprises at least one of heated cooling water 84W [option not shown] and heated liquid coolant 84C [shown]; wherein at least one of a pump 30 [not shown] and a thermosiphon 31 [shown] contributes to moving said heated cooling fluid 26 upward in said tilted fluid path 23; and further comprising at least one of: (a) heat transfer means 32 [shown] for transferring heat from said heated cooling fluid 26 to a cooler environment 34 outside said solar photovoltaic module 1; and
(b) beneficial heat use means 77 for beneficially using heat from said heated cooling fluid 26 [not shown].
[c19 but without beneficial heat specifications]

The illustrated thermosiphon 31 includes liquid heating tube means 31H here comprising a shallow depth enclosed near-rectangular tubular flow path immediately above and adjacent to the back sides of the solar cells in the elongated photovoltaic receiver 2, in which the heated cooling fluid 26 heated by heat 27 from said elongated photovoltaic receiver 2 rises due to buoyancy forces that naturally act on heated liquids. At the upper end (right end in this Figure) of the tubular flow path, the enclosed closed-loop flow path curves upward and back into a radiator 31R here comprising a cooling radiator 83R in the form of a spiral radiator. An upper tank for the heated cooling fluid 26 may optionally be provided but is not shown, in a manner as known from the art of thermosiphon systems. In the illustrated embodiment, the heated liquid spirals downward through the radiator 31R whilst cooling and transferring heat by heat transfer means 32 (through the walls of the spiral radiator) for transferring heat from the heated cooling fluid 26 to a cooler environment 34 (the atmosphere) outside the solar photovoltaic module 1. The cooled fluid then loops down and around to the lower end (left end in the Figure) inflow connection into the liquid heating tube means 31H. Note that the illustrated thermosiphon system requires no external power and has no pump, but that alternate embodiments may utilize a supplementary pump.

FIG. 2A shows a tilted inflatable linear cooled heliostatic concentrating solar photovoltaic module 1, comprising: an elongated solar photovoltaic receiver 2 including a portion of substantially linear geometry 3 with a linear axis 4 in its installed orientation being tilted up from a horizontal plane 5 that is perpendicular to the local gravity vector 6; a reflection and concentration surface 7 for reflecting and concentrating sunrays 8; an elongated upper inflatable volume 9 above said reflection and concentrating surface 7, with a substantially transparent surface 11 above said upper inflatable volume 9; an elongated lower inflatable volume 12 below said reflection and concentrating surface 7, with a bottom surface 13 below said lower inflated volume 12; support structure 15 for supporting said solar photovoltaic module 1 on a supporting surface 16; heliostatic control means 18 for aiming a rotatable portion 19 of said solar photovoltaic module 1 as a function of at least one of time and other parameters, such that incoming sunrays 8 from a sunward direction 8D will be reflected and concentrated by said reflection and concentration surface 7, onto said elongated solar photovoltaic receiver 2 at a concentration ratio of at least two suns; electrical power means 20 for collecting and transmitting electrical power from said elongated solar photovoltaic receiver 2; and cooling means 21 for removing excess heat 27 from said elongated solar photovoltaic receiver 2, said cooling means 21 including a tilted fluid path 23 that is tilted up in an orientation 24 including a component along said linear axis 4, wherein buoyancy force acting on heated cooling fluid 26 that is heated by heat 27 from said elongated photovoltaic receiver 2, contributes to moving said heated cooling fluid 26 upward in said tilted fluid path 23.

FIG. 2A also shows a tilted inflatable linear cooled heliostatic concentrating solar photovoltaic module 1, comprising: an elongated solar photovoltaic receiver 2 including a portion of substantially linear geometry 3 with a linear axis 4 in its installed orientation being tilted up from a horizontal plane 5 that is perpendicular to the local gravity vector 6; a reflection and concentration surface 7 for reflecting and concentrating sunrays 8; a substantially enclosed elongated inflatable volume 10 comprising (i) an upper inflatable volume 10U above said reflection and concentrating surface 7, with a substantially transparent surface 11 above said upper inflatable volume 10U, and further comprising (ii) a lower volume 14 below said reflection and concentrating surface 7, with a bottom surface 13 below said lower volume 14; support structure 15 for supporting said solar photovoltaic module 1 on a supporting surface 16 with said linear axis 4 in its installed orientation being tilted up from a horizontal plane 5 that is perpendicular to the local gravity vector 6; heliostatic control means 18 for aiming a rotatable portion 19 of said solar photovoltaic module 1 as a function of at least one of time and other parameters, such that incoming sunrays 8 from a sunward direction 8D will be reflected and concentrated by said reflection and concentration surface 7, onto said elongated solar photovoltaic receiver 2 at a concentration ratio of at least two suns; electrical power means 20 for collecting and transmitting electrical power from said elongated solar photovoltaic receiver 2; and cooling means 21 for removing excess heat 27 from said elongated solar photovoltaic receiver 2, said cooling means 21 including a tilted fluid path 23 that is tilted up in an orientation 24 including a component along said linear axis 4, wherein buoyancy force acting on heated cooling fluid 26 that is heated by heat 27 from said elongated photovoltaic receiver 2, contributes to moving said heated cooling fluid 26 upward in said tilted fluid path 23.

FIG. 2A also illustrates a solar photovoltaic module 1, wherein the elongated solar photovoltaic receiver 2 includes at least one of (i) a single row of solar cells (not shown), (ii) a double row 35D of solar cells 36 (shown), and (iii) multiple substantially linear rows of solar cells (not shown); which solar cells 36 are connected together by wires 38 at least in one of in series, in parallel, and in a combination of series and parallel; and which solar cells 36 are attached to a substantially linear upper beam structure 40 that serves as conductive heat transfer means 41 for enabling conductive heat transfer from said solar cells 36 to said heated cooling fluid 26, which heated cooling fluid 26 is heated by heat from said elongated photovoltaic receiver 2 when the Sun 8S is shining and said solar photovoltaic module 1 is operating.

The substantially linear upper beam structure 40 here also doubles as the previously described liquid heating tube means 31H here comprising a shallow depth enclosed near-rectangular tubular flow path immediately above and adjacent to the back sides of the solar cells in the elongated photovoltaic receiver 2.

The illustrated powered means 55 provides means for controllably rotating the left end structure 45 and uses a motor-driven powered sprocket 63S engaging and driving an elevation control revolving drive element 63E consisting of a toothed belt 63TB, as illustrated. Different belt types including timing belts, toothed belts or belt analogues such as chains can alternatively be used. The toothed belt 63TB engages and drives a tooth-engaging rim member 46R of a wheel member 46W in the illustrated embodiment of the invention, with a substantial gear reduction inherent in the belt drive as the wheel rim has a much larger diameter than the diameter of the pulley. This gear reduction is over and above any gear reduction built into the motor, which may for instance be a stepper motor 61S (illustrated) or a gearmotor (an alternative).

Thus a solar photovoltaic module 1 is shown in FIG. 2A, wherein the heliostatic control means 18 for aiming a rotatable portion 19 of said solar photovoltaic module 1 as a function of at least one of time and other parameters, includes powered elevation control means 56 for orienting said rotatable portion 19 of said solar photovoltaic module 1 over varying elevation angle 60 (see view in FIG. 2B) to follow the apparent daily motion of the Sun 8S from East to West, wherein said powered elevation control means 56 comprises at least one of (a) a motor 61M, (b) a gear motor 61G (not shown), (c) a stepper motor 61S (shown), and (d) an actuator 61A (not shown); and wherein said powered elevation control means 56 further comprises control linking means 62 serving as controllable means for variable-geometry linking between said support structure 15 on the first hand, and said rotatable portion 19 of said solar photovoltaic module 1 on the second hand; said control linking means 62 comprising at least one of (i) a powered pulley 63P (not shown) engaging and driving an elevation control revolving drive element 63E selected from the group consisting of a belt 63B and a chain 63H and a cable 63C, (ii) a powered sprocket 63S (shown) engaging and driving an elevation control revolving drive element 63E (shown) selected from the group consisting of a chain 63H (not shown) and a toothed belt 63TB (shown) and a belt with periodic holes 63BP (not shown) and a toothed cable 63TC (not shown), (iii) a powered gear element 63PG (not shown) engaging and driving a driven gear element 63DG, and (iv) an orientation drive linkage 63OD (not shown).

Finally, FIG. 2A also shows the solar photovoltaic module 1, wherein the heliostatic control means 18 for aiming a rotatable portion 19 of said solar photovoltaic module 1 as a function of at least one of time and other parameters, performs its aiming function as a function of at least one of (i) a signal 64 (shown) from a Sun angle sensor 65S (shown), (ii) time of day from a clock 66C, (iii) time of year from a clock 66C, (iv) year from a clock 66C, (v) latitude data 66LA of the location of installation 66LI of said solar photovoltaic module 1, (vi) longitude data 66LO of the location of installation 66LI of said solar photovoltaic module 1, (vii) true heading orientation 66TH of said support structure 15 relative to said supporting surface 16, and (viii) slope 16SL of said supporting surface 16.

The Sun angle sensor 65S sends signals to the powered elevation control means 56 to rotate the solar reflector and receiver subsystems to track the Sun's apparent motion through the skies. During periods of darkness such as night or cloud cover, the rotation will stop, and resume when the Sun is again visible. Therefore at dawn, the device will rotate back from facing West to facing East to face the rising Sun. For adverse weather conditions necessitating an downward facing emergency stow orientation, an emergency stow command will override the pointing command from the Sun angle sensor 65S.

Figure 2B:
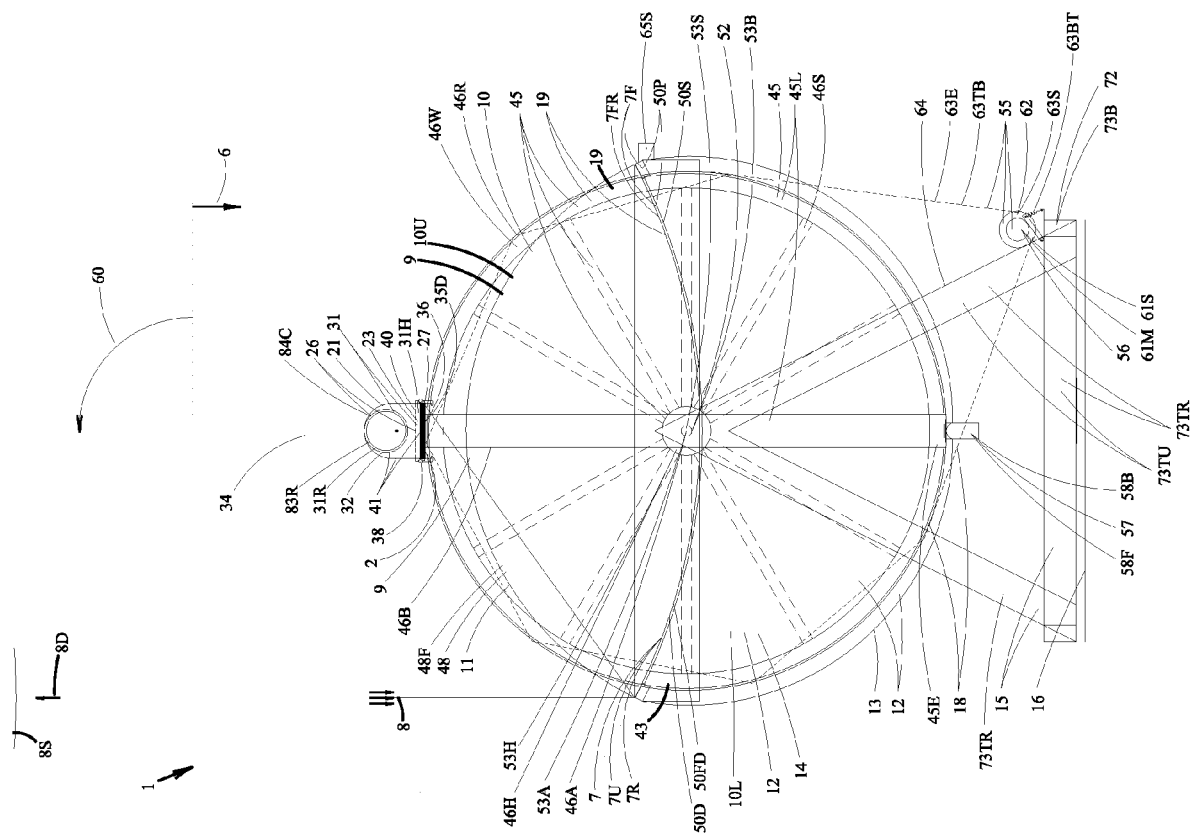
FIG. 2B shows an end view of the embodiment of FIG. 2A.

FIG. 2B shows an end view of the embodiment of FIG. 2A, that is also similar to the embodiment of FIG. 1B but with the air cooling system replaced by a liquid cooling system.

FIG. 2B shows a partial end view of the embodiment of FIG. 2A from the left end at approximately double the scale of FIG. 2A, and more clearly illustrates some of the features (e.g., elevation angle 60) of the invention of FIG. 2A that can be better understood through the addition of this end view to supplement the side view of FIG. 2A.

A few additional features are visible in the view of FIG. 2B, including: (i) a motor 61M (here a stepper motor 61S) driving a powered sprocket 63S that in turn drives a toothed belt 63TB that rotates the rotatable portion 19 of the solar photovoltaic module 1 to perform heliostatic one-axis tracking; (ii) belt tensioning means 63BT for keeping the toothed belt 63TB for heliostatic control at an appropriate tension; (iii) the wheel member 46W with a hub member 46H engaging an axle member 46A, spoke members 46S connecting the hub member 46H with a rim member 46R that is ringed around its perimeter by a rim member 46R that is driven by the toothed belt 63TB; (iv) a substantially linear upper beam structure 40 that also doubles as the previously described liquid heating tube means 31H comprising a shallow depth enclosed near-rectangular tubular flow path immediately above and adjacent to the back sides of the solar cells in the elongated photovoltaic receiver 2, and thus serves as an integral part of the cooling means 21 using heated cooling fluid 26 comprising heated liquid coolant 84C that flows in a thermosiphon 31, and further comprising heat transfer means 32 including a radiator 31R comprising a cooling radiator 83R in the form of a spiral radiator for transferring heat from said heated cooling fluid 26 to a cooler environment 34; (v) an upper inflatable volume 10U above an upwardly concave reflection and concentrating surface 7 that is supported and shaped by perimeter structural members 50P and shaping means 50S, with a substantially transparent surface 11 above the upper inflatable volume 10U; and (vi) a lower inflatable volume 10L below the upwardly concave reflection and concentrating surface 7, with a bottom surface 13 below the lower inflated volume 10L.

FIG. 3 shows a side view of a preferred embodiment of a solar photovoltaic module 1 similar to the embodiment of FIG. 2A, but also fitted with a pump 30. The pump 30 increases or augments the buoyancy induced flow in the liquid cooling system with the thermosiphon 31. Pump augmented cooling can be provided either all the time when the solar photovoltaic module 1 is operational, or at selected times when augmented cooling is needed such as times of maximum solar radiation and/or maximum ambient temperature and/or when a temperature sensor adjacent to or imbedded in a solar cell indicates a temperature above a threshold value.

FIG. 3 thus illustrates a solar photovoltaic module 1, wherein the heated cooling fluid 26 comprises at least one of heated cooling water 84W [shown] and heated liquid coolant 84C [option not shown]; wherein at least one of a pump 30 [shown] and a thermosiphon 31 [also shown] contributes to moving said heated cooling fluid 26 upward in said tilted fluid path 23; and further comprising at least one of: (a) heat transfer means 32 [shown] for transferring heat from said heated cooling fluid 26 to a cooler environment 34 outside said solar photovoltaic module 1; and
(b) beneficial heat use means 77 for beneficially using heat from said heated cooling fluid 26 [not shown].
[c19 but without beneficial heat specifications]

Figure 4A:
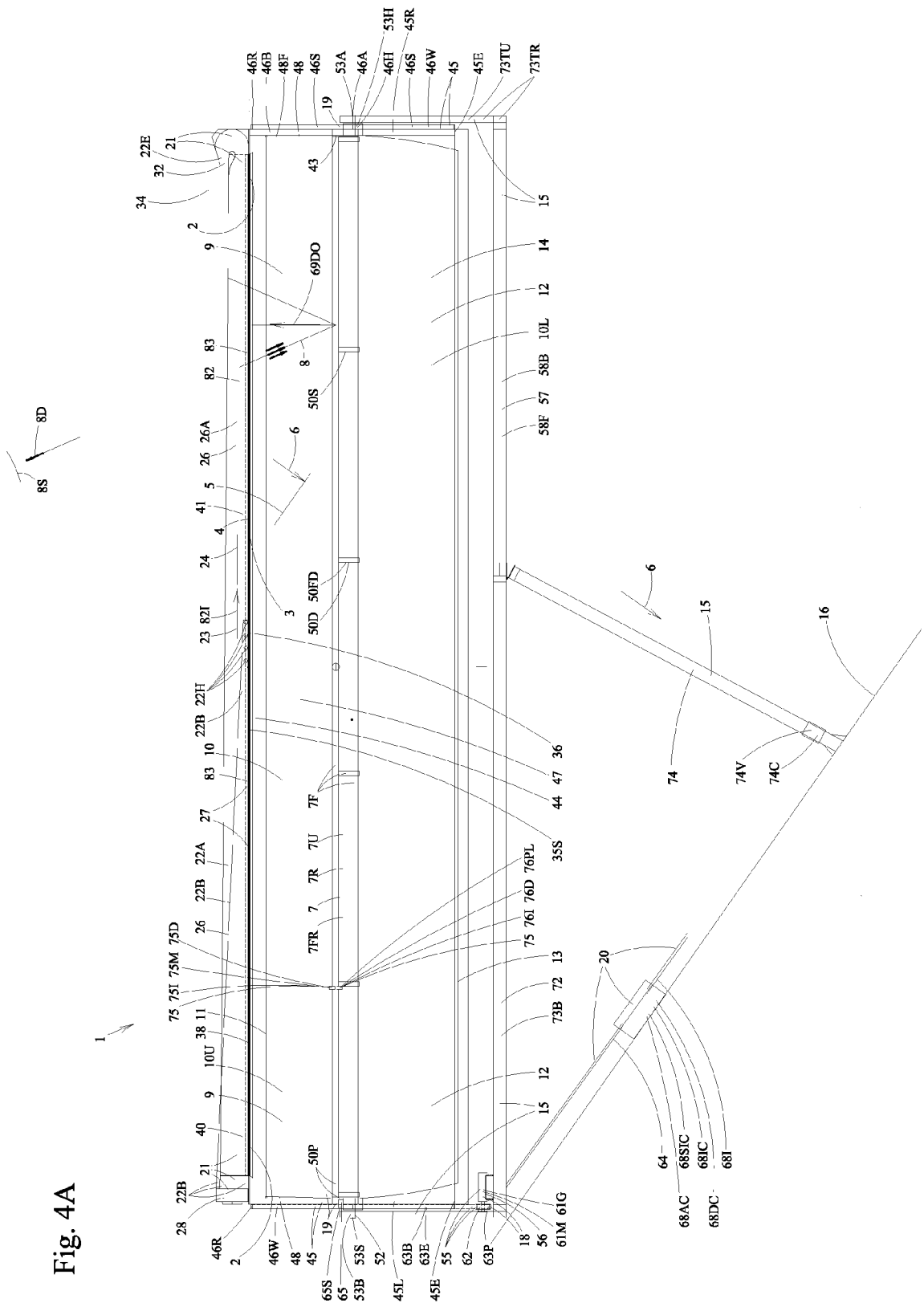
FIG. 4A shows a side view of an alternate embodiment similar to the embodiment of FIG. 1A.

FIG. 4A shows a side view of an alternate embodiment similar to the embodiment of FIG. 1A, wherein the fan 28 blows cooling air not only directly into the air cooling pipe 22A, but also into a bypass air pipe 22B which in the illustrated embodiment is bifurcated into a branch in front and branch behind the air cooling pipe 22A, as seen in from this side view perspective. The bypass air pipe 22B in each branch also has a contracting or tapering cross-sectional area going with the flow from left to right, to prevent adverse pressure gradients. The bypass cooling air feeds into the primary air cooling pipe 22A through air feed holes 22H on the near and far side walls of the air cooling pipe 22A, at representative selected locations down the length of the pipe as illustrated. The motivation of providing a bypass air flow path is as follows. The cooling air in the primary air cooling pipe 22A would normally get hotter and hotter moving from left to right along the pipe as illustrated, as more waste heat from the solar cells gets transferred progressively into the cooling air flow tube. By inserting fresh cool air from the bypass ducts into middle portions of the air cooling pipe 22A through the air feed holes 22H and preferably impinging at least in part on the cooling fins 83, cooling air temperatures and adjacent photovoltaic receiver/solar cell temperatures can be kept from getting very high towards the right or exhaust end of the air cooling pipe 22A, and in this manner the efficiency loss of the solar cells near the right end of the Figure (due to higher operating temperatures) can be reduced or mitigated.

Alternate geometries of bypass air paths are of course possible within the spirit and scope of the invention, including separate pipes and internal flow control or guide walls within the air cooling pipe 22A.

FIG. 4A also illustrates a solar photovoltaic module 1, further comprising at least one of (i) user input computer means 68IC for receiving and executing a user input instruction 68I, (ii) sensor input computer means 68SIC for receiving and processing an input signal 64 from a sensor 65 (a Sun angle sensor 65S in the illustrated embodiment), (iii) aiming computer means 68AC for algorithmically computing and commanding desired orientation 69DO (reflective mean surface facing sunward) of said rotatable portion 19 of said solar photovoltaic module 1, (iv) stow computer means 68SC (not shown) for computing and commanding a protective stow position 69S (not shown) of said rotatable portion 19 of said solar photovoltaic module 1, and (v) diagnostic computer means 68DC for identifying at least one of nonoptimal operation, faulty operation and a failure condition of said solar photovoltaic module 1.

Examples of computer means that could be employed include a digital computer, analog computer, hybrid computer, digital processor, microprocessor, computer hardware, computer firmware and computer software.

FIG. 4A also illustrates a solar photovoltaic module 1, further comprising means for performing inflation control 75 including at least one of means for increasing inflation pressure 75I, means for maintaining inflation pressure 75M, means for decreasing inflation pressure 75D, means for limiting inflation pressure 75L (not specifically shown) and means for controllably adjusting inflation pressure 75C (not specifically shown), in at least one of said upper inflatable volume 9 and said lower inflatable volume 12, wherein said means for performing inflation control 75 includes at least one of an inflation valve 76I, a deflation valve 76D, a pressure limiting valve 76PL, a pressure relief valve 76PR (not specifically shown), an adjustable gang valve 76G (not specifically shown), a differential pressure maintaining device 76DP (not specifically shown), an openable orifice 76O (not specifically shown) and an air pump 76AP (not specifically shown).

In the illustrated embodiment, separate inflation valves are shown provided for inflating the upper inflatable volume 9 and the lower inflatable volume 12, with each having features similar to an automobile tire inflation valve to enable inflation, deflation, and flow blocking as desired by a user with an air pump and a deflation prong to engage a valve tip. The inflation valves will preferably incorporate a pressure limiting function and automatically stop inflation beyond optionally different threshold values for the upper inflatable volume 9 and the lower inflatable volume 12. In normal use the target set pressure in the upper inflatable volume 9 will be set at a value higher than the target set pressure in the lower inflatable volume 12.

Figure 4B:
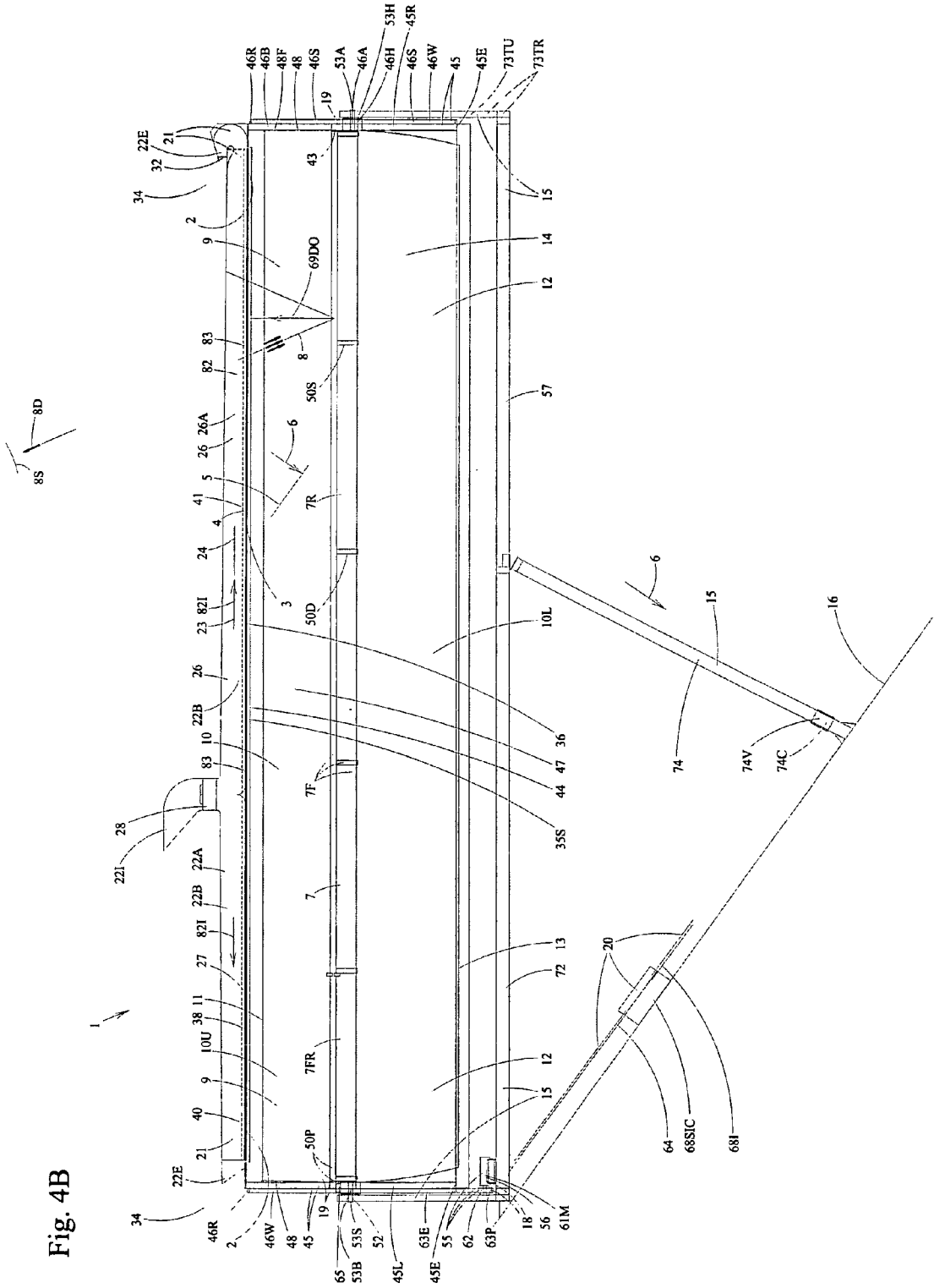
FIG. 4B shows a side view of another alternate embodiment similar to the embodiment of FIG. 1A.

FIG. 4B shows a side view of another alternate embodiment similar to the embodiments of FIG. 1A and FIG. 4A, but with a forced air cooling system comprising a downward blowing fan 28 that receives air through an inlet hood 22I, with the air from the downward blowing fan 28 forking into left and right flowing streams of internal air flow 82I, as shown, that cool the elongated solar photovoltaic receiver 2 and exhaust through left and right exhaust hoods 22E. The inlet hood 22I and fan 28 are located partway along the length of the air cooling pipe 22A, as illustrated. A nominal location below the halfway point of the air cooling pipe is shown, as the left (downward) flowing stream in the view of the Figure has to overcome the opposing buoyancy forces acting on the heated air, while the right (upward) flowing stream is aided by the buoyancy forces acting on the heated air.

FIGS. 5A through 5F show side views of liquid-cooled embodiments of the invention with liquid transport pipes exiting the solar photovoltaic module 1.

Figure 5A:
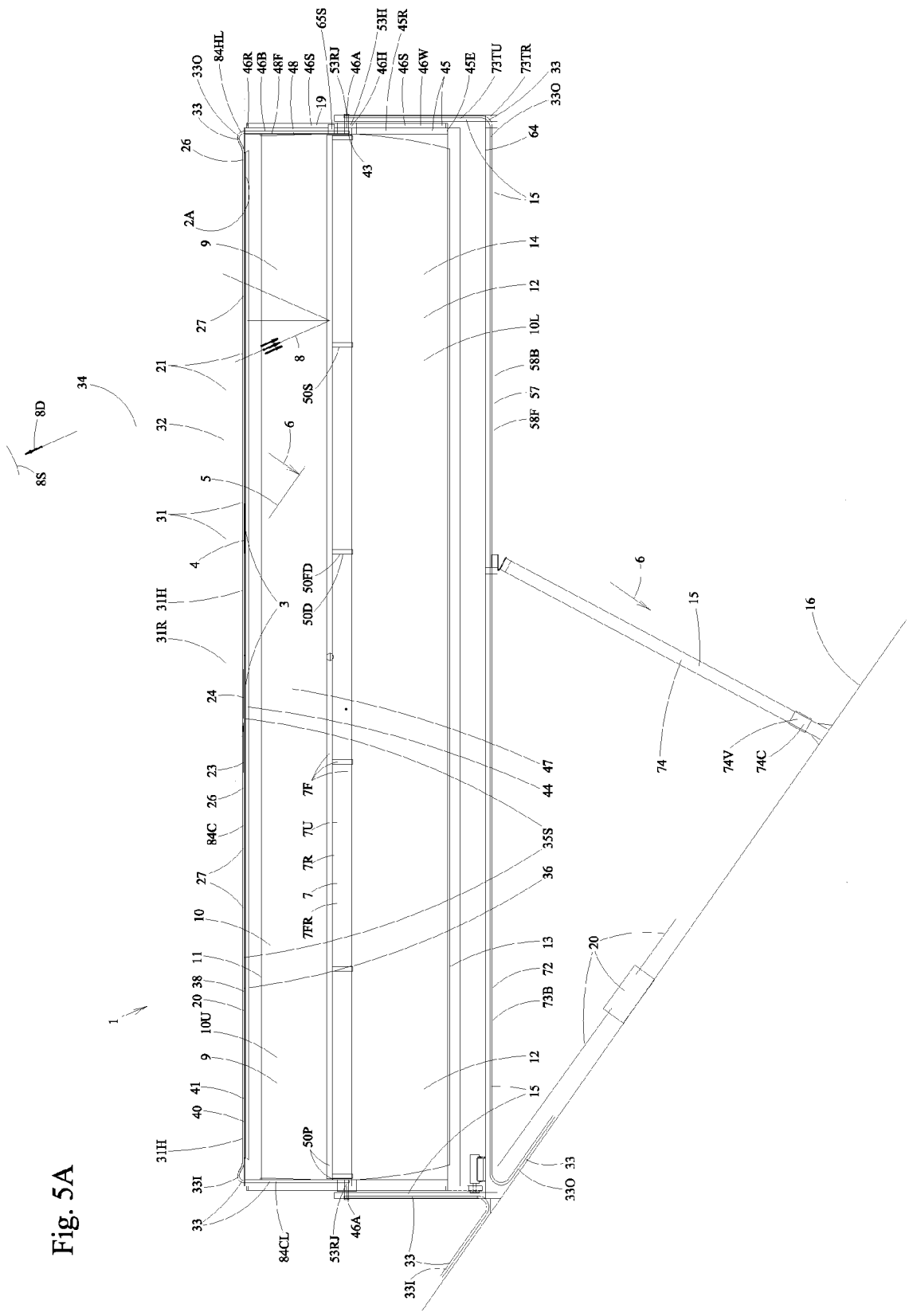
FIGS. 5A through 5F show side views of liquid-cooled embodiments of the invention with liquid transport pipes exiting the solar photovoltaic module.

FIG. 5A shows an embodiment of the invention in many respects similar to the embodiments of FIG. 1A and FIG. 2A, but with a cooling system now comprising a liquid cooling system with liquid transport pipes 33 into and out of the solar photovoltaic module 1. Cooler liquid 84CL is transported by an inflow liquid transport pipe 33I that originates at a location external to the solar photovoltaic module 1, which inflow liquid transport pipe 33I is then is routed through members of the solar photovoltaic module 1 to feed into the bottom end (left end in the view of FIG. 5A) of the liquid heating tube means 31H, where the liquid (e.g., a heated liquid coolant 84C shown) flows upwards (to the right in the view of FIG. 5A) while absorbing heat from the elongated solar receiver 2A (that may be one or both of an elongated solar photovoltaic receiver 2 and/or an elongated solar thermal receiver 2T) and increasing in temperature. The hotter liquid 84HL, which may also be mixed phase with some boiling occurring in some embodiments, exits the top end (right end in the view of FIG. 5A) of the liquid heating tube means 31H into an outflow liquid transport pipe 33O, which outflow liquid transport pipe 33O is routed through members of the solar photovoltaic module 1 and subsequently exits to a location external to the solar photovoltaic module 1. While the cooling liquid flow path is shown on the back side of the downward facing solar cells of the elongated photovoltaic receiver 2, in alternate embodiments the liquid flow path may be on the front side of the downward facing solar cells with a transparent cooling fluid such as water flowing in a transparent (e.g., glass, polycarbonate, ETFE, etc) flow channel, and/or on the lateral sides of the solar cells, and/or in a combination of geometric locations relative to the solar cells.

Note that the illustrated inflow liquid transport pipe 33I and outflow liquid transport pipe 33O both include fluid flow rotary joints 53RJ including an axle member 46A. It should be understood that in alternate embodiments rotary joints, rotary unions or flexible hose fittings can alternatively be used to transport liquid across the rotating interfaces between (a) the nonrotating support structure 15 and (b) the rotatable portion 19 of the solar photovoltaic module 1 that includes the reflection and concentration surface 7 and the elongated solar receiver 2A.

The liquid cooling system of FIG. 5A can effectively cool an elongated solar receiver 2A that is an elongated solar photovoltaic receiver 2 and keep the photovoltaic cells or solar cells on the photovoltaic receiver at a lower temperature where they are not at risk of thermally induced damage and where they operate at higher electric power harvesting efficiency. The liquid cooling system can be either closed-loop or open-loop, and use water or other coolant liquids, as known from the prior art of many variant liquid cooling systems. Furthermore, additional renewable energy can optionally be harvested by utilizing the temperature difference between the hotter liquid 84HL and the cooler liquid 83CL to run a thermodynamic cycle engine 78E (not shown) and/or a thermoelectric device 81D (not shown), to produce mechanical and/or electrical output. In the case of this option, the elongated solar receiver 2A serves as both an elongated solar photovoltaic receiver 2 and an elongated solar thermal receiver 2T concurrently. In a still further variant embodiment, a photovoltaic receiver 2 may be absent, with the elongated solar receiver 2A serving only as an elongated solar thermal receiver 2T, and all the useful renewable energy extraction being through use of a thermodynamic cycle engine 78E and/or a thermoelectric device 81D, to produce mechanical and/or electrical output.

In the case of a closed-loop liquid cooling system, means for cooling a flowing liquid 33MC may be provided between the outflow liquid transport pipe 33O carrying hotter liquid 84HL and eventually returning into the inflow liquid transport pipe 33I as cooler liquid 84CL, which means for cooling a flowing liquid 33MC may include at least one of a liquid reservoir, a heat exchanger, a radiator and a cooling tower.

Figure 5B:
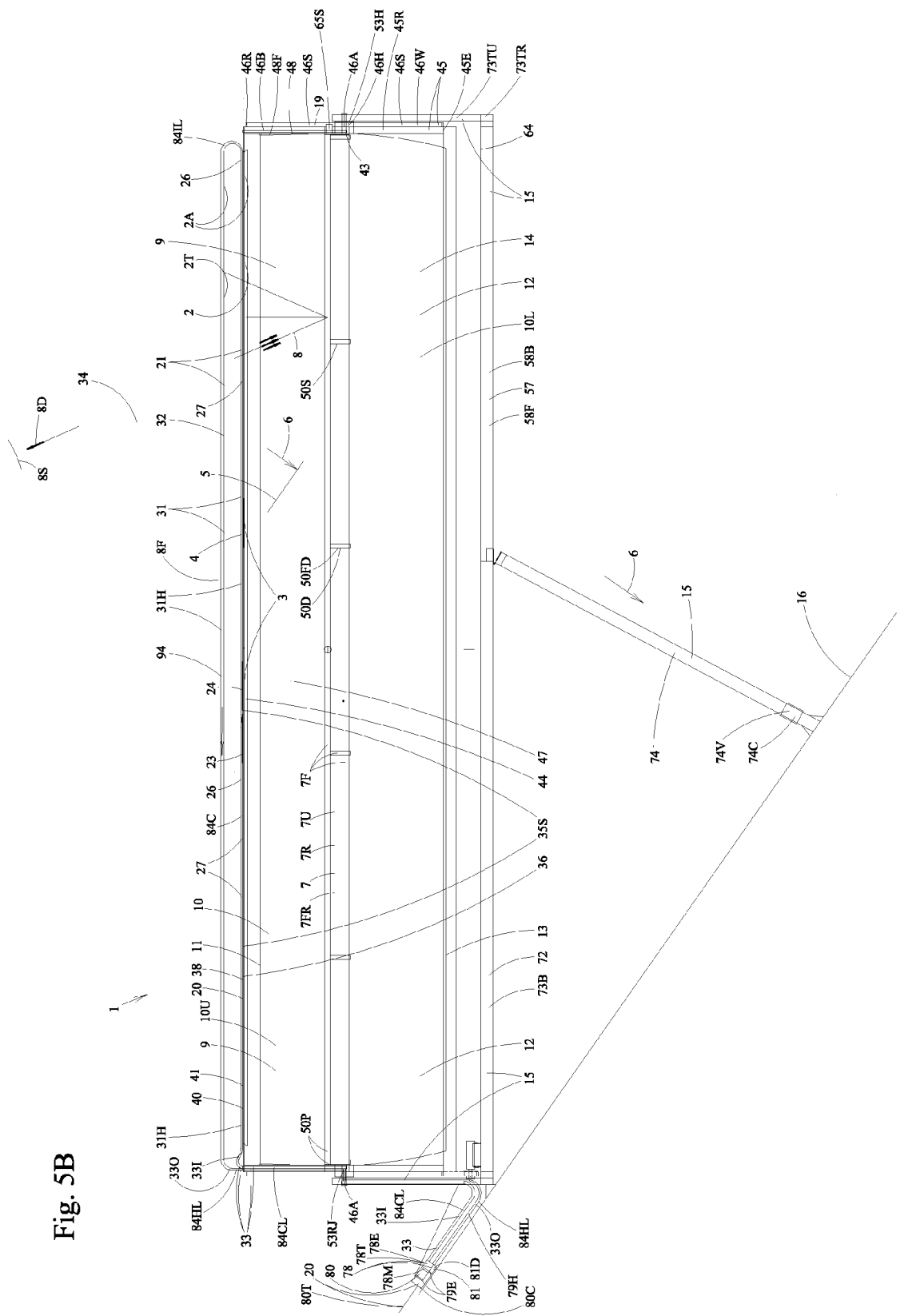

FIG. 5B shows a variant embodiment wherein an elongated solar photovoltaic receiver 2 and a separate and distinct elongated solar thermal receiver 2T are both incorporated, in a stacked geometry and sequential liquid flow configuration. Thus in this embodiment two elongated solar receivers 2A are provided, one being an elongated solar photovoltaic receiver 2 and the other a separate and distinct elongated solar thermal receiver 2T.

In the illustrated embodiment the focal line 8F of reflected sunrays 8 that are reflected and concentrated by the reflection and concentration surface 7, is shown to be above both the stacked elongated solar receivers 2A, at a location such that some of the reflected and concentrated sunrays fall on the downward facing solar cells of the elongated solar photovoltaic receiver 2, while the balance of reflected and concentrated sunrays pass by the front and/or back sides (in this view) of the elongated photovoltaic receiver 2 and fall on the underside of the elongated solar thermal receiver 2T with at higher concentration in suns than on the elongated photovoltaic receiver 2 (as the elongated solar thermal receiver 2T has a linear axis location closer to the focal line 8F than does the linear axis location of the elongated solar photovoltaic receiver 2).

FIG. 5B shows an embodiment of the invention in many respects similar to the embodiment of FIG. 5A, with a cooling system now comprising a liquid cooling system with liquid transport pipes 33 into and out of the solar photovoltaic module 1. Cooler liquid 84CL is transported by an inflow liquid transport pipe 33I that originates at a location external to the solar photovoltaic module 1, which inflow liquid transport pipe 33I is then is routed through members of the solar photovoltaic module 1 to feed into the bottom end (left end in the view of FIG. 5A) of the liquid heating tube means 31H, where the liquid (e.g., a heated liquid coolant 84C shown) flows upwards (to the right in the view of FIG. 5A) while absorbing heat from the elongated solar receiver 2A that is an elongated solar photovoltaic receiver 2. This heat can be considered "waste heat" from the solar cells, but the "waste heat" nomenclature is not entirely appropriate as the heat can be put to use as will be explained in the following. At the (right) end of the elongated solar photovoltaic receiver 2 the liquid is an intermediate temperature liquid 84IL, which serves as a preheated input liquid for the upper, left flowing portion of the liquid heating tube means 31H that corresponds with the elongated solar thermal receiver 2T. The liquid is heated to higher temperatures as it flows through the elongated solar thermal receiver 2T, until it exits as a hotter liquid 84HL at the left end of the elongated solar thermal receiver 2T in this illustration. The hotter liquid 84HL, which may also be mixed phase with some boiling occurring in some embodiments, exits the left end of the upper portion of the liquid heating tube means 31H into an outflow liquid transport pipe 33O, which outflow liquid transport pipe 33O is routed through members of the solar photovoltaic module 1 and subsequently exits to a location external to the solar photovoltaic module 1.

Note that the illustrated inflow liquid transport pipe 33I and outflow liquid transport pipe 33O traverse a dual-flow fluid rotary joint 53RJ in this illustrated embodiment. It should be understood that in alternate embodiments a dual-flow rotary union or flexible concentric insulated hose fittings can alternatively be used to transport liquid across the rotating interfaces between (a) the nonrotating support structure 15 and (b) the rotatable portion 19 of the solar photovoltaic module 1 that includes the reflection and concentration surface 7 and the elongated solar receiver 2A.

Note also that the inflow liquid transport pipe 33I and the outflow liquid transport pipe 33O would come down different A-frame leg members of the support structure 15, fore and aft behind one another in this view, in a preferred embodiment. In an alternate embodiment both the inflow liquid transport pipe 33I and the outflow liquid transport pipe 33O could be routed down from the dual-flow fluid rotary joints 53RJ along or inside a single leg member of the support structure 15, within the spirit and scope of the invention.

The liquid cooling system of FIG. 5B, as in the embodiment of FIG. 5A, can effectively cool an elongated solar receiver 2A that is an elongated solar photovoltaic receiver 2 and keep the photovoltaic cells or solar cells on the photovoltaic receiver at a lower temperature where they are not at risk of thermally induced damage and where they operate at higher electric power harvesting efficiency. The liquid cooling system can be either closed-loop or open-loop, and additional renewable energy will preferably be harvested by utilizing the temperature difference between the hotter liquid 84HL and the cooler liquid 83CL to run a thermodynamic cycle engine 78E and a thermoelectric device 81D, to produce mechanical and electrical output.

Preferably means for cooling a flowing liquid 33MC (not shown) will be provided between the outflow liquid transport pipe 33O carrying hotter liquid 84HL and downstream of the thermodynamic cycle engine 78E, before returning into the inflow liquid transport pipe 33I as cooler liquid 84CL, which means for cooling a flowing liquid 33MC may include for example a liquid reservoir, a heat exchanger, or a radiator. In variant embodiments some or all of the heat from the hotter liquid 84HL can be beneficially used for heating purposes, such as providing hot water for a home, building or swimming pool or hot tub, and/or for home or building heating, and/or for cooking and/or for industrial or commercial process heat. The thermodynamic cycle engine 78E and thermoelectric device 81D may be absent in some of these variant embodiments.

In the illustrated embodiment since both thermodynamic and thermoelectric energy harvesting means are included, the thermoelectric device 81D serves as supplemental thermoelectric means 81 for harvesting additional power from the Sun, which supplemental thermoelectric means acts as means for directly harvesting electrical energy from the heat carried in the hotter liquid 84HL.

FIG. 5B also illustrates generator means 80 connected to the mechanical energy output from the thermodynamic cycle engine 78E, serving as generator means 80 for converting at least some of the mechanical energy into electrical energy. Electric power conditioning means 80C are shown for conditioning electrical output from the various sources such as the downward facing solar cells of the elongated solar photovoltaic receiver 2, the generator means 80 and the thermoelectric device 81D. The electrical power conditioning means 80C may perform one or more of electrical power conditioning functions known from the prior art, such as DC to or from AC conversion (e.g., inverter function), voltage changing, voltage and/or current stabilizing, phase control or changing, and/or other electrical power conditioning functions as are known from the prior art. The electrical power conditioning means 80C may also serve as grid-engagement means for permitting said power output to feed back into an electrical power grid and at least one of slow, stop and reverse an electrical meter measuring net power flow from or to said electrical power grid.

The output from the electrical power conditioning means 80C is transmitted by electric power transmission means 80T such as electrical wire or cable, to users of electric power such as a home or building that may be off-grid or grid-connected, and may optionally feed back into an electric grid through a net-metering or other mechanism as known in the art.

FIG. 5B therefore illustrates a solar photovoltaic module 1, wherein the electrical power means 20 further includes supplemental electrical power means 78 for harvesting additional power from the Sun 8S, which supplemental electrical power means 78 comprises at least one of (i) supplemental thermodynamic power means 78T for harvesting additional power from the Sun 8S, wherein said heated cooling fluid 26 that is heated by heat 27 from said elongated photovoltaic receiver 2 serves at least in contributory part as a working fluid 94 for a thermodynamic cycle engine 78E, which thermodynamic cycle engine 78E serves as means for harvesting mechanical energy 79M from heat energy 79H including said heat 27, with generator means 80 for converting at least some of said mechanical energy 79M into electrical energy 79E; and (ii) supplemental thermoelectric means 81 for harvesting additional power from the Sun 8S, which supplemental thermoelectric means 81 acts as means for directly harvesting electrical energy 79E from said heat 27.

FIG. 5B also illustrates a solar photovoltaic module 1, wherein the heated cooling fluid 26 comprises at least one of heated cooling water 84W and heated liquid coolant 84C; wherein at least one of a pump 30 and a thermosiphon 31 contributes to moving said heated cooling fluid 26 upward in said tilted fluid path 23; and further comprising at least one of:
(a) heat transfer means 32 for transferring heat from said heated cooling fluid 26 to a cooler environment 34 outside said solar photovoltaic module 1; and
(b) beneficial heat use means 77 for beneficially using heat from said heated cooling fluid 26, which beneficial heat use means 77 comprises at least one of:
(i) supplemental electrical power means 78 for harvesting additional power from the Sun 8S, which supplemental electrical power means 78 comprises supplemental thermodynamic power means 78T for harvesting additional power from the Sun 8S, wherein said heated cooling fluid 26 serves at least in contributory part as a working fluid 94 for a thermodynamic cycle engine 78E, which thermodynamic cycle engine 78E serves as means for harvesting mechanical energy 79M from heat energy 79H in said heated cooling fluid 26, with generator means 80 for converting at least some of said mechanical energy 79M into electrical energy 79E;
(ii) supplemental electrical power means 78 for harvesting additional power from the Sun 8S, which supplemental electrical power means 78 comprises supplemental thermoelectric means 81 for harvesting additional power from the Sun 8S, which supplemental thermoelectric means 81 acts as means for directly harvesting electrical energy 79E from heat energy 79H in said heated cooling fluid 26; and
(iii) means for using heat energy 79H in said heated cooling fluid 26 for providing beneficial heat (optional and not shown) to at least one of a building, a home, a swimming pool, a hot water tank, a heating appliance, a heating device, a dryer, a cooking appliance, a cooking device, an industrial process, and a chemical process.

Figure 5C:
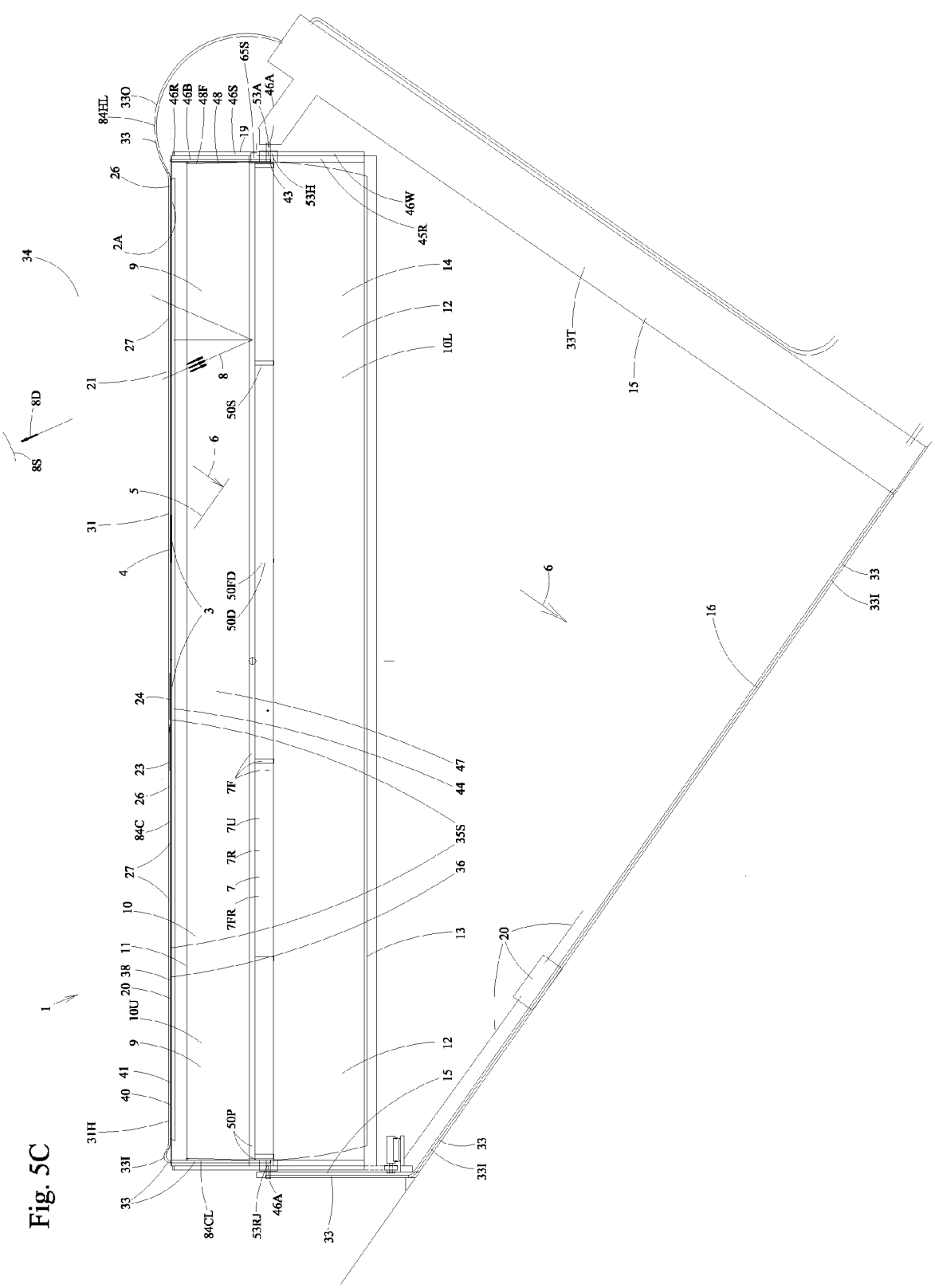

FIG. 5C illustrates an embodiment similar to that of FIG. 5A, but with a thermosiphon cooling system for an elongated photovoltaic receiver 2 with the addition of a temperature stratified liquid holding tank 33T between the outflow liquid transport pipe 33O carrying hotter liquid 84HL before returning into the inflow liquid transport pipe 33I as cooler liquid 84CL. Note that in this embodiment the structure of the liquid holding tank 33T doubles as the portion of the support structure 15 that supports the upper (right in this view) part of the solar photovoltaic module 1. A hot water outlet pipe 33HO and a cold water inlet pipe 33CI are also shown connected to the upper hot strata level and lower cool strata level respectively of the liquid holding tank 33T. Hot water from the hot water outlet pipe 33HO can be beneficially used as hot water per se and/or for heating purposes, such as providing hot water for a home, building or swimming pool or hot tub, and/or for home or building heating, and/or for cooking and/ or for industrial or commercial process heat. The cold water inlet pipe 33CI can supply cold water to replenish the water quantity in the liquid holding tank 33T when hot water is taken out, or in the event of any leaks in the cooling system. It will be understood that other coolants or liquids could be used in lieu of water, in variant embodiments of the invention. It will also be understood that a simple thermosiphon system could be replaced by a pump-augmented thermosiphon system in variant embodiments, within the spirit and scope of the invention.

Figure 5D:
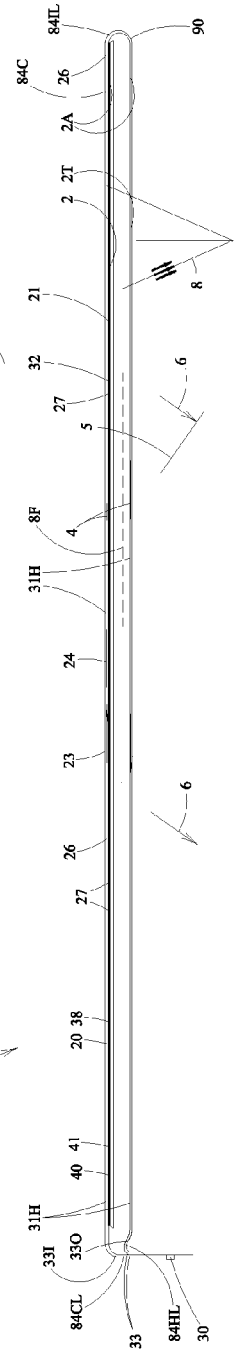

FIG. 5D shows a partial side view of an embodiment similar to that of FIG. 5B, with two elongated solar receivers 2A being provided, one being an elongated solar photovoltaic receiver 2 and the other a separate and distinct elongated solar thermal receiver 2T. However, in FIG. 5D the elongated solar thermal receiver 2T is located below the elongated solar photovoltaic receiver 2. In FIG. 5D the focal line 8F of reflected sunrays 8 that are reflected and concentrated by the reflection and concentration surface 7, is shown to be between the two stacked elongated solar receivers 2A, at a location such that some of the reflected and concentrated sunrays fall on the elongated solar thermal receiver 2T, while the balance of reflected and concentrated sunrays pass by the front or/and back sides (in this view) of the elongated solar thermal receiver 2T, pass substantially through the focal line 8F and then before expanding too much, fall on the downward facing solar cells of the elongated solar photovoltaic receiver 2. A working fluid 94 94 that also serves as liquid coolant for the elongated solar photovoltaic receiver 2, enters the solar photovoltaic module 1 pumped by a pump 30 into an inflow liquid transport pipe 33I as cooler liquid 84CL. The working fluid 94 then moves up (to the right in the figure) in liquid heating tube means 31H that is typically a rectangular cross-section tube immediately adjacent to and heat-conductively connected to the back side of the elongated solar photovoltaic receiver 2, where the working fluid 94 cools the solar cells and concurrently becomes a heated liquid coolant 84C. Buoyancy forces acting on the heated liquid coolant 84C assist the pump 30 in motivating and driving the flow to the right in the upper liquid heating tube means 31H, as illustrated. The heated liquid coolant 84C that is an intermediate temperature liquid 84IL, serves as preheated working fluid 90 for the lower, left flowing portion of the liquid heating tube means 31H that corresponds with the elongated solar thermal receiver 2T. The liquid is heated to higher temperatures as it flows through the elongated solar thermal receiver 2T, until it exits as a hotter liquid 84HL at the left end of the elongated solar thermal receiver 2T in this illustration. The hotter liquid 84HL, exits the left end of the lower portion of the liquid heating tube means 31H into an outflow liquid transport pipe 33O. As in the embodiment of FIG. 5B, for the embodiment of FIG. 5D also, the liquid cooling system can be either closed-loop or open-loop, and additional renewable energy will preferably be harvested by utilizing the temperature difference between the hotter liquid 84HL and the cooler liquid 83CL to run a thermodynamic cycle engine 78E, to produce mechanical and electrical output over and above the electrical output from the solar cells in the elongated solar photovoltaic receiver 2.

Figure 5E:
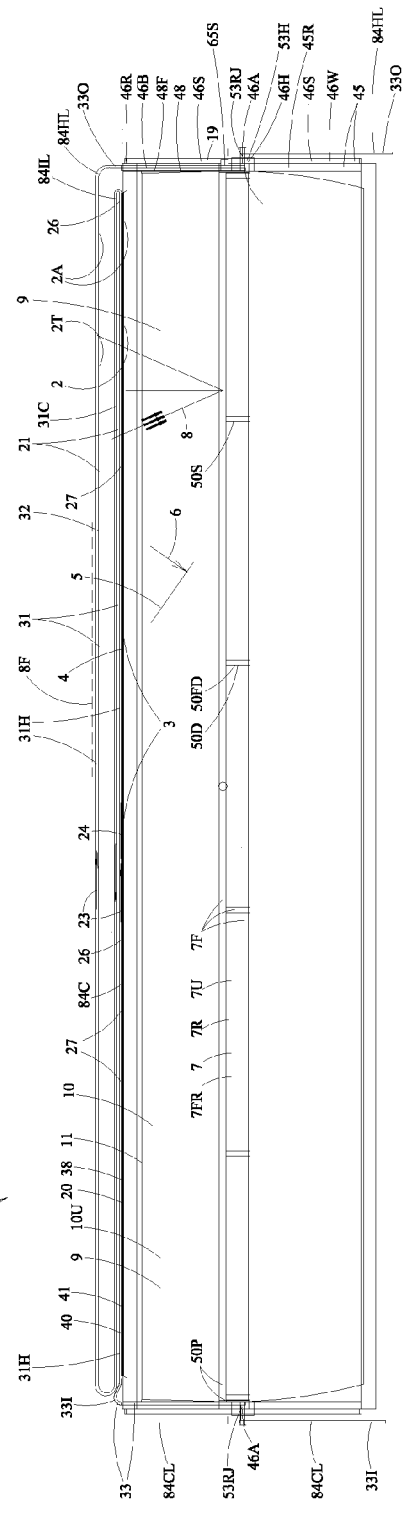

FIG. 5E shows a partial side view of another embodiment similar to that of FIG. 5B, with two elongated solar receivers 2A being provided, one being an elongated solar photovoltaic receiver 2 and the other a separate and distinct elongated solar thermal receiver 2T stacked above it. However, in this variant the fluid flow is upward (to the right in the view of the Figure) in both the two liquid heating tube means 31H, one associated each with the elongated solar photovoltaic receiver 2 and the elongated solar thermal receiver 2T. This is accomplished through the use of a double-back or connecting tube 31C, and offers the benefit of hot fluid buoyancy forces assisting in driving the thermosiphon effect in both of the two liquid heating tube means 31H. A pump 30 is optional and not necessarily required for this variant embodiment.

Figure 5F:
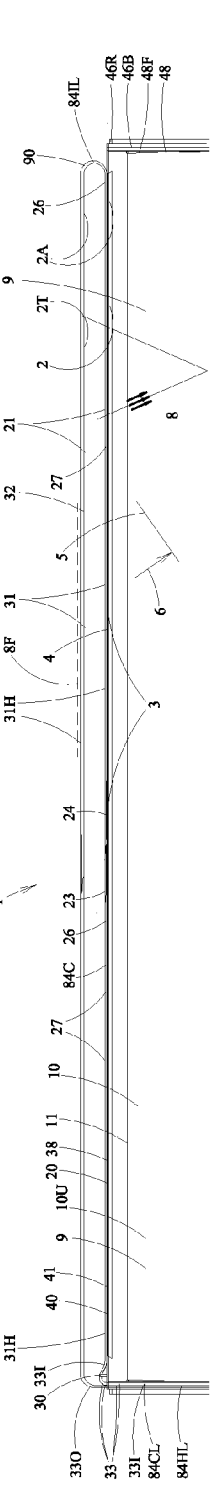

FIG. 5F shows a partial side view of another embodiment similar to that of FIG. 5B, but with the liquid transport pipes 33 comprising the inflow liquid transport pipe 33I and the outflow liquid transport pipe 33O connect to the upper ends (left on this Figure as the local gravity vector 6 tilts the opposite way as in FIG. 5B) rather than the lower ends of the two elongated solar receivers 2A, one being an elongated solar photovoltaic receiver 2 and the other a separate and distinct elongated solar thermal receiver 2T stacked above it. A pump 30 pushes the fluid down the lower liquid heating tube means 31H (associated with the elongated solar photovoltaic receiver 2), and the heated liquid coolant 84C that is an intermediate temperature liquid 84IL, serves as preheated working fluid 90 for the upper, left flowing portion of the liquid heating tube means 31H that corresponds with the elongated solar thermal receiver 2T. The liquid is heated to higher temperatures as it flows (assisted by buoyancy force acting on the increasingly hot fluid) through the elongated solar thermal receiver 2T, until it exits as a hotter liquid 84HL at the left (upper) end of the elongated solar thermal receiver 2T through the outflow liquid transport pipe 33O in this illustration. The flows from the inflow liquid transport pipe 33I and outflow liquid transport pipe 33O can both go through a dual-flow fluid rotary joints 53RJ (not shown), as in the embodiment of FIG. 5B.

Figure 6A:
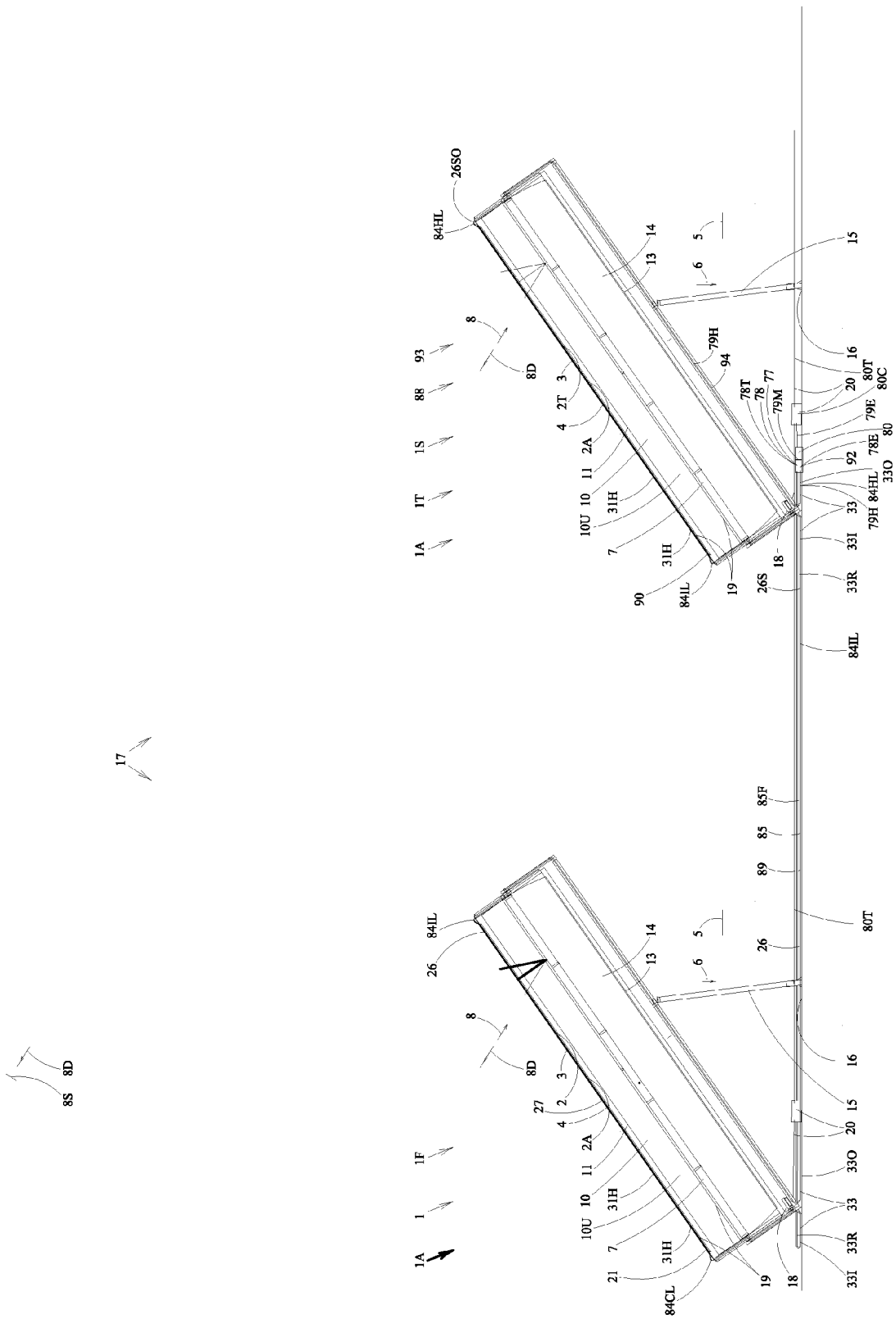

FIGS. 6A and 6B show side views of combinations of plural solar modules 1A of different types in sequence.

FIG. 6A shows two solar modules 1A in sequence, where the module on the left of the Figure is a solar photovoltaic module 1 that is a first solar photovoltaic module 1F; while the module on the right of the Figure is a solar thermal module 1T that is a second solar module 1S.

Cooler liquid 84CL is transported by an inflow liquid transport pipe 33I that is routed through members of the solar photovoltaic module 1 that is a first solar photovoltaic module 1F, to feed into the bottom end (left end in the view of FIG. 6A) of the liquid heating tube means 31H, where the liquid flows upwards (to the right in the view of FIG. 6A) while absorbing heat from the elongated solar receiver 2A that is an elongated solar photovoltaic receiver 2. This heat can be considered "waste heat" from the solar cells, but the "waste heat" nomenclature is not entirely appropriate as the heat can be put to use as will be explained in the following. At the (right) end of the elongated solar photovoltaic receiver 2 the liquid is an intermediate temperature liquid 84IL, which serves as a preheated input liquid for the solar thermal module 1T that is the second solar module 1S, with the elongated solar thermal receiver 2T.

The intermediate temperature liquid 84IL is then heated to higher temperatures as it flows through the elongated solar thermal receiver 2T in the second solar module 1S, until it exits as a hotter liquid 84HL at the right end of the elongated solar thermal receiver 2T in this illustration. The second solar module 1S is therefore a higher temperature second solar module, as compared with the solar photovoltaic module 1 that is a first solar photovoltaic module 1F, as described. The hotter liquid 84HL, which may also be mixed phase with some boiling occurring in some embodiments, exits the right end of the upper portion of the liquid heating tube means 31H into an outflow liquid transport pipe 33O, which outflow liquid transport pipe 33O is routed through members of the second solar module 1S and subsequently exits to a thermodynamic cycle engine 78E. The thermodynamic cycle engine 78E harvests additional renewable energy over and above electric energy harvested by the solar cells in the elongated solar photovoltaic receiver 2 in the first solar photovoltaic module 1F. The thermodynamic cycle engine 78E converts thermal energy from the hotter liquid 84HL to mechanical energy, which in turn is converted to electrical energy by generator means 80 for converting at least some of the mechanical energy into electrical energy. Electric power conditioning means 80C are shown for conditioning electrical output from the various sources such as the downward facing solar cells of the elongated solar photovoltaic receiver 2, the generator means 80 and an optional thermoelectric device (not shown). The electrical power conditioning means 80C may perform one or more of electrical power conditioning functions known from the prior art, such as DC to or from AC conversion (e.g., inverter function), voltage changing, voltage and/or current stabilizing, phase control or changing, and/or other electrical power conditioning functions as are known from the prior art. The output from the electrical power conditioning means 80C is transmitted by electric power transmission means 80T such as electrical wire or cable, to users of electric power such as a home or building that may be off-grid or grid-connected, and may optionally feed back into an electric grid through a net-metering or other mechanism as known in the art.

Preferably means for cooling a flowing liquid 33MC, such as the illustrated liquid return pipe 33R, will be provided downstream of the outflow liquid transport pipe 33O carrying hotter liquid 84HL in the second solar module 1S, and downstream of the thermodynamic cycle engine 78E, to transport liquid back into the inflow liquid transport pipe 33I for the first solar photovoltaic module 1F, as cooler liquid 84CL. The means for cooling a flowing liquid 33MC may include not just the liquid return pipe 33R, but also may incorporate liquid reservoir, heat exchanger, or radiator elements.

In variant embodiments some of the heat from the hotter liquid 84HL from the solar thermal module 1T and/or downstream of the thermodynamic cycle engine 78E, can be beneficially used for heating purposes such as providing hot water for a home, building, swimming pool or hot tub, and/or for home or building heating, and/or for cooking and/or for industrial or commercial process heat.

Note that the thermodynamic cycle engine 78E may comprise at least one of a Brayton cycle engine, a Rankine cycle engine, a Stirling cycle engine, an Otto cycle engine, a hybrid cycle engine and an alternative thermodynamic cycle engine.

The embodiment of the invention shown in FIG. 6A illustrates a solar photovoltaic module 1, further comprising a higher temperature second solar module 88 that is connected to said solar photovoltaic module 1;

wherein said heated cooling fluid 26 that is heated by heat 27 from said elongated photovoltaic receiver 2 in said solar photovoltaic module 1, is piped by connecting pipe 89 to said second solar module 88 and used as preheated working fluid 90 for a thermodynamic cycle engine 78E in said second solar module 88; and wherein said second solar module 88 serves as second electrical power means 93 for harvesting additional power from the Sun 8S, which second electrical power means 93 comprises at least one of (i) second module thermodynamic power means 92 for harvesting additional power from the Sun 8S, wherein said preheated working fluid 90 serves at least in contributory part as a working fluid 94 for said thermodynamic cycle engine 78E, which thermodynamic cycle engine 78E serves as means for harvesting mechanical energy 79M from heat energy 79H including said heat 27, with generator means 80 for converting at least some of said mechanical energy 79M into electrical energy 79E; and (ii) a combination of a higher temperature solar photovoltaic receiver 99 (optional but not shown) and second module thermodynamic power means 92 for harvesting additional power from the Sun 8S, wherein said preheated working fluid 90 serves at least in contributory part as a working fluid 94 for said thermodynamic cycle engine 78E, which thermodynamic cycle engine 78E serves as means for harvesting mechanical energy 79M from heat energy 79H including said heat 27, with generator means 80 for converting at least some of said mechanical energy 79M into electrical energy 79E.

FIG. 6B shows plural (three illustrated) solar modules 1A in sequence, where the module on the top left of the Figure is a solar photovoltaic module 1 that is a first solar photovoltaic module 1F; while the module on the top right of the Figure is a second solar module 1S that is a solar thermal module 1T combined with a higher temperature solar photovoltaic module 1H with a higher temperature elongated solar photovoltaic receiver 2H; and the rightmost module in the string of connected modules is shown on the bottom left of the Figure, connected through the Figure break line A-A, and comprises a downstream solar module 1D that in this case is also a solar thermal module 1T that is intended to operate at a still higher solar receiver temperature than the second solar module 1S. Note that the higher temperature solar photovoltaic module 1H in FIG. 6B includes a higher temperature solar photovoltaic receiver 99 (that was optional but not shown in FIG. 6A). Note also that variant embodiments may have varying numbers of solar photovoltaic modules 1, higher temperature solar photovoltaic modules 1H, and downstream solar modules 1D that are solar thermal modules 1T, with combinations of series and optionally also parallel connectivity, within the spirit and scope of the invention.

In FIG. 6B, cooler liquid 84CL is transported by an inflow liquid transport pipe 33I that is routed through members of the solar photovoltaic module 1 that is a first solar photovoltaic module 1F, to feed into the bottom end (left end in the view of FIG. 6B) of the liquid heating tube means 31H, where the liquid flows upwards (to the right in the view of FIG. 6B) while absorbing heat from the elongated solar receiver 2A that is an elongated solar photovoltaic receiver 2. This heat can be considered "waste heat" from the solar cells, but the "waste heat" nomenclature is not entirely appropriate as the heat can be put to use as will be explained in the following. At the (right) end of the elongated solar photovoltaic receiver 2 the liquid is an intermediate temperature liquid 84IL, which serves as a preheated input liquid for the second solar module 1S that comprises a solar thermal module 1T with an elongated solar thermal receiver 2T, and also comprises a higher temperature solar photovoltaic module 1H with a higher temperature elongated solar photovoltaic receiver 2H. The higher temperature solar photovoltaic module 1H will preferably utilize solar cells or photovoltaic receptors that are tolerant of higher temperatures without damage or excess loss of efficiency or performance. Examples of types of higher temperature solar cells include higher temperature silicon solar cells, gallium arsenide solar cells, and multijunction solar cells, without being limiting.

The intermediate temperature liquid 84IL is then heated to higher temperatures as it flows through the elongated solar thermal receiver 2T in the second solar module 1S, until it exits as a hotter liquid 84HL at the right end of the elongated solar thermal receiver 2T in this illustration. The hotter liquid 84HL, which may also be mixed phase with some boiling occurring in some embodiments, exits the right end of the upper portion of the liquid heating tube means 31H into an outflow liquid transport pipe 33O, which outflow liquid transport pipe 33O is routed through members of the second solar module 1S and subsequently exits to a downstream solar module 1D and thereafter to a thermodynamic cycle engine 78E.

In the embodiment of FIG. 6B, the downstream solar module 1D is a solar thermal module 1T that is intended to operate at a still higher solar receiver temperature than the second solar module 1S, and increases the temperature of the working fluid as it transitions from being a hotter liquid 84HL before the downstream solar module 1D, to being a very hot liquid 84VHL downstream of the downstream solar module 1D. Plural downstream solar modules 1D in series (not shown) can optionally be used to further increase the temperature of the working fluid, in conjunction with optimized design features for solar concentration in suns in each module, fluid flow rate control optimization, and optimized thermal insulation for piping that carries the very hot liquid 84VHL. Different types of high temperature fluid can also be used in variant embodiments, including unpressurized or pressurized water based fluids, glycol type fluids, eutectic mixtures of biphenyl (C12H10) and diphenyl oxide (C12H10O) (such as "Dowtherm"), mixtures of tri- and diaryl compounds (such as "Dowtherm G"), mixtures of alkylated aromatics or isomers of alkylated aromatics (such as "Dowtherm MX" or "Dowtherm J"), mixtures of diphenylethane and alkylated aromatics (such as "Dowtherm Q"), diaryl alkyls (such as "Dowtherm RP"), mixtures of C14-C30 alkyl benzenes (such as "Dowtherm T"), hot oils, molten salt fluids, alkali metals and combinations of fluids either together or connected in separate circuits connected by heat exchanger means.

In the embodiment of FIG. 6B, the very hot liquid 84VHL downstream of the downstream solar module 1D connects to an optional thermal energy storage system 79T, which can store thermal energy for subsequent use to generate electric power when the solar modules are not working, e.g. during periods of cloud cover and night time periods. A variety of thermal energy storage systems 79T, such as the use of molten salt thermal storage to cite just one example from the art, can be optionally and beneficially used.

In the embodiment of FIG. 6B, the very hot liquid 84VHL downstream of the downstream solar module 1D provides heat to a steam (Rankine) thermodynamic cycle engine 78E at diminishing temperatures first a solar super-heater 29SH and a solar re-heater 29RH, then to a solar steam generator 29SG, then to a solar pre-heater 29PH, as illustrated. The high temperature fluid is no longer a very hot liquid 84VHL, but substantially cooler as it enters a expansion vessel 29EV, and thence into a fluid pump 30F that returns the fluid into the liquid return pipe 33R that feeds back into the inflow liquid transport pipe 33I of the first solar photovoltaic module 1F. The liquid return pipe 33R may run through a water body, a heat exchanger, and/or a radiator to desirably further cool the liquid before it returns into the liquid return pipe 33R.

The steam thermodynamic cycle engine 78E that is illustrated pumps water with a water pump 30W into the solar pre-heater 29PH, where it is heated. The heated water then flows into the solar steam generator 29SG where it is boiled to form steam. The steam then flows into the solar super-heater 29SH, where it is super heated to a higher temperature and a high pressure. The super heated high pressure steam then drives a high pressure steam turbine 37H, which converts heat energy into mechanical energy. The cooler lower pressure steam output from the high pressure steam turbine 37H is then heated again in a solar re-heater 29RH, which also obtains solar heat from a branch of the fluid that is the very hot liquid 84VHL, as shown. The re-heated steam then drives a lower pressure turbine 37L, and the output flow which may be a mixture of steam and water, flows into a condenser 37C, optionally through a low pressure pre-heater (not shown) and a deaerator 37D before feeding back into the water pump 30W to restart the steam cycle of the steam thermodynamic cycle engine 78E.

The thermodynamic cycle engine 78E harvests additional renewable energy over and above electric energy harvested by the solar cells in the elongated solar photovoltaic receiver 2 in the first solar photovoltaic module 1F and in the higher temperature elongated solar photovoltaic receiver 2H in the higher temperature solar photovoltaic module 1H. The thermodynamic cycle engine 78E converts thermal energy from the very hot liquid 84VHL to mechanical energy, which in turn is converted to electrical energy by generator means 80 for converting at least some of the mechanical energy into electrical energy. Electric power conditioning means 80C are shown for conditioning electrical output from the various sources such as the downward facing solar cells of the elongated solar photovoltaic receiver 2 and higher temperature elongated solar photovoltaic receiver 2H, the generator means 80 and an optional thermoelectric device (not shown). The electrical power conditioning means 80C may perform one or more of electrical power conditioning functions known from the prior art, such as DC to or from AC conversion (e.g., inverter function), voltage changing, voltage and/or current stabilizing, phase control or changing, and/or other electrical power conditioning functions as are known from the prior art. In the illustrated embodiment, electrical energy storage means 80S are also shown connected to the electrical power conditioning means 80C. The electrical energy storage means 80S may comprise for example a capacitor, a super capacitor, and ultra capacitor, or a flywheel connected to an electric motor-generator, or connected water reservoirs at different elevations with a pump-turbine and electric motor-generator in the connection, to cite some examples without limitation. The output from the electrical power conditioning means 80C is transmitted by electric power transmission means 80T such as electrical wire or cable, to users of electric power such as a home or building that may be off-grid or grid-connected, and may optionally feed back into an electric grid through a net-metering or other mechanism as known in the art.

In variant embodiments some of the heat from the very hot liquid 84VHL and/or the hotter liquid 84HL and/or intermediate temperature liquid 84IL, can be beneficially used for heating purposes such as providing hot water for a home, building, swimming pool or hot tub, and/or for home or building heating, and/or for cooking and/or for industrial or commercial process heat. FIG. 6B therefore illustrates a connected array 17 of plural inflatable linear heliostatic concentrating solar modules 1A, which solar modules include (a) a solar module 1A that is an inflatable linear heliostatic concentrating cooled solar photovoltaic module 1 and (b) a solar module 1A that is a downstream solar module 1D consisting of a solar thermal module 1T having exclusively a solar collector that is a solar collector configured in the form of an elongated solar thermal receiver 2T, wherein said (a) inflatable linear heliostatic concentrating cooled solar photovoltaic module 1 includes:

an elongated solar receiver 2A that is at least one of (e) an elongated solar photovoltaic receiver 2 of a first photovoltaic module 1F and (f) a higher temperature elongated solar photovoltaic receiver 2H of a second photovoltaic module 1S, the elongated solar receiver 2A including a portion of substantially linear geometry 3 with a linear axis 4;

a reflection and concentration surface 7 for reflecting and concentrating sunrays 8;

and a substantially enclosed elongated inflatable volume 10 comprising (c) an upper inflatable volume 10U above said reflection and concentrating surface 7, with a substantially transparent surface 11 above said upper inflatable volume 10U, and further comprising (d) a lower volume 14 below said reflection and concentrating surface 7, with a bottom surface 13 below said lower volume 14;

and wherein said (a) inflatable linear heliostatic concentrating cooled solar photovoltaic module 1 includes cooling means 21 for removing excess heat 27 from said at least one of (e) an elongated solar photovoltaic receiver 2 of a first photovoltaic module 1F and (f) a higher temperature elongated solar photovoltaic receiver 2H of a second photovoltaic module 1S, said cooling means 21 including a heated cooling fluid 26 that is heated by heat 27 from said at least one of (e) an elongated solar photovoltaic receiver 2 of a first photovoltaic module 1F and (f) a higher temperature elongated solar photovoltaic receiver 2H of a second photovoltaic module 1S;

and wherein said (b) downstream solar module 1D consisting of a solar thermal module 1T, includes:

a reflection and concentration surface 7 for reflecting and concentrating sunrays 8;

and a substantially enclosed elongated inflatable volume 10 comprising (c) an upper inflatable volume 10U above said reflection and concentrating surface 7, with a substantially transparent surface 11 above said upper inflatable volume 10U, and further comprising (d) a lower volume 14 below said reflection and concentrating surface 7, with a bottom surface 13 below said lower volume 14;

and wherein the elongated solar thermal receiver 2T of said solar thermal module 1T is designed to operate at a higher solar receiver temperature than said at least one of (e) an elongated solar photovoltaic receiver 2 of a first photovoltaic module 1F and (f) a higher temperature elongated solar photovoltaic receiver 2H of a second photovoltaic module 1S;

and wherein the elongated solar thermal receiver 2T includes a portion of substantially linear geometry 3 with a linear axis 4;

further comprising connecting means 85 for connecting said plural inflatable linear heliostatic concentrating solar modules 1A comprising heated fluid connecting means 85F for conveying heat energy in heated cooling fluid 26 outflow from said (a) inflatable linear heliostatic concentrating cooled solar photovoltaic module 1 to a heated fluid stream inflow into said (b) downstream solar module 1D consisting of a solar thermal module 1T wherein the heated fluid stream is further heated to outflow a very hot liquid 84VHL, by concentrated radiation energy received from the reflection and concentration surface 7 for reflecting and concentrating sunrays 8 in said (b) downstream solar module 1D;

further comprising support structure 15 for supporting said plural inflatable linear heliostatic concentrating solar modules 1A on a supporting surface 16;

further comprising heliostatic control means 18 for aiming at least one rotatable portion 19 of said connected array 17 of plural inflatable linear heliostatic concentrating solar modules 1A, as a function of time, such that incoming sunrays 8 from a sunward direction 8D will be reflected and concentrated by said reflection and Concentration surfaces 7, onto said elongated solar receivers 2A at a concentration ratio of at least two suns; and further comprising electrical power means 20 for collecting and transmitting electrical power from said elongated solar photovoltaic receiver 2.

FIG. 6B also illustrates a connected array 17 of plural inflatable linear heliostatic concentrating solar modules 1A, further comprising beneficial heat use means 77 for beneficially using heat, which beneficial heat use means comprises at least one of:

(i) supplemental electrical power means 78 for harvesting additional power from the Sun 8S, which supplemental electrical power means 78 comprises a thermodynamic cycle engine 78E, wherein said very hot liquid 84VHL provides heat to said thermodynamic cycle engine 78E, which thermodynamic cycle engine 78E serves as means for harvesting mechanical energy 79M from heat energy 79H, with generator means 80 for converting at least some of said mechanical energy 79M into electrical energy 79E; and (ii) beneficial means 79B for using heat energy 79H for providing beneficial heat to at least one of a building, a home, a swimming pool, a hot water tank, a heating appliance, a heating device, a dryer, a cooking appliance, a cooking device, an industrial process, and a chemical process.

The embodiments of the invention shown in each of FIG. 6A and FIG. 6B illustrate a connected array 17 of plural inflatable linear heliostatic concentrating solar modules 1A including at least one inflatable linear cooled heliostatic concentrating solar photovoltaic module 1, wherein:

each said solar module 1A comprises an elongated solar receiver 2A including a portion of substantially linear geometry 3 with a linear axis 4;

each said solar module 1A comprises a reflection and concentration surface 7 for reflecting and concentrating sunrays 8;

each said solar module 1A comprises a substantially enclosed elongated inflatable volume 10 comprising (i) an upper inflatable volume 10U above said reflection and concentrating surface 7, with a substantially transparent surface 11 above said upper inflatable volume 10U, and further comprising (ii) a lower volume 14 below said reflection and concentrating surface 7, with a bottom surface 13 below said lower volume 14;

each said solar photovoltaic module 1 includes cooling means 21 for removing excess heat 27 from its elongated solar receiver 2A comprising an elongated solar photovoltaic receiver 2, said cooling means 21 including a heated cooling fluid 26 that is heated by heat 27 from said elongated photovoltaic receiver 2;

further comprising connecting means 85 for connecting said plural inflatable linear heliostatic concentrating solar modules 1A comprising at least one of (i) structural connecting means 85S (not shown) for structurally connecting a first solar photovoltaic module 1F to a second solar module 1S and (ii) heated fluid connecting means 85F (shown) for conveying heat energy in heated cooling fluid 26 outflow from a first solar photovoltaic module 1F to a heated fluid stream 26S inflow into a higher temperature non-photovoltaic solar module comprising a solar thermal module 1T wherein the heated fluid stream 26S is further heated by concentrated radiation energy received from the reflection and concentration surface 7 for reflecting and concentrating sunrays 8 in the solar thermal module 1T;

further comprising support structure 15 for supporting said plural inflatable linear heliostatic concentrating solar modules 1A on a supporting surface 16;

further comprising heliostatic control means 18 for aiming at least one rotatable portion 19 of said connected array 17 of plural inflatable linear heliostatic concentrating solar modules 1A, as a function of at least one of time and other parameters, such that incoming sunrays 8 from a sunward direction 8D will be reflected and concentrated by said reflection and concentration surfaces 7, onto said elongated solar receivers 2A at a concentration ratio of at least two suns; and further comprising electrical power means 20 for collecting and transmitting electrical power from said elongated solar photovoltaic receiver 2.

The embodiments of the invention shown in each of FIG. 6A and FIG. 6B also illustrate the connected array 17 of plural inflatable linear heliostatic concentrating solar modules 1A of claim 3, wherein the elongated solar receiver 2A of the second solar module 1S includes an elongated solar thermal receiver 2T which heats the heated fluid stream 26S to a higher temperature by using concentrated radiation energy received from the reflection and concentration surface 7 for reflecting and concentrating sunrays 8 in the second solar module 1S; and further comprising beneficial heat use means 77 for beneficially using heat from said heated fluid stream outflow 26SO from said second solar module 1S, which beneficial heat use means 77 comprises at least one of:

(i) supplemental electrical power means 78 for harvesting additional power from the Sun 8S, which supplemental electrical power means 78 comprises supplemental thermodynamic power means 78T (shown in FIG. 6A) for harvesting additional power from the Sun 8S, wherein said heated fluid stream outflow 26SO from said second solar module 1S that has been heated by the elongated solar thermal receiver 2T serves at least in contributory part as a working fluid 94 for a thermodynamic cycle engine 78E, which thermodynamic cycle engine 78E serves as means for harvesting mechanical energy 79M from heat energy 79H in said heated fluid stream outflow 26SO, with generator means 80 for converting at least some of said mechanical energy 79M into electrical energy 79E;

(ii) supplemental electrical power means 78 for harvesting additional power from the Sun 8S, which supplemental electrical power means 78 comprises supplemental thermoelectric means 81 (shown in FIG. 6B) for harvesting additional power from the Sun 8S, which supplemental thermoelectric means 81 acts as means for directly harvesting electrical energy 79E from heat energy 79H in said heated fluid stream outflow 26SO from said second solar module 1S; and (iii) beneficial means 79B for using heat energy 79H (shown in FIG. 6B) in said heated fluid stream outflow 26SO from said second solar module 1S for providing beneficial heat to at least one of a building, a home, a swimming pool, a hot water tank, a heating appliance, a heating device, a dryer, a cooking appliance, a cooking device, an industrial process, and a chemical process.

Note that a thermodynamic cycle engine 78E may comprise at least one of a Brayton cycle engine, a Rankine cycle engine, a Stirling cycle engine, an Otto cycle engine, a hybrid cycle engine, and an alternative cycle engine.

Figure 7:
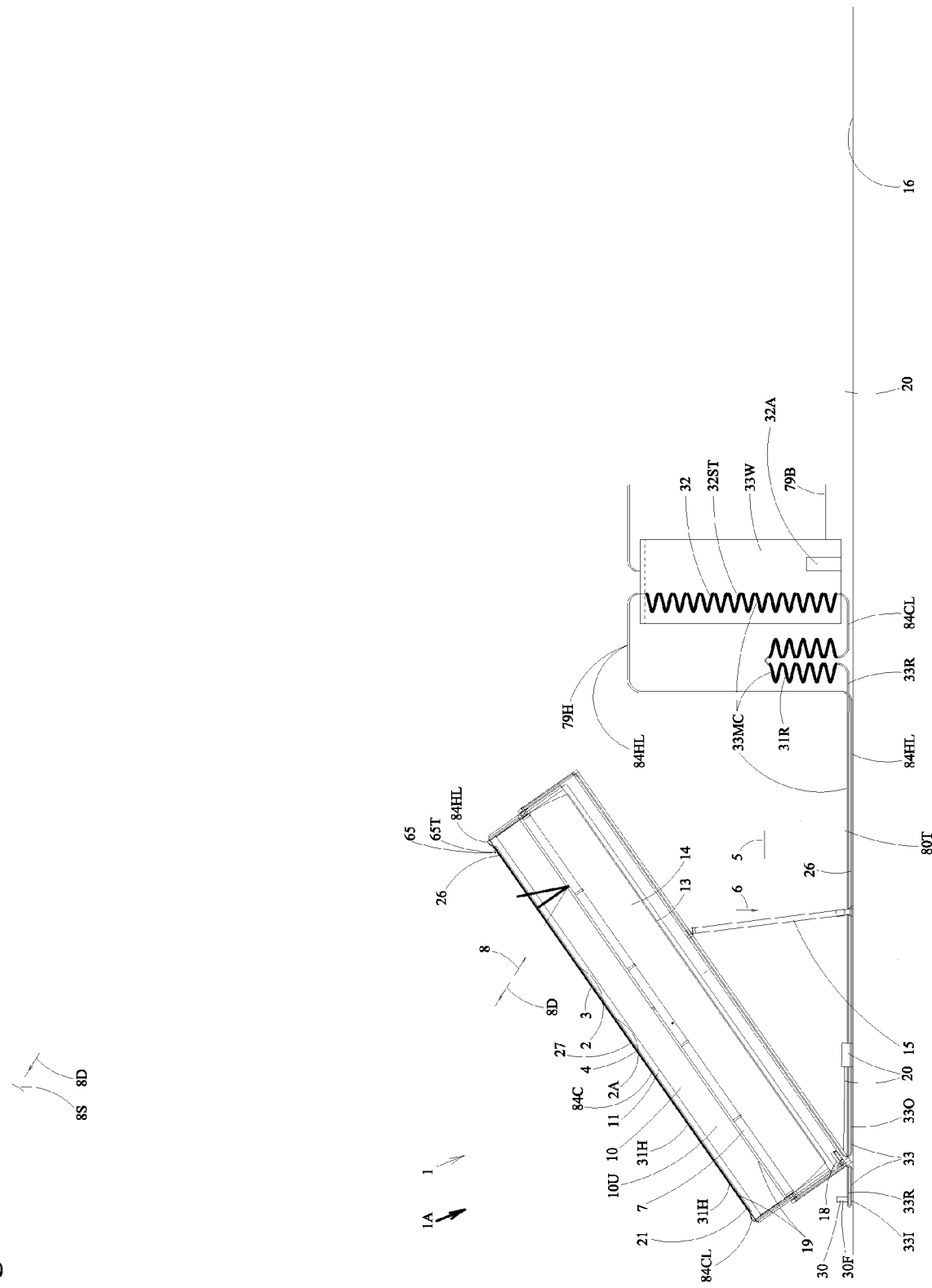
FIG. 7 shows a side view of an embodiment of the invention that has a solar module with a liquid cooling system.

FIG. 7 shows a side view of an embodiment of the invention that has a solar module 1A with a liquid cooling system, where the solar module 1A is a solar photovoltaic module 1 similar to the first solar photovoltaic module 1F shown in FIG. 6A. The embodiment of FIG. 7 uses a liquid cooling system, with a cooling system now comprising a system with liquid transport pipes 33 into and out of the solar photovoltaic module 1. Cooler liquid 84CL is transported by an inflow liquid transport pipe 33I that originates at a location external to the solar photovoltaic module 1, which inflow liquid transport pipe 33I is then is routed through members of the solar photovoltaic module 1 to feed into the bottom end (left end in the view of FIG. 7) of the liquid heating tube means 31H, where the liquid (e.g., a heated liquid coolant 84C shown) flows upwards (to the right in the view of FIG. 5A) while absorbing heat from the elongated solar receiver 2A (that is an elongated solar photovoltaic receiver 2) and increasing in temperature. The hotter liquid 84HL, exits the top end (right end in the view of FIG. 5A) of the liquid heating tube means 31H into an outflow liquid transport pipe 33O, which outflow liquid transport pipe 33O is routed through members of the solar photovoltaic module 1 and subsequently exits to a location external to the solar photovoltaic module 1. For this embodiment where the hotter liquid 84HL is used to heat water in a water tank for various beneficial purposes, the preferred but not limiting temperature range for the hotter liquid is between 65 degrees C. and 85 degrees C. inclusive. A sensor 65 that is a temperature sensor 65T can optionally be provided to measure the temperature of the hotter liquid 84L, and can feed a sensor signal into a control system that controls an optional pump 30 that is a fluid pump 30F, to pump fluid at an appropriate rate such that the sensed temperature is at a desired value (e.g., some value selected between 65 and 85 degrees C., without being limiting).

Note that the illustrated inflow liquid transport pipe 33I and outflow liquid transport pipe 33O could both include fluid flow rotary joints including an axle member. It should be understood that in alternate embodiments rotary joints, rotary unions or flexible hose fittings can alternatively be used to transport liquid across the rotating interfaces between (a) the nonrotating support structure 15 and (b) the rotatable portion 19 of the solar photovoltaic module 1 that includes the reflection and concentration surface 7 and the elongated solar receiver 2A.

The liquid cooling system of FIG. 7 can effectively cool an elongated solar receiver 2A that is an elongated solar photovoltaic receiver 2 and keep the photovoltaic cells or solar cells on the photovoltaic receiver at a lower temperature where they are not at risk of thermally induced damage and where they operate at higher electric power harvesting efficiency (typically no more than 85 degrees C. for nonspecialty silicon solar cells, without being limiting). The liquid cooling system can be either closed-loop (shown) or open-loop, and use water or other liquid coolant (shown, so as to avoid freezing during subfreezing weather conditions), as known from the prior art of many variant liquid cooling systems. Additional plumbing elements known from the art, such as valves, overflow valves, pressure relief valves, filters, traps, means for eliminating trapped air bubble, flow control devices such as faucet controls, drains, junctions and other elements can optionally also be provided, within the spirit and scope of the invention.

With a closed-loop liquid cooling system, means for cooling a flowing liquid 33MC can be provided between the outflow liquid transport pipe 33O carrying hotter liquid 84HL and eventually returning into the inflow liquid transport pipe 33I as cooler liquid 84CL, which means for cooling a flowing liquid 33MC may include at least one of a liquid reservoir (water tank 33W shown acts as a heat sink or heat absorber), a radiator 31R (shown), a heat exchanger and a cooling tower. FIG. 7 shows beneficial means 79B for using heat energy 79H in the heated fluid stream (hotter liquid 84HL) for providing beneficial heat to at least one of a hot water tank (water tank 33W shown, being heated by heat transfer means 32 comprising the illustrated spiral tube heat transfer means 32ST), a home, a building, an in-floor heating system, a radiator heating system, a swimming pool, a hot tub, a jacuzzi, a spa, a sauna, a heating appliance, a heating device, a dryer, a cooking appliance, a cooking device, an industrial process, and a chemical process. The illustrated water tank 33W is shown with the addition of a (non-solar) alternate heater means 32A for heating water, to heat water in the water tank 33W during periods of cloud cover or night time periods when the solar module 1A is not collecting solar energy. The alternate heater means 32A may comprise an electric water heater or gas water heater, for example.

Figure 8A:
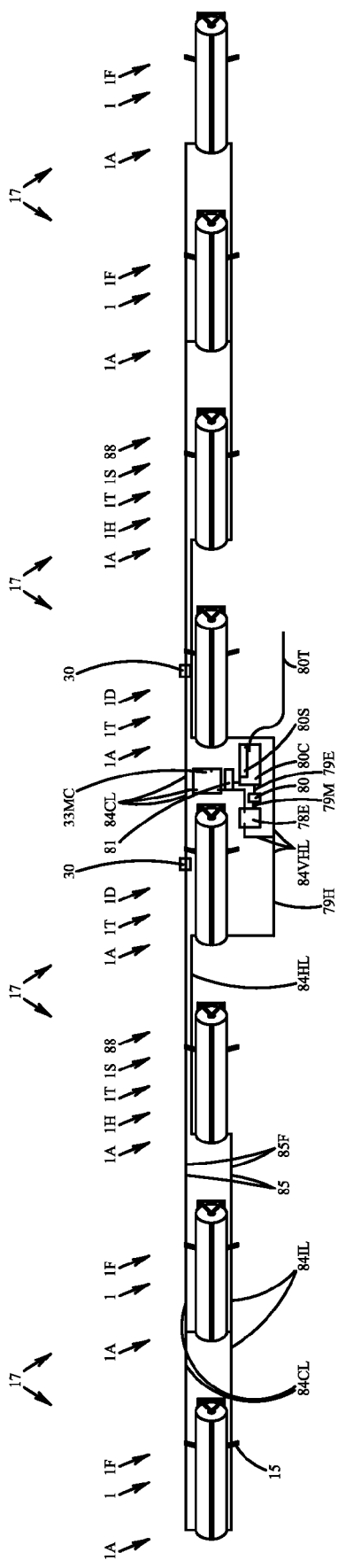
FIGS. 8A and 8B show plan views of embodiments with connected arrays of plural inflatable linear heliostatic concentrating solar modules.
Figure 8B:
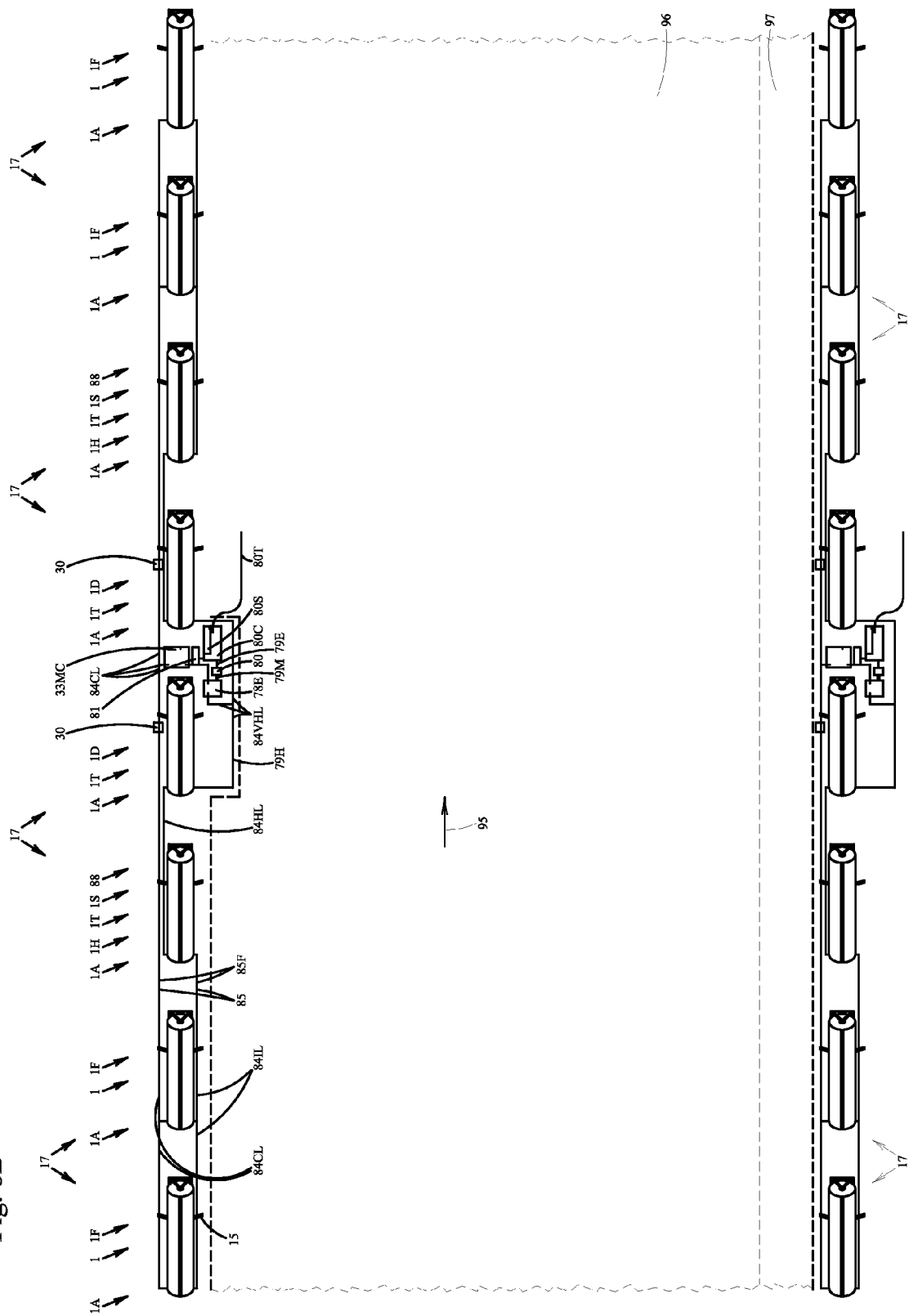

FIGS. 8A and 8B show plan views of embodiments with connected arrays 17 of plural inflatable linear heliostatic concentrating solar modules 1A.

FIG. 8A shows a plan view of an embodiment of the invention with a connected array 17 of eight inflatable linear heliostatic concentrating solar modules 1A. The 8 solar modules are shown in a substantially linear array, but it should be understood that varying numbers of modules and varying geometric arrangements of the connected array are possible within the spirit and scope of the invention.

The illustrated connected array 17 has solar modules 1A including a pair of solar photovoltaic modules 1 that are first solar photovoltaic modules 1F at the left end of the connected array 17, and another pair of solar photovoltaic modules 1 that are first solar photovoltaic modules 1F at the right end of the connected array 17. Each first solar photovoltaic module uses liquid cooled solar cells that harvest electric power from concentrated sunlight, with the liquid cooling system using an input fluid stream that is cooler liquid 84CL (pumped by at least one pump 30), and an output fluid stream that is intermediate temperature liquid 84IL, as illustrated.

Moving inward in the connected array 17 from the first solar photovoltaic modules 1F, the next pair of solar modules 1A comprise second solar modules 1S which are higher temperature second solar modules 88, and that comprise higher temperature solar photovoltaic modules 1H that are also solar thermal modules 1T. Each higher temperature solar photovoltaic module 1H uses a liquid cooling with an input fluid stream that is intermediate temperature liquid 84IL coming from the first solar photovoltaic modules 1, with the fluid stream getting heated by "waste heat" from the higher temperature solar photovoltaic module 1H and leaving as a hotter liquid 84HL. The higher temperature solar photovoltaic modules 1H will preferably utilize solar cells or photovoltaic receptors that are tolerant of higher temperatures without damage or excess loss of efficiency or performance. Examples of types of higher temperature solar cells include higher temperature silicon solar cells, gallium arsenide solar cells, and multijunction solar cells, without being limiting.

Moving inward in the connected array 17 from the second solar modules 1S, two more solar modules 1A are shown, which are downstream solar modules 1D that are solar thermal modules 1T that are intended to operate at a still higher solar receiver temperature than the second solar modules 1S. The downstream solar modules 1D increase the temperature of the working fluid as it transitions from being a hotter liquid 84HL before said downstream solar modules 1D, to being a very hot liquid 84VHL downstream of said downstream solar modules 1D. Plural downstream solar modules 1D in series (not shown) can optionally be used to further increase the temperature of the flowing working fluid, in conjunction with optimized design features for solar concentration in suns in each module, fluid flow rate control optimization, and optimized thermal insulation for piping that carries the very hot liquid 84VHL.

The very hot liquid carries heat energy harvested from reflected concentrated sunlight from the Sun, at a very hot temperature to a thermodynamic cycle engine 78E that converts the heat energy 79H into mechanical energy 79M. The efficiency of the thermodynamic cycle is high, as the temperature of the input heat energy is very hot, as is well known from the science of thermodynamics. The thermodynamic cycle engine 78E may comprise at least one of a Brayton cycle engine, a Rankine cycle engine, a Stirling cycle engine, an Otto cycle engine, a hybrid cycle engine and an alternative thermodynamic cycle engine. Mechanical energy 79M is converted by generator means 80 for generating electricity, into electrical energy 79E, that is subsequently combined with electrical energy from other sources and appropriately conditioned, by electric power conditioning means 80C. The other sources of electrical energy feeding into the electric power conditioning means 80C include electricity harvested by the solar cells in each of the solar photovoltaic modules 1 and higher temperature solar photovoltaic modules 1H, as well as electricity harvested by the illustrated supplemental thermoelectric means 81 that harvests additional energy and power from the working fluid outflow from the thermodynamic cycle engine 78E before it flows into means for cooling a flowing liquid 33MC. Conditioned electric power is output from the electric power conditioning means 80C via electric power transmission means 80T, for transmission eventually connecting to users of electric power.

FIG. 8B shows a plan view of an embodiment of the invention similar to that of FIG. 8A, but showing two laterally separated connected arrays 17 of eight inflatable linear heliostatic concentrating solar modules 1A each, in a substantially linear array arranged substantially along a North-South orientation, with the lateral separation in an East-West orientation, as illustrated. The orientation of the illustrated view is with North 95 towards the right, as illustrated, for a Northern Hemisphere installation. An analogous illustration for the Southern Hemisphere would have South to the right. Note that the two laterally separated connected arrays 17 can also be considered as a single two-dimensional array.

The lateral separation of the two laterally separated connected arrays 17 greatly minimizes any shadowing of solar modules 1A in one array from other solar modules 1A in the other array, for morning and evening conditions when the Sun is at very low elevation angle. North-South staggering of the solar modules 1A in adjacent laterally separated connected arrays 17 may optionally be provided to further reduce shadowing effects in different geographic locations. The land in the area of lateral separation, in one preferred embodiment, can be a field 96. The field 96 could be a grazing field, an agricultural field planted with crops, or even a parking lot. An access road 97 could optionally be provided as illustrated, for purposes that may vary from maintenance and installation access for the solar modules 1A, to transportation purposes.

Embodiments of the class of FIG. 8B are well suited for application on farm land or other low-height land uses, such as recreational land, parks and parking lots. For a typical agricultural land implementation, large fields can be divided into plural long North-South oriented fields with rows of solar modules 1A between them. A grid of North-South and also some widely spaced East-West access roads or unpaved roads can optionally be provided. The solar module rows may optionally be fenced around. In this manner a substantial majority (e.g., 60% to 99%) of the land can still be beneficially used for the original intended (e.g., agricultural) purpose, while the balance of the land is efficiently and effectively used for solar energy harvesting with very minimal shadowing effects.

While a certain combination and arrangement of solar photovoltaic modules 1, higher temperature solar photovoltaic modules 1H, and downstream solar modules 1D that are solar thermal modules 1T are shown, it will be understood that other combinations and arrangements are possible within the spirit and scope of the invention. Similarly, while a certain number and arrangement of thermodynamic cycle engine(s) 78E generator means 20 are shown, varying number(s) and arrangements are possible within the spirit and scope of the invention, with greater or lesser distribution or federation.

FIGS. 9A through 9H show side views of alternate embodiments of the invention.

Figure 9A:
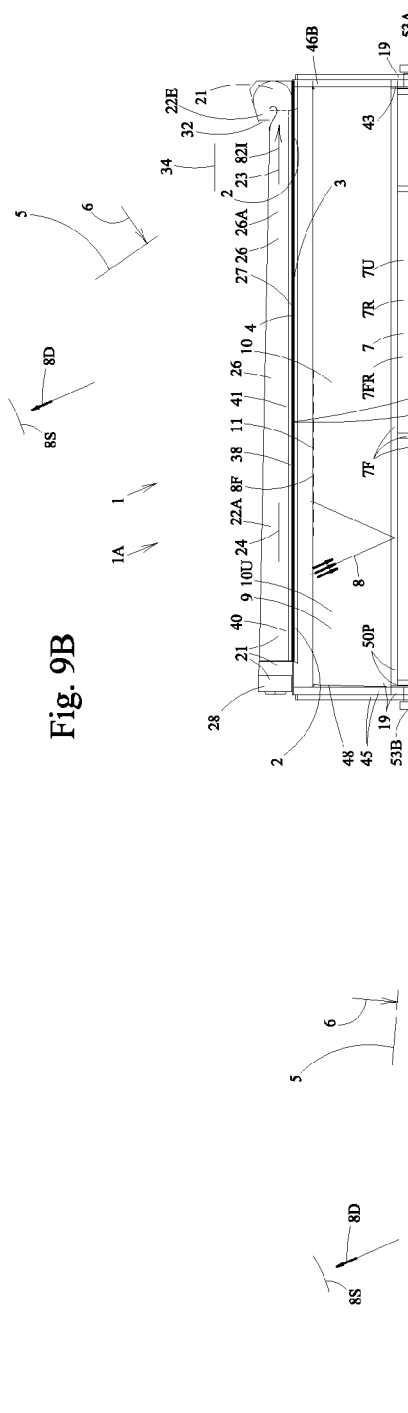

FIG. 9A shows a side view of an embodiment similar to that of FIG. 1A, but with a less elongated solar photovoltaic module 1. Without being limiting, for comparison if the embodiment of FIG. 1A has an elongated photovoltaic receiver 2 that is about 20 feet long, the embodiment of FIG. 9A has an elongated photovoltaic receiver that is about 9 feet long. And without being limiting, for comparison where the embodiment of FIG. 1A has an elongated photovoltaic receiver 2 that is tilted at a latitude tilt of about 35 degrees, the embodiment of FIG. 9A has an elongated photovoltaic receiver that is tilted at a latitude tilt of only 5 degrees, representative of a much more near-Equatorial location.

Figure 9B:
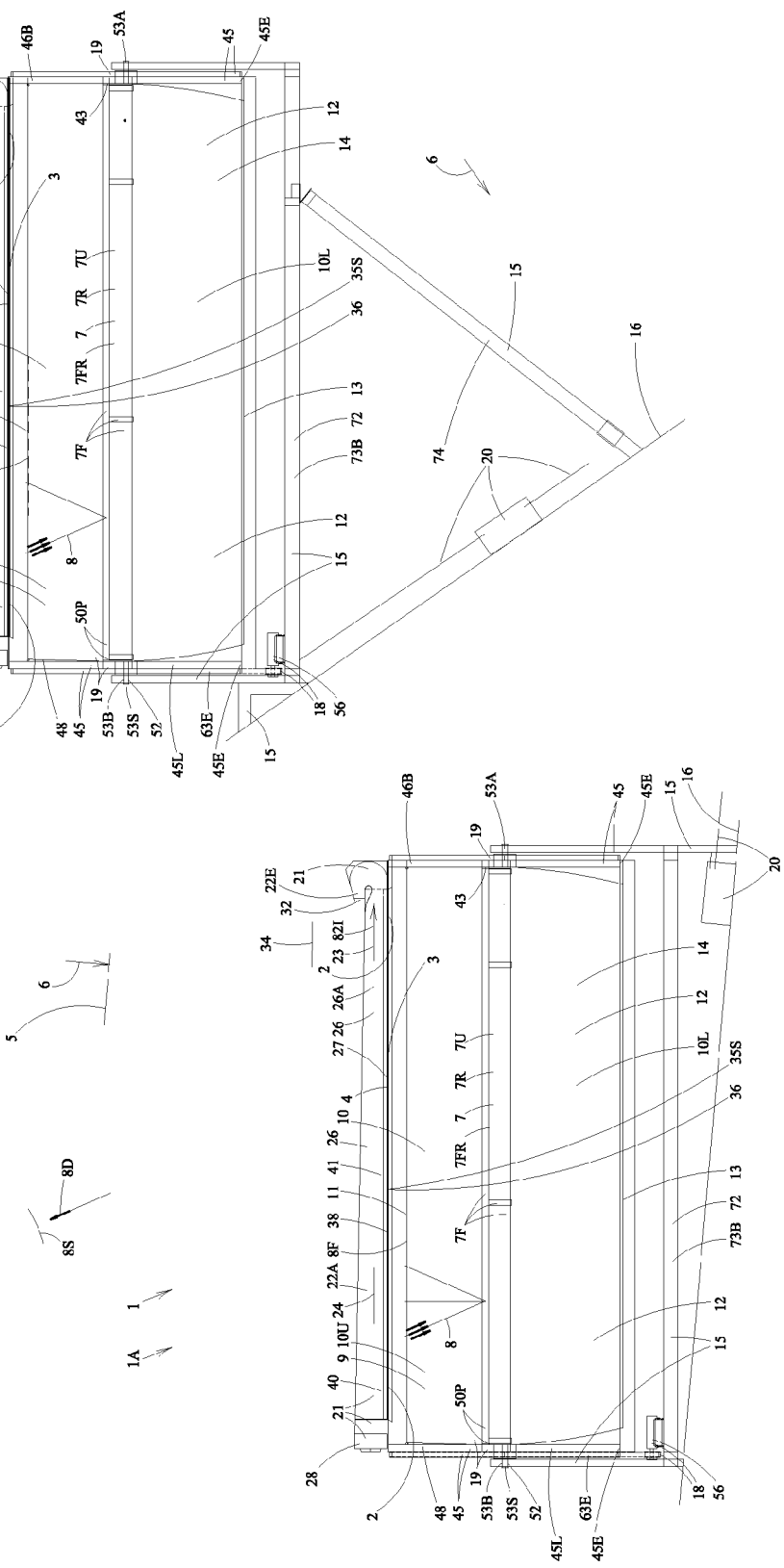

FIG. 9B shows a side view of an embodiment similar to that of FIG. 9A, but wherein the embodiment of FIG. 9B has an elongated photovoltaic receiver that is tilted at a latitude tilt of 55 degrees, representative of a much more near-polar location. The embodiment of FIG. 9B requires a tall frame tilting structure 74 to maintain the 55 degree latitude tilt, as illustrated. With the steep tilt of the cooling means 21, a version with just hot gas buoyancy induced flow and no fan would certainly be a possible variant embodiment.

Figure 9C:
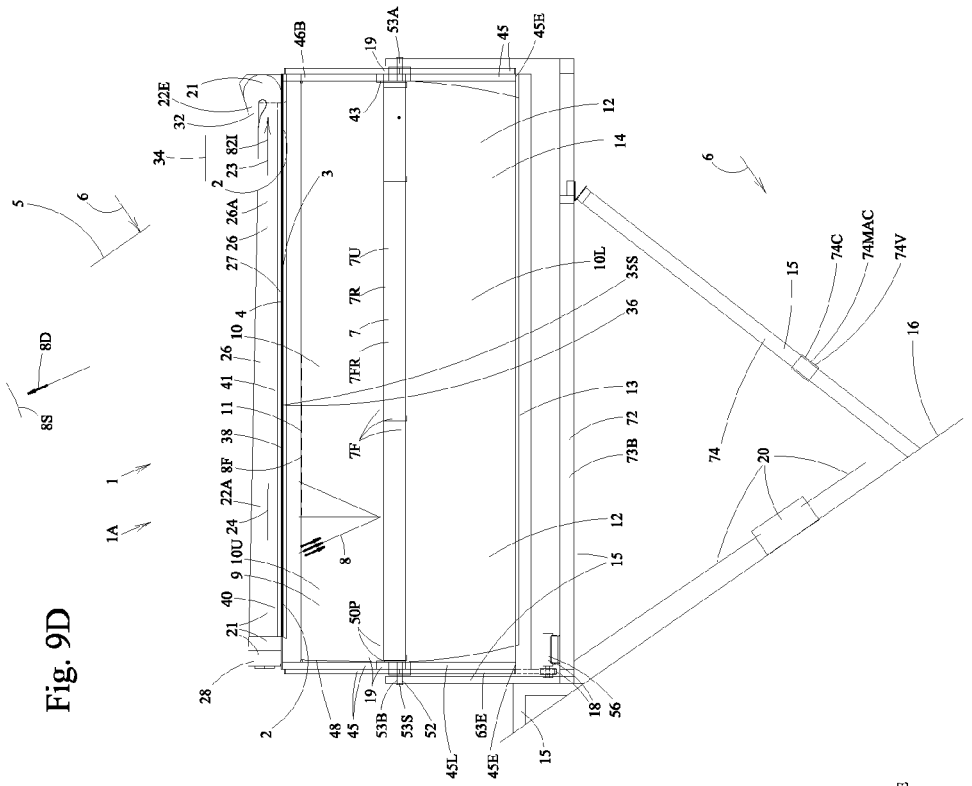

FIG. 9C shows a side view of an embodiment similar to that of FIG. 9B, but wherein the support structure 15 supports the solar photovoltaic module 1 with a cantilevered support from one end of the device, the left end in the illustrated view.

Figure 9D:
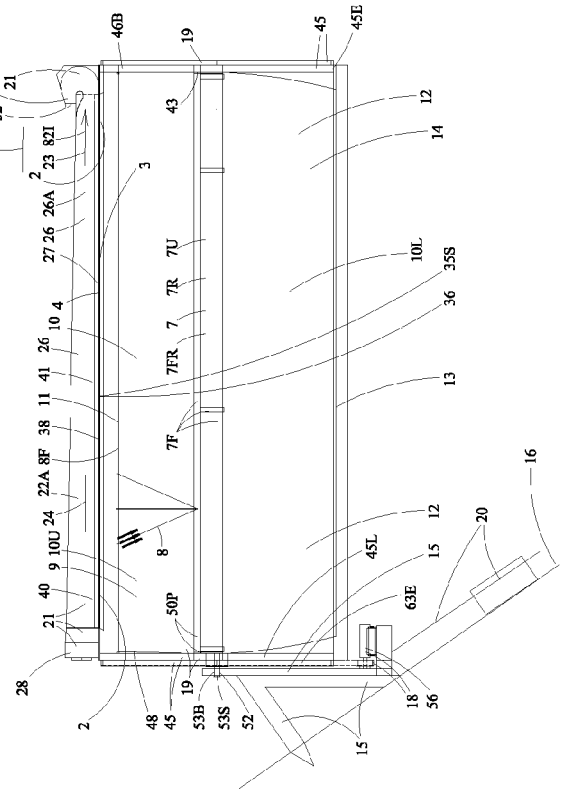

FIG. 9D shows a side view of an embodiment similar to that of FIG. 9B, but wherein the frame tilting structure 74 comprises at least one of a motorized and an actuated controllable height frame tilting structure 74MAC, here being both a controllable height frame tilting structure 74C and a variable height adjustable frame tilting structure 74V. Variable tilt angles could be used for optimized performance at different locations in different seasons, or optionally for two-axis heliostatic tracking.

FIG. 9E shows a side view of an embodiment of the invention which is an inflatable linear heliostatic concentrating solar module 1A (illustrated is a solar photovoltaic module 1 similar to that of FIG. 2A, without limitation), now mounted on a roof surface 16R on a building 98, and hence not necessarily requiring a frame tilting structure 74. The roof preferably has a slope 16SL towards the South in Northern Hemisphere installations (shown), and a slope towards the North 95 in Southern Hemisphere installations (not shown). The slope would ideally match the latitude, but clearly this concept of rooftop mounting can work with variations in roof slope and direction through the use of adaptor fittings or legs.

FIG. 9F shows a side view of an embodiment of the invention with a connected array of plural inflatable linear heliostatic concentrating solar modules 1A including at least one inflatable linear cooled heliostatic concentrating solar photovoltaic module 1 are mounted on a serrated shape roof surface 16R on a building 98, and hence not necessarily requiring frame tilting structures 74. The roof preferably has slopes 16SL towards the South in Northern Hemisphere installations (shown), and a slope towards the North 95 in Southern Hemisphere installations (not shown). The slope would ideally match the latitude, but clearly this concept of rooftop mounting can work with variations in roof slope and direction through the use of adaptor fittings or legs. The embodiment of FIG. 9F can incorporate the various features earlier described in the context of FIGS. 6A and 6B. Also, in addition to the heated fluid connecting means 85F between the plural inflatable linear heliostatic concentrating solar modules 1A, FIG. 9F shows connecting means 85 for connecting said plural inflatable linear heliostatic concentrating solar modules 1A comprising also structural connecting means 85S (through the structure of the building 98 as illustrated) for structurally connecting a first solar photovoltaic module 1F to a second solar module 1S.

Figure 9G:
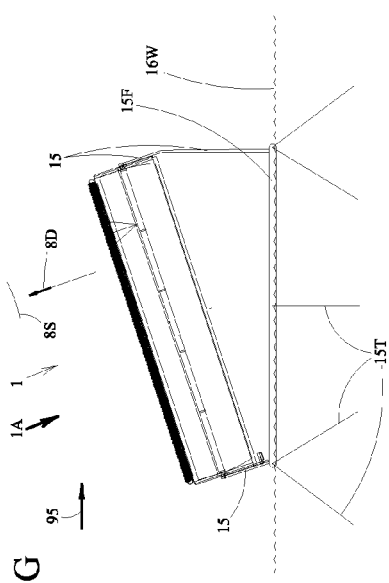

FIG. 9G shows an embodiment similar to that of FIG. 9E, but supported on a water surface 16W instead of on a roof surface 16R. The support structure 15 now includes 15F floating support structure 15F and underwater tethers 15T.

Figure 9H:
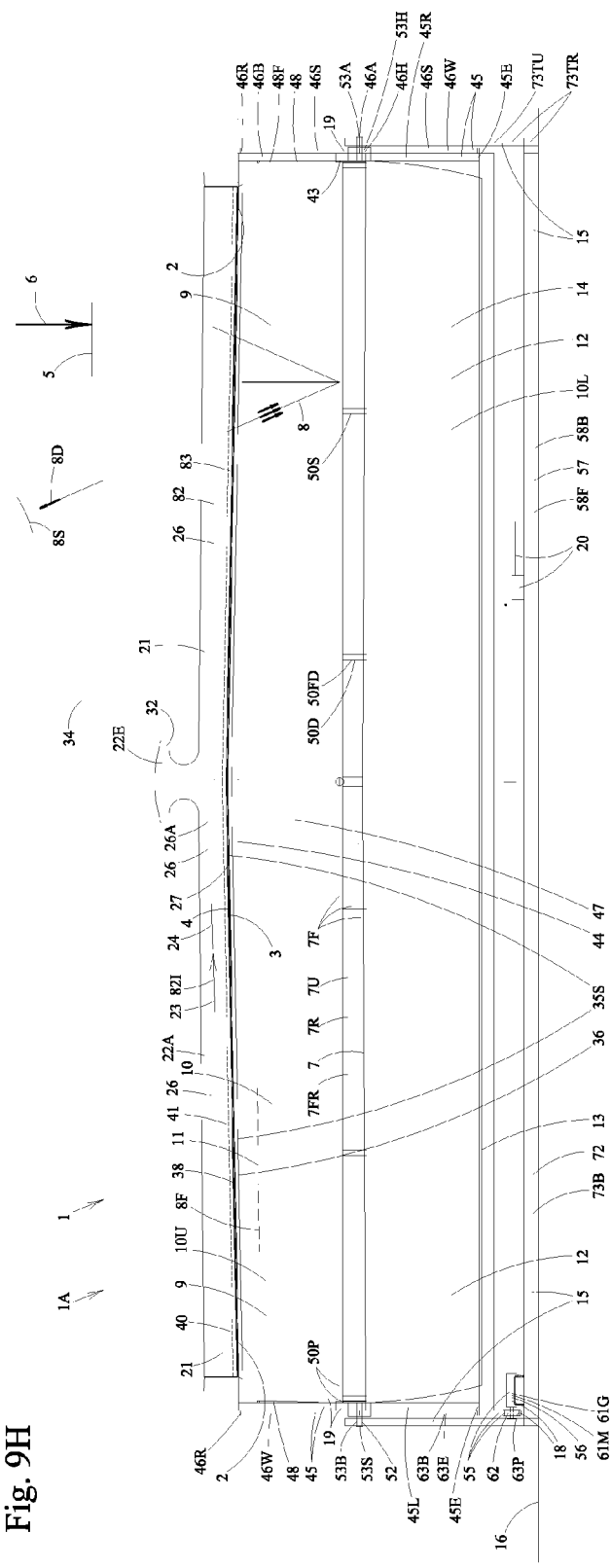

FIG. 9H shows a side view of an embodiment of the invention which is an inflatable linear heliostatic concentrating solar module 1A (illustrated is a solar photovoltaic module 1 similar to that of FIG. 1A, without limitation), now supported by support structure 15 on a supporting surface 16 (that may be a land or water surface) without tilt and, and therefore not requiring a frame tilting structure 74. The device can be mounted with either a North-South orientation or an East-West orientation along with heliostatic control means 18 to follow the apparent motion of the Sun so as to reflect and concentrate sunrays 8 on the elongated solar photovoltaic receiver 2 over a period of operating solar time. The embodiment shown has some left to right slope on either side of the reflection and concentration surface 7 as shown, so that (i) the focal line of reflected sunrays 8F and (ii) the linear axis 4 of the portion of substantially linear geometry 3 of the elongated solar photovoltaic receiver 2 and (iii) the orientation 24 of the tilted fluid path 23, all also have some left to right slope, as shown in the Figure. Thus the illustrated embodiment has cooling means 21 including a tilted fluid path 23 that is tilted up in an orientation 24 including a component along said linear axis 4, wherein buoyancy force acting on heated cooling fluid 26 that is heated by heat 27 from said elongated photovoltaic receiver 2, contributes to moving said heated cooling fluid 26 upward in said tilted fluid path 23. Left and right side cooling streams converge and exhaust through a central exhaust hood 22E, as illustrated.

FIG. 9H therefore shows a tilted inflatable linear cooled heliostatic concentrating solar photovoltaic module 1, comprising: an elongated solar photovoltaic receiver 2 including a portion of substantially linear geometry 3 with a linear axis 4 in its installed orientation being tilted up from a horizontal plane 5 that is perpendicular to the local gravity vector 6; a reflection and concentration surface 7 for reflecting and concentrating sunrays 8; an elongated upper inflatable volume 9 above said reflection and concentrating surface 7, with a substantially transparent surface 11 above said upper inflatable volume 9; an elongated lower inflatable volume 12 below said reflection and concentrating surface 7, with a bottom surface 13 below said lower inflated volume 12; support structure 15 for supporting said solar photovoltaic module 1 on a supporting surface 16; heliostatic control means 18 for aiming a rotatable portion 19 of said solar photovoltaic module 1 as a function of at least one of time and other parameters, such that incoming sunrays 8 from a sunward direction 8D will be reflected and concentrated by said reflection and concentration surface 7, onto said elongated solar photovoltaic receiver 2 at a concentration ratio of at least two suns; electrical power means 20 for collecting and transmitting electrical power from said elongated solar photovoltaic receiver 2; and cooling means 21 for removing excess heat 27 from said elongated solar photovoltaic receiver 2, said cooling means 21 including a tilted fluid path 23 that is tilted up in an orientation 24 including a component along said linear axis 4, wherein buoyancy force acting on heated cooling fluid 26 that is heated by heat 27 from said elongated photovoltaic receiver 2, contributes to moving said heated cooling fluid 26 upward in said tilted fluid path 23.

FIG. 9H also shows a tilted inflatable linear cooled heliostatic concentrating solar photovoltaic module 1, comprising: an elongated solar photovoltaic receiver 2 including a portion of substantially linear geometry 3 with a linear axis 4 in its installed orientation being tilted up from a horizontal plane 5 that is perpendicular to the local gravity vector 6; a reflection and concentration surface 7 for reflecting and concentrating sunrays 8; a substantially enclosed elongated inflatable volume 10 comprising (i) an upper inflatable volume 10U above said reflection and concentrating surface 7, with a substantially transparent surface 11 above said upper inflatable volume 10U, and further comprising (ii) a lower volume 14 below said reflection and concentrating surface 7, with a bottom surface 13 below said lower volume 14; support structure 15 for supporting said solar photovoltaic module 1 on a supporting surface 16 with said linear axis 4 in its installed orientation being tilted up from a horizontal plane 5 that is perpendicular to the local gravity vector 6; heliostatic control means 18 for aiming a rotatable portion 19 of said solar photovoltaic module 1 as a function of at least one of time and other parameters, such that incoming sunrays 8 from a sunward direction 8D will be reflected and concentrated by said reflection and concentration surface 7, onto said elongated solar photovoltaic receiver 2 at a concentration ratio of at least two suns; electrical power means 20 for collecting and transmitting electrical power from said elongated solar photovoltaic receiver 2; and cooling means 21 for removing excess heat 27 from said elongated solar photovoltaic receiver 2, said cooling means 21 including a tilted fluid path 23 that is tilted up in an orientation 24 including a component along said linear axis 4, wherein buoyancy force acting on heated cooling fluid 26 that is heated by heat 27 from said elongated photovoltaic receiver 2, contributes to moving said heated cooling fluid 26 upward in said tilted fluid path 23.

FIGS. 10A through 10J show partial cross-sectional views of alternate embodiments of an inflatable linear heliostatic concentrating solar module 1A, illustrated as a solar photovoltaic module 1, without limitation.

FIG. 10A shows a partial cross-sectional view of an embodiment very similar to that shown in FIG. 1B, with the notable change being the use of suitably angled and shaped reflective flanges 7RF on either side of the downward facing solar cells 36, so that in the event of motion or distortion of various members of the device (e.g., such as the reflection and concentration surface 7), reflected light that spills laterally off to the right or left sides of the solar cells 36 will be re-reflected (at least to some extent) by the reflective flanges 7RF to fall on the solar cells 36 and contribute to solar energy harvesting without spillage loss.

FIG. 10B shows a partial cross-sectional view of an embodiment similar to that shown in FIG. 10A, with a substantially circular inflatable envelope cross-section shape made by the substantially transparent surface 11 and the bottom surface 13 in conjunction.

Figure 10C:
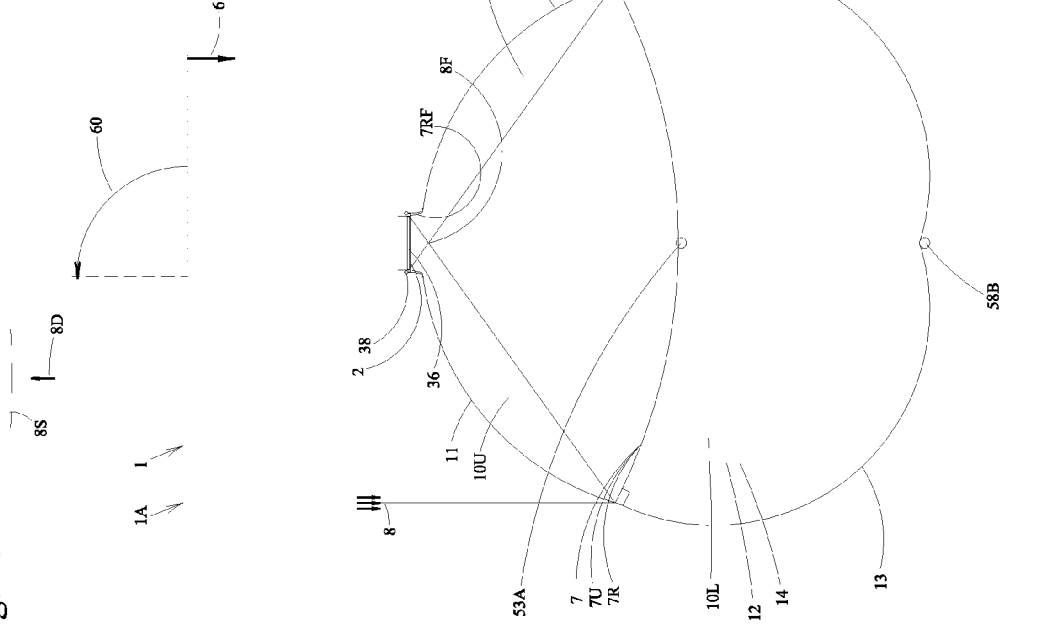

FIG. 10C shows a partial cross-sectional view of an embodiment similar to that shown in FIG. 10A, with a "double bubble" piecewise circular inflatable envelope cross-section shape, analogous to the "double bubble" piecewise circular cross-sections used on some aircraft pressurizable fuselages. The embodiment also shows the substantially transparent surface 11 contacting the bottom smooth flange surfaces of the two reflective flanges 7RF.

Figure 10D:
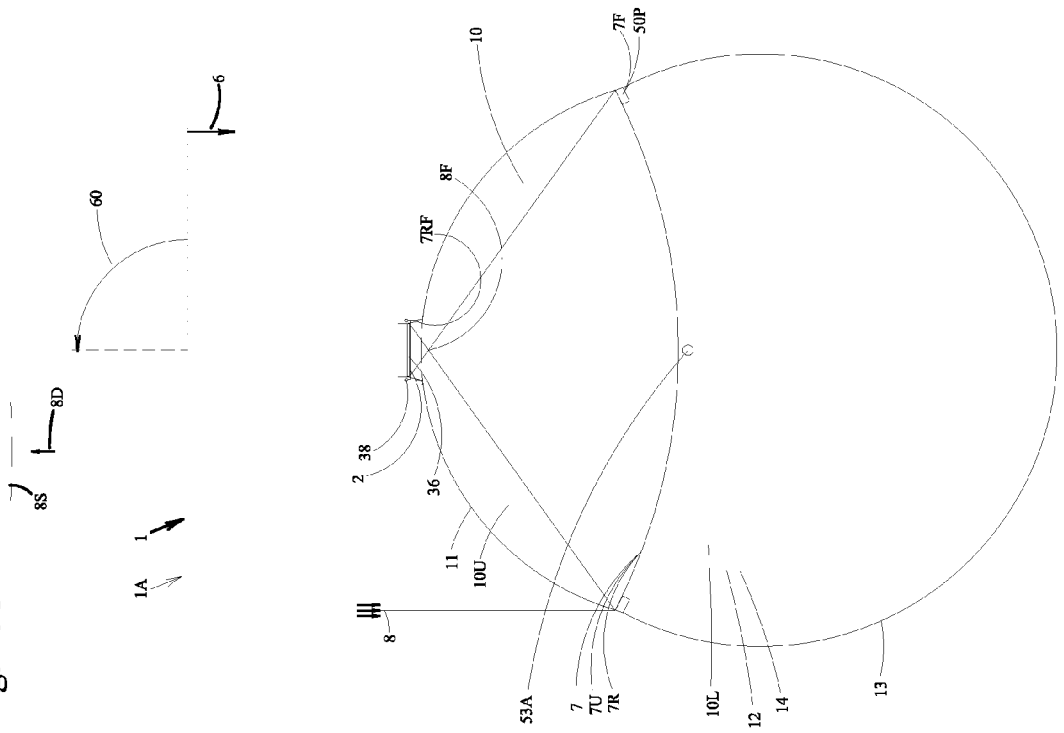

FIG. 10D shows a partial cross-sectional view of an embodiment similar to that shown in FIG. 10C, with the substantially transparent surface 11 split into two separate pieces with upper ends fastened and/or bonded to the bottom smooth flange surfaces of the two reflective flanges 7RF, and no transparent surface in the reflected light path between the reflection and concentration surface 7 and the downward facing solar cells 36. FIG. 10D also shows a "triple bubble" piecewise circular inflatable envelope cross-section shape, with the left and right bottom lobes meeting at a location held in place by a ballast beam 58B.

FIG. 10E shows a partial cross-sectional view of an embodiment similar to that shown in FIG. 10B, with an approximately elliptical (in lieu of circular) inflatable envelope cross-section shape made by the substantially transparent surface 11 and the bottom surface 13 in conjunction, as shown. Periodic framing members (not shown) can help maintain the approximately elliptical shape even when the upper and lower inflatable chambers are inflated to an above ambient pressure (with the upper chamber pressure typically being held a bit higher than the lower chamber pressure) with small or modest amounts of inflation induced pillowing between the framing members (not shown).

FIG. 10F shows a partial cross-sectional view of an embodiment with a substantially enclosed elongated inflatable volume 10 comprising (i) an upper inflatable volume 10U above the reflection and concentrating surface 7, with a substantially transparent surface 11 above the upper inflatable volume 10U, and further comprising (ii) a lower volume 14 (with a frame 7F) below the reflection and concentrating surface 7, and with a bottom surface 13 below the lower volume 14. The illustrated frame 7F maintains the reflection and concentrating surface 7 in shape and resists shape changing forces arising from pressurization of the upper inflatable volume 10U, and protects it from harm from any objects impacting the bottom surface 13 (as for example hail when the device is in an inverted safety stow configuration).

Figure 10H:
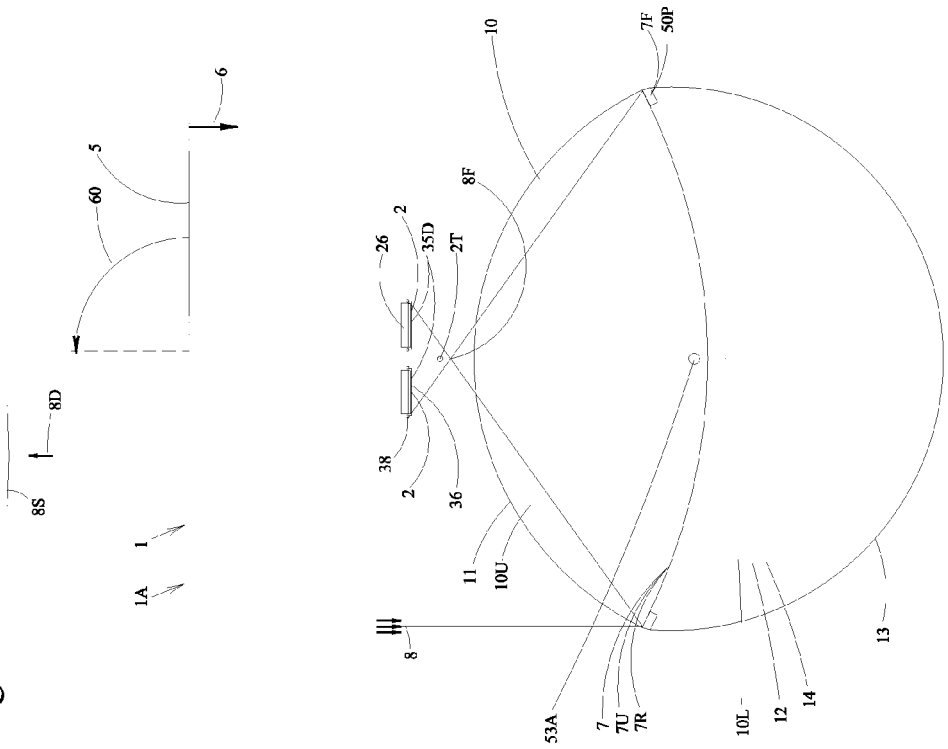
Figure 10G:
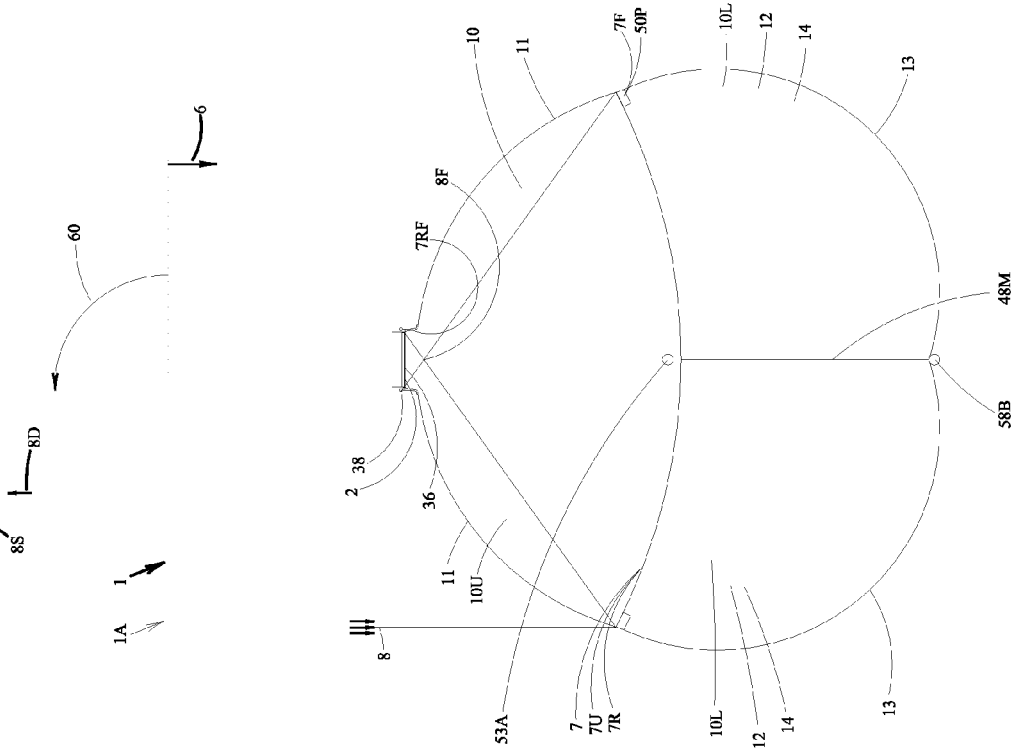

FIG. 10G shows a partial cross-sectional view of an embodiment similar to that shown in FIG. 10D, with a "triple bubble" piecewise circular inflatable envelope cross-section shape, with the left and right bottom lobes meeting at a location held in place by a ballast beam 58B. However, the embodiment of FIG. 10G shows the inflatable volumes bounded by the left and right bottom lobes respectively, as being separated by a membrane 48M that is an internal substantially impermeable central membrane.

FIG. 10H shows a partial cross-sectional view of a piecewise circular inflatable envelope cross-section shape, with less tall inflatable volumes above and below the reflection and concentration surface 7, as compared with the circular inflatable envelope of FIG. 10B. An elongated solar thermal receiver 2T is provided near the focal line of reflected sunrays 8F, and in addition a double row 35D of solar cells 36 is provided above the elongated solar thermal receiver 2T, with the two rows separated so as to avoid shadowing losses on to the solar cells 36 on each row. Structure connecting the double row 35D and the solar thermal receiver 2T is not shown in this partial cross-sectional view. The heated cooling fluid 26 that cools the dual elongated solar photovoltaic receivers 2 can be optionally be used as a preheated input fluid flowing into the elongated solar thermal receiver 2T.

Figure 10I:
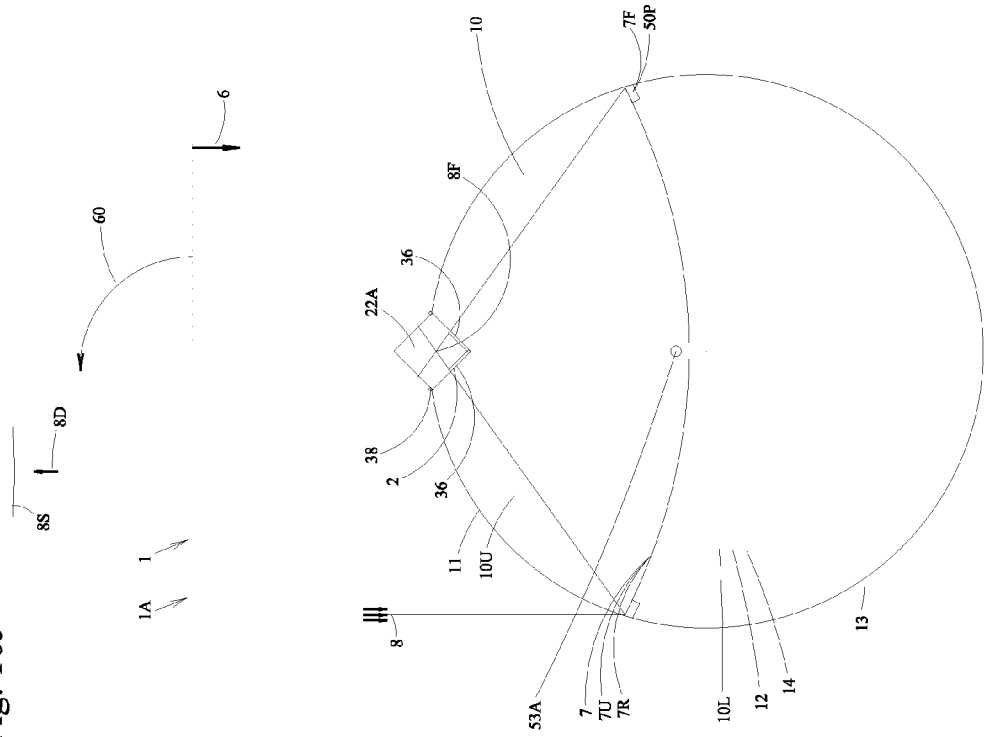

FIG. 10I shows a partial cross-sectional view of an embodiment similar to that shown in FIG. 10A, with a substantially vertically oriented (when the Sun is at solar noon) double-sided elongated solar photovoltaic receiver 2D that receives reflected and concentrated sunlight on both sides, from the reflection and concentration surface 7, as shown. The double-sided elongated solar photovoltaic receiver 2D acts naturally to some extent as a cooling fin, but additional cooling means as described elsewhere in this specification, may also optionally be provided. In variant embodiments the double-sided elongated solar photovoltaic receiver 2D may be partially or wholly below the substantially transparent surface 11, instead of above as illustrated.

Figure 10J:
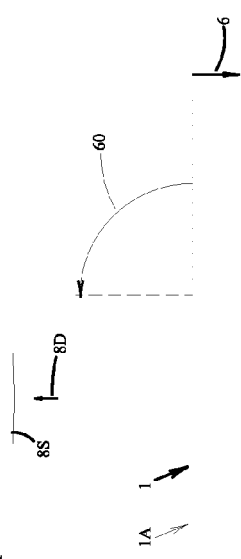

FIG. 10J shows a partial cross-sectional view of an embodiment similar to that shown in FIG. 10B, with a wedge-shaped elongated solar photovoltaic receiver 2 with solar cells 36 on both the downward facing faces of the wedge shape, as illustrated. While air cooling using an air cooling pipe 22A is shown in the illustrated embodiment of FIG. 10J, liquid cooling can be provided in variants thereof.

FIGS. 11A through 11D show partial side views of the right end structure 45R portion of the left and right end structures 45.

Figure 11D:
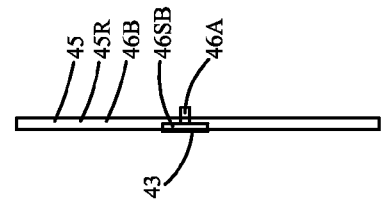
FIGS. 11A through 11D show partial side views of the right end structure portion of the left and right end structures.
Figure 11C:
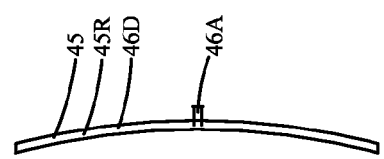
Figure 11B:
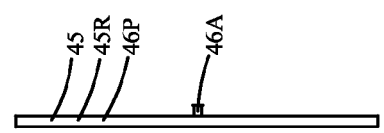
Figure 11A:
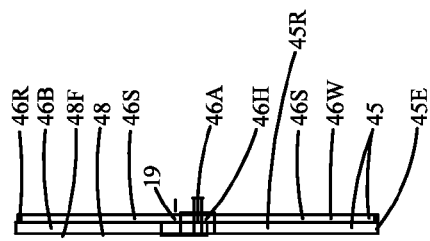

FIG. 11A shows a partial side view of the same right end structure 45R as shown and described earlier with reference to FIG. 1A. The illustrated right end structure 45 comprises at least one of (i) a beam member 46B (shown), (ii) a wheel member 46W (shown), (iii) a rim member 46R (shown), (iv) plural spoke members 46S (shown), (v) a hub member 46H (shown), (vi) an axle member 46A (shown), (vii) a plate member 46P (not shown), (viii) a dished plate member 46D (not shown) and (ix) a second beam member 46SB (not shown) substantially perpendicular to said beam member 46B. The lower end region 45E of the right end structure 45R portion of the left and right end structures 45 is also visible, and as shown the right end structure 45R is part of the rotatable portion 19 of the solar module, rotatable around the axle member 46A (shown) by the heliostatic control means 18 (not visible in this partial side view, but shown and described earlier in the context of FIG. 1A).

FIG. 11B shows a partial side view of the right end structure 45R portion of the left and right end structures 45, wherein the right end structure 45R comprises a plate member 46P.

FIG. 11C shows a partial side view of the right end structure 45R portion of the left and right end structures 45, wherein the right end structure 45R comprises a dished plate member 46D.

FIG. 11D shows a partial side view of the right end structure 45R portion of the left and right end structures 45, wherein the right end structure 45R comprises a beam member 46B that is shown in a substantially vertical orientation when the solar module is operational at solar noon (e.g., an orientation similar to that shown in FIG. 1A), and further comprises a second beam member 46SB that is shown in a substantially horizontal orientation (in to and out of the page and substantially perpendicular to and integral with or attached to the beam member 46B). The second beam member 46SB is preferably designed to attach or mate with the right end member of the frame 7F (not shown) that surrounds the reflection and concentration surface 7 (not shown), at an interface that serves as structural connection means 43, which structural connection means 43 is shown in both FIG. 11D and at the corresponding location in FIG. 1A.

Figure 12:
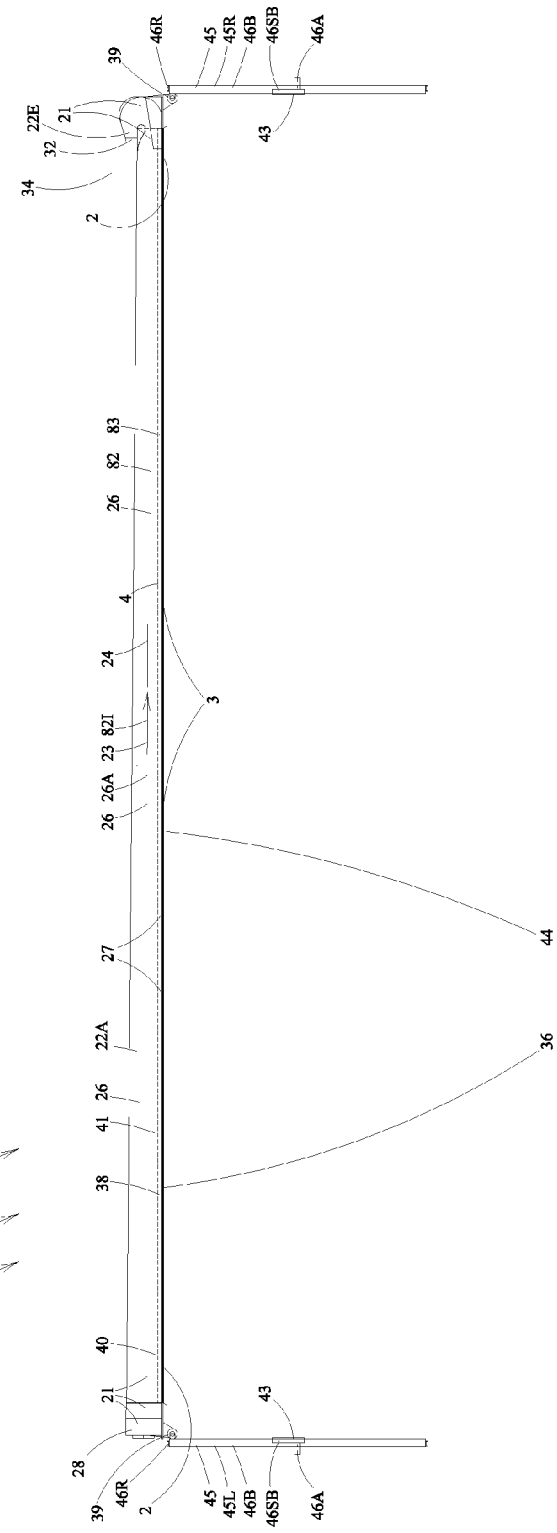
FIGS. 12 and 13 show partial side views of deployed and shipping configurations of an upper module portion of an inflatable linear heliostatic concentrating solar module that is a solar photovoltaic module.
Figure 13:
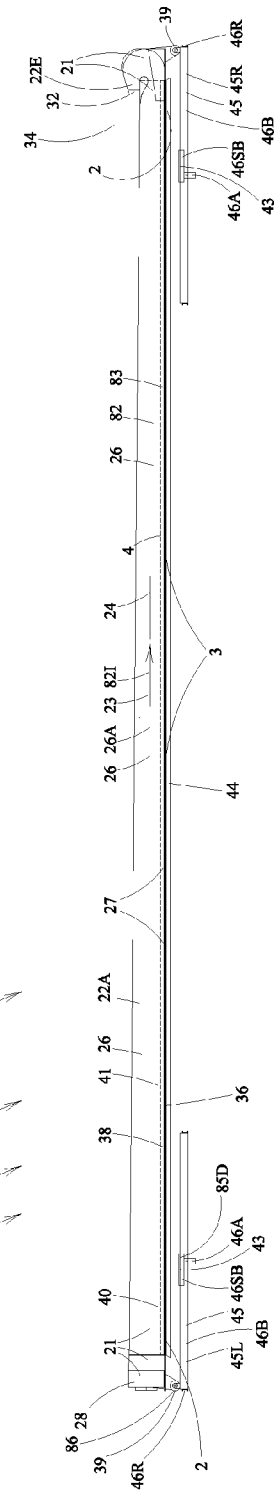

FIGS. 12 and 13 show partial side views of deployed and shipping configurations of an upper module 1U portion of an inflatable linear heliostatic concentrating solar module 1A that is a solar photovoltaic module 1.

FIG. 12 shows a partial side view of the deployed configuration of an upper module 1U portion of a modular design embodiment of an inflatable linear heliostatic concentrating solar module 1A that is a solar photovoltaic module 1. The illustrated elongated solar receiver 2A is an elongated solar photovoltaic receiver 2. The features of the upper module 1U correspond with those shown in the embodiment of FIG. 1A, without being limiting. The illustrated left end structure 45L portion and right end structure 45R portion of the left and right end structures 45, correspond with the cross beam design illustrated in FIG. 11D, with both a beam member 46B and a second beam member 46SB on each end structure. An optional substantially circular rim member 46R is shown ringing around the beam member 46B and the crosswise second beam member 46SB, for both the illustrated left end structure 45L and right end structure 45R. The left and right end structures 45 are attached to the upper beam structure 40 by hinges 39, as illustrated. Strong, load-bearing, two position lockable hinges will preferably be provided. One or both of the end rim members 46R (prefer the left end rim member when only one is used) are preferably designed to be engaged by a control drive element (not shown) such as a belt 63B or a chain 63H or a cable 63C or a toothed belt 63TB or a belt with periodic holes 63BP or a toothed cable 63TC, which serve as the actuation means for the heliostatic control means 18 (not shown in this partial side view Figure) to rotate a rotatable portion 19 of the solar module including the upper module 1U, around an axis going through the axle members 46A. The ballast beam 58B part of the upper module 1U is not shown in FIG. 12, but can be readily attached to the bottom ends of the beam members 46B, as in FIG. 1A.

FIG. 13 shows a partial side view of the same embodiment as FIG. 12, with a compact shipping configuration of the upper module 1U portion of a modular design embodiment of an inflatable linear heliostatic concentrating solar module 1A that is a solar photovoltaic module 1. The compact shipping configuration is obtained by folding the left end structure 45L and right end structure 45R inwards around the hinges 39 so that they stow compactly approximately adjacent to the upper beam structure 40, as illustrated. FIG. 13 shows compact shipping means 42 for shipping said solar photovoltaic module 1 in a reduced volume configuration in a shipping container 25 (to be shown in FIGS. 17 and 18 following), which compact shipping means 42 comprises at least one of (a) disconnectable connecting means 85D (shown, being the structural connection means 43) providing means for easy disconnection of the upper module 1U and the reflector module 1R and the lower module 1L for more compact shipping; (b) folding means 86 (shown, being the hinges 39) in at least one of the upper module 1U (shown) and the reflector module 1R and the lower module 1L for folding constituent members for more compact shipping; and (c) provision of deflation means 76M (not applicable to the upper module 1U) for deflating the substantially enclosed elongated inflatable volume 10 for more compact shipping.

The embodiment of FIGS. 12 and 13 can be constructed in many varying scales within the spirit and scope of the invention. However, as selected representative scales, a first scale would have an elongated solar photovoltaic receiver 2 that is about 20 feet long, and a second scale would have an elongated solar photovoltaic receiver that is about 40 feet long. Two modules of the first scale could fit lengthwise end to end, with compact protective packaging, within a representative standard 45 foot hi-cube intermodal freight shipping container, with representative exterior dimensions of 45' 0"×8' 0"×9' 6" and representative interior dimensions of 44' 4"×7' 8.59375"×8' 9.9375". One module of the second scale could fit lengthwise, with compact protective packaging, within that same representative standard 45 foot hi-cube intermodal freight shipping container.

Figure 14:
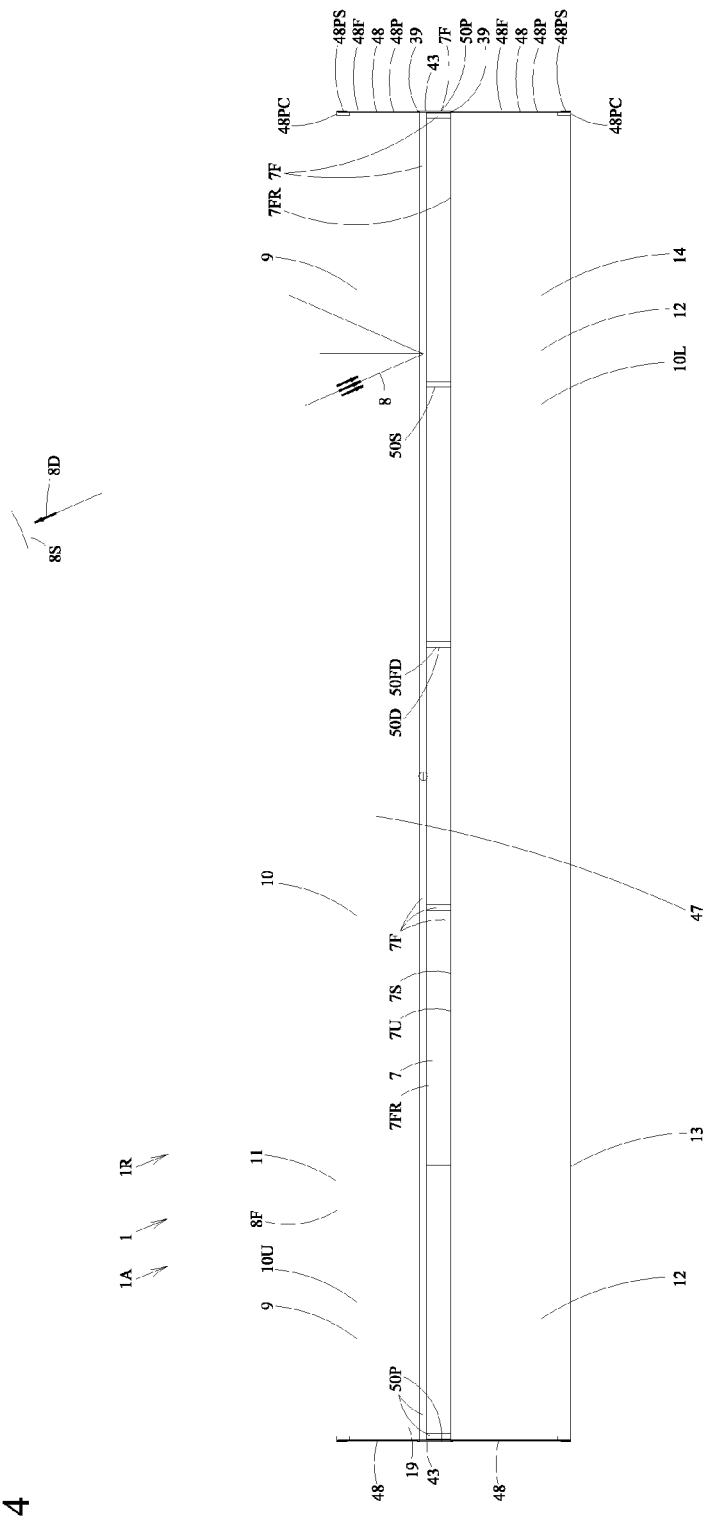
FIGS. 14 and 15 show partial side views of deployed and shipping configurations of a reflector module portion of an inflatable linear heliostatic concentrating solar module that is a solar photovoltaic module, similar to that shown and described in detail earlier in the context of FIG. 1A.
Figure 15:
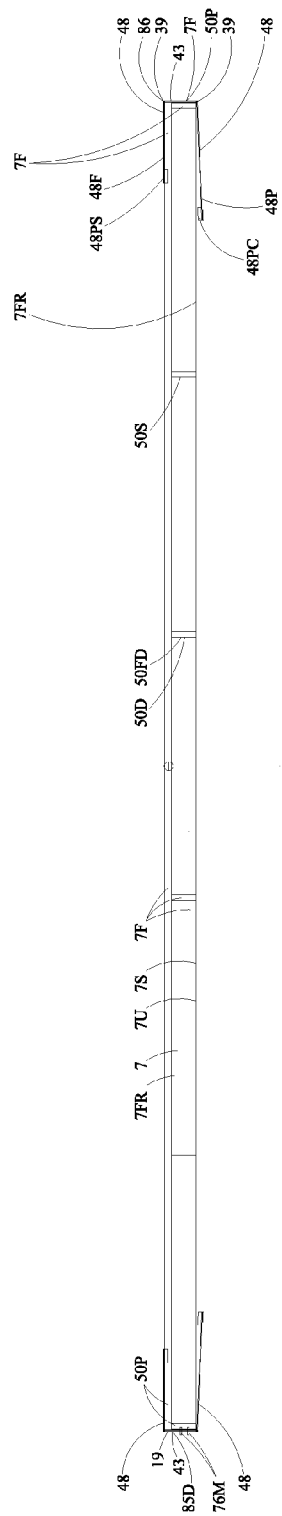

FIGS. 14 and 15 show partial side views of deployed and shipping configurations of a reflector module 1R portion of an inflatable linear heliostatic concentrating solar module 1A that is a solar photovoltaic module 1, similar to that shown and described in detail earlier in the context of FIG. 1A. The reflector module 1R shown in FIGS. 14 and 15 is attachable to the upper module 1U of FIGS. 12 and 13 at structural connection means 43 for structurally connecting, as shown in FIGS. 12 through 14.

FIG. 14 shows a partial side view of the deployed configuration of the reflector module 1R portion of an inflatable linear heliostatic concentrating solar module 1A that is a solar photovoltaic module 1. The solar photovoltaic module 1 has a reflection and concentration surface 7 includes at least one of (i) a reflective membrane 7R which is reflective on its upper side and wherein an upwardly concave desired shape 7S of said reflective membrane 7R is at least in part maintained by the application of differential inflation pressure between said upper inflatable volume 9 and said lower inflatable volume 12, (ii) a mirror element 7M which is reflective and concave on its upper side 7U, and (iii) a frame supported reflective membrane 7FR (shown) which is supported by a frame 7F and is reflective and concave on its upper side 7U, wherein said frame 7F comprises at least one of (a) perimeter structural members 50P (shown) supporting said reflection and concentration surface 7 along at least portions of the perimeter of said reflection and concentration surface 7, which perimeter structural members 50P also contribute to perimeter restraint of at least one of said substantially transparent surface 11 and said bottom surface 13; (b) shaping means 50S (shown) adjacent to said reflection and concentration surface 7 serving as shaping means for contributing to an upwardly concave desired shape 7S of said reflection and concentration surface 7; and (c) frame supported damping means 50FD (shown) adjacent to said reflection and concentration surface 7 serving as damping means 50D (shown) for damping undesirable motion of said reflection and concentration surface 7.

The reflection and concentration surface 7 is protected from the weather and from external physical or pressure induced disturbances by the elongated upper inflatable volume 9 and the elongated lower inflatable volume 12. There is a substantially transparent surface 11 above the upper inflatable volume 9, and a bottom surface 13 below the lower inflated volume 12.

The embodiment of FIG. 14 shows the solar photovoltaic module 1, wherein said elongated upper inflatable volume 9 includes an inflatable central portion 47 with an approximately constant cross-section on planar cuts perpendicular to the axis of elongation of said elongated upper inflatable volume 9, and further includes left and right end closure portions 48 on the left and right sides of said inflatable central portion 47, which left and right closure portions 48 serve to provide left and right side enclosure for said elongated upper inflatable volume 9, wherein said left and right end closure portions 48 are at least one of (a) transparent, (b) partially transparent, (c) reflective, (d) partially reflective and (e) nontransparent; and wherein said left and right end closure portions 48 comprise at least one of (i) a membrane 48M, (ii) an at least partially framed membrane 48F (shown), (iii) an at least partially rigid dome segment 48R, (iv) a plate member 48P (shown), and (v) a dished plate member 48D.

Features of the illustrated left and right closure portions 48 can be better understood with reference to the legends shown on the right closure portion that also apply equally to the left closure portion. Upward and downward projecting (transparent) plate members 48P are hingedly attached by hinges 39 to the top and bottom respectively of the right end portion of the frame 7F, that is also the right end portion of the perimeter structural members 50P. The plate members 48P are preferably centrally located on, and less than the full width of the right end portion of the perimeter structural members 50P. When the upper inflatable volume 9 and lower inflatable volume 12 are inflated, as illustrated, the four plate members 48P will be pressed outwards up to when the plate stop members 48PS butt against the beam members 46B of the upper module 1U, as shown in FIG. 12 (but not shown here in FIG. 14).

The at least partially framed membranes 48F extend from the sides of the upward projecting plate member 48P and are preferably attached (e.g., bonded and/or fastened & sealed) on their inner sides to the plate member 48P, on their upper end to a plate cap rim member 48PC that is at the top of the plate member 48P, on their outer sides to the right edges of the substantially transparent surface 11, and on their bottom sides to the right end portion of the perimeter structural members 50P. In this manner the upper right end closure portion 48 encloses the right end of the upper inflatable volume 9 and prevents pressurized air from leaking out.

Similarly, the at least partially framed membranes 48F extend from the sides of the downward projecting plate member 48P and are preferably attached (e.g., bonded and/or fastened & sealed) on their inner sides to the plate member 48P, on their lower end to a plate cap rim member 48PC that is at the bottom of the plate member 48P, on their outer sides to the right edges of the bottom surface 13, and on their top sides to the right end portion of the perimeter structural members 50P. In this manner the lower right end closure portion 48 encloses the right end of the lower inflatable volume 12 and prevents pressurized air from leaking out.

The upper and lower left end closure portions 48 similarly enclose the left ends of the upper inflatable volume 9 and lower inflatable volume 12 respectively.

It will be understood that various closure portion engineering design and construction solutions are feasible to perform similar inflatable volume end closure, within the spirit and scope of the invention as claimed.

FIG. 15 shows a partial side view of a compact shipping configuration of the embodiment of FIG. 14, being the shipping configuration of the reflector module 1R portion of an inflatable linear heliostatic concentrating solar module 1A that is a solar photovoltaic module 1. Both the upper and lower plate members 48P are rotated or folded inwards around the hinges 39, on both the right and left sides of the reflector module 1R, as illustrated. The flexible membranes of the substantially transparent surface 11 (not shown for clarity) and bottom surface 13 (not shown for clarity) are folded and packed down to within the space envelope defined by the folded plate members 48P, in a manner known from the art of compact packing of flexible membranes using appropriate membrane folding patterns and geometries. Of course the upper inflatable volume 9 and lower inflatable volume 12 are substantially deflated in the compact shipping configuration of the reflector module 1R, using means such as valve means or deflation valve means (not shown).

FIG. 15 thus shows compact shipping means 42 for shipping said solar photovoltaic module 1 in a reduced volume configuration in a shipping container 25 (to be shown in FIGS. 17 and 18 following), which compact shipping means 42 comprises at least one of (a) disconnectable connecting means 85D (shown, being the structural connection means 43) providing means for easy disconnection of the upper module 1U and the reflector module 1R and the lower module 1L for more compact shipping; (b) folding means 86 (shown, being the hinges 39) in at least one of the upper module 1U and the reflector module 1R (shown) and the lower module 1L for folding constituent members for more compact shipping; and (c) provision of deflation means 76M (shown) for deflating the substantially enclosed elongated inflatable volume 10 for more compact shipping.

FIGS. 16A and 16B show partial side views of deployed and shipping configurations of a lower module 1L of an inflatable linear heliostatic concentrating solar module 1A that is a solar photovoltaic module 1, similar to that shown and described in detail earlier in the context of FIG. 1A. The lower module 1L shown in FIG. 16A is attachable to the upper module 1U via the axle members 46A of the upper module 1U, and is attachable through the upper module 1U to the reflector module 1R at structural connection means 43 for structurally connecting, as shown in FIGS. 12 through 16A inclusive.

FIG. 16A shows a partial side view of the deployed configuration of a lower module 1L of an inflatable linear heliostatic concentrating solar module 1A that is a solar photovoltaic module 1, similar to that shown and described in detail earlier in the context of FIG. 1A. The frame tilting structure 74 and belt 63B from FIG. 1A are not shown in the lower module 1L, but can be readily attached when the solar photovoltaic module 1 is assembled by assembling together the lower module 1L, the upper module 1U (with ballast beam 58B) and the reflector module 1R along with the aforementioned frame tilting structure 74 and belt 63B, in a manner similar to the embodiment shown and described in detail with reference to FIG. 1A.

FIG. 16B shows a partial side view of the compact shipping configuration of the lower module 1L of FIG. 16A, with the upper "A frame" type tubular frame elements 73TU folded inward and down around hinges 39, as shown.

FIG. 16B thus shows compact shipping means 42 for shipping said solar photovoltaic module 1 in a reduced volume configuration in a shipping container 25 (to be shown in FIGS. 17 and 18 following), which compact shipping means 42 comprises at least one of (a) disconnectable connecting means 85D (bearings 53B) providing means for easy disconnection of the upper module 1U and the reflector module 1R and the lower module 1L (shown) for more compact shipping; (b) folding means 86 (shown, being the hinges 39) in at least one of the upper module 1U and the reflector module 1R and the lower module 1L (shown) for folding constituent members for more compact shipping; and (c) provision of deflation means 76M (not applicable for lower module 1L) for deflating the substantially enclosed elongated inflatable volume 10 for more compact shipping.

Figure 17:
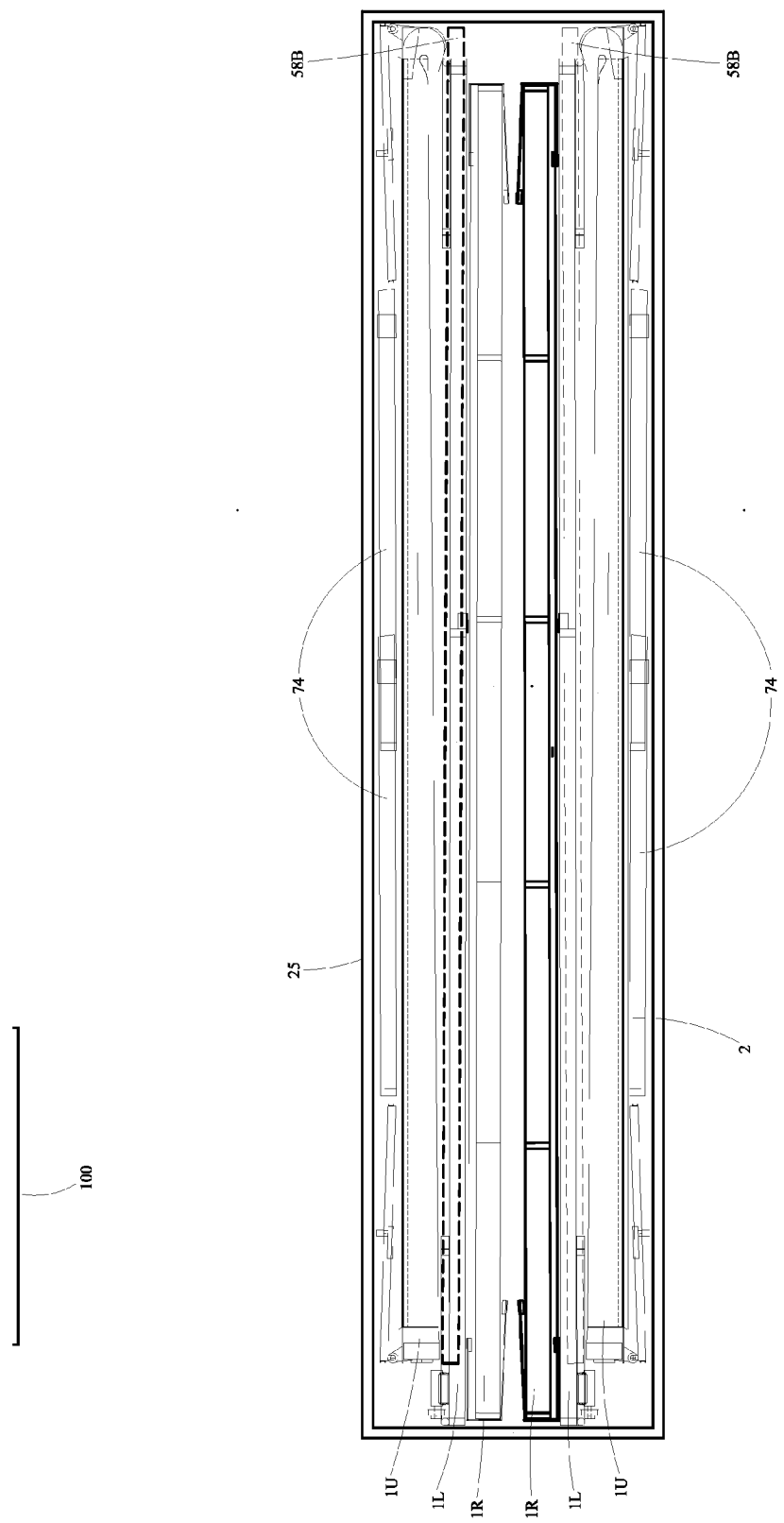
FIG. 17 and FIG. 18 show side sectional views of 40 foot and 20 foot representative scale solar modules, disassembled and packed into a representative shipping container.
Figure 18:
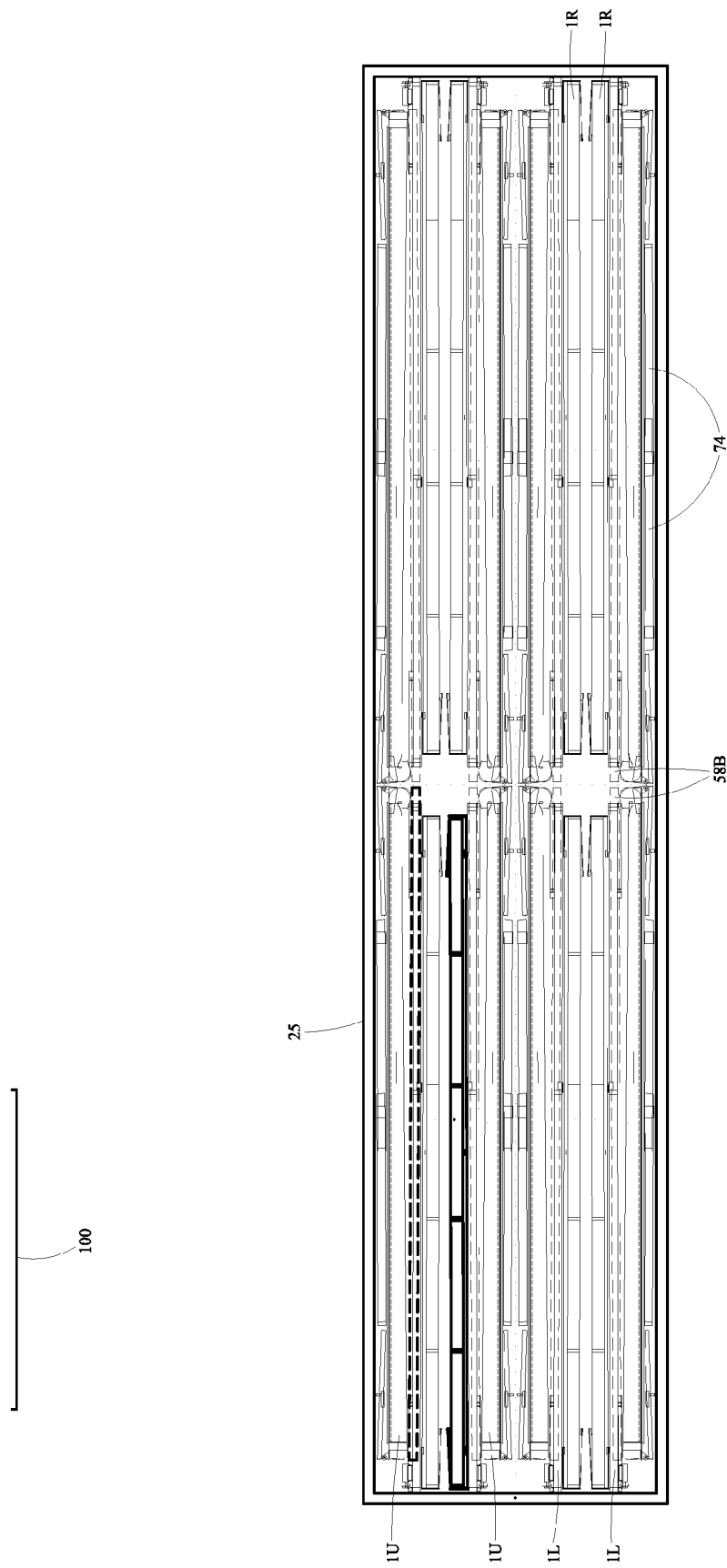

FIG. 17 and FIG. 18 show side sectional views of 40 foot and 20 foot representative scale solar modules, disassembled and packed into a representative shipping container.

FIG. 17 shows a side sectional view of a representative standard 45 foot hi-cube intermodal freight shipping container 25, with representative exterior dimensions of 45' 0"×8' 0"×9' 6" and representative interior dimensions of 44' 4"×7' 8.59375"×8' 9.9375". In this side sectional view the interior length is 44' 4" and the interior height is 8' 9.9375". For representative but not limiting scale, a 10 foot ruler segment 100 is also shown. Two disassembled solar modules with 40 foot long solar receivers (e.g., elongated solar photovoltaic receivers 2) are shown packed into the 45 foot hi-cube intermodal freight shipping container. Without limitation, a representative solar photovoltaic module with a 40 ft long solar receiver, about 10 inches wide with dual row solar cells, and about 25 square meters of reflective area, would produce about 4 kilowatts of power with 16% efficient solar cells (and more power with more efficient concentrating solar cells that work at around 8 suns concentration). FIG. 17 shows packed within the standard 45 foot hi-cube intermodal freight shipping container 25, the following items:

2 upper modules 1U including elongated solar photovoltaic receivers 2;

2 reflector modules 1R;

2 lower modules 1L;

2 frame tilting structures 74, each split in halves for shipping; and 2 ballast beams (shown in dashed lines behind the lower modules 1L in this view).

Other miscellaneous items for the 2 disassembled solar modules, such as 2 belt 63B for the heliostatic control drive train, for example, can be suitably packed into available remaining volume in the shipping container 25.

FIG. 18 shows a side sectional view of a representative standard 45 foot hi-cube intermodal freight shipping container 25, with representative exterior dimensions of 45' 0"×8' 0"×9' 6" and representative interior dimensions of 44' 4"×7' 8.59375"×8' 9.9375". In this side sectional view the interior length is 44' 4" and the interior height is 8' 9.9375". For representative but not limiting scale, a 10 foot ruler segment 100 is also shown. Sixteen disassembled solar modules with 20 foot long solar receivers (e.g., elongated solar photovoltaic receivers 2) are shown packed into the 45 foot hi-cube intermodal freight shipping container, with eight visible in the view and another eight behind these. Without limitation, a representative solar photovoltaic module with a 20 ft long solar receiver, about 5 inches wide with a single row of solar cells, and about 6.25 square meters of reflective area, would produce about 1 kilowatt of power with 16% efficient solar cells (and more power with more efficient concentrating solar cells that work at around 8 suns concentration). FIG. 18 shows packed within the standard 45 foot hi-cube intermodal freight shipping container 25, the following item totals (including hidden back items):

16 upper modules 1U including elongated solar photovoltaic receivers 2;

16 reflector modules 1R;

16 lower modules 1L;

16 frame tilting structures 74 (not necessary to split in half at this scale); and 16 ballast beams (shown in dashed lines behind each of the lower modules 1L).

Other miscellaneous items for the 16 disassembled solar modules, such as 16 belt 63B for the heliostatic control drive train, for example, can be suitably packed into available remaining volume in the shipping container 25.

It should be understood that while FIGS. 17 and 18 show some specific compact shipping configurations for submodules of modular solar modules to be cost-effectively shipped in one specific high cube standard intermodal shipping container, many variant device sizes, modular disassembly involving folding elements and at least some deflation of inflatable members, and geometrically preferred or optimized packaging means in containers of varying sizes and shapes, are also possible within the spirit and scope of the invention.

FIGS. 12 through 18 collectively therefore shows solar photovoltaic modules 1, wherein each said solar photovoltaic module 1 comprises plural connected constituent modules 1C comprising:

(i) an upper module 1U including an elongated solar photovoltaic receiver 2, (ii) a reflector module 1R including the reflection and concentration surface 7 and the substantially transparent surface 11 above said upper inflatable volume 10U and the bottom surface 13 below said lower volume 14, and (iii) a lower module 1L including said support structure 15; and further comprising compact shipping means 42 for shipping said solar photovoltaic module 1 in a reduced volume configuration in a shipping container 25, which compact shipping means 42 comprises at least one of (a) disconnectable connecting means 85D providing means for easy disconnection of the upper module 1U and the reflector module 1R and the lower module 1L for more compact shipping; (b) folding means 86 in at least one of the upper module 1U and the reflector module 1R and the lower module 1L for folding constituent members for more compact shipping; and (c) provision of deflation means 76M for deflating the substantially enclosed elongated inflatable volume 10 for more compact shipping.

Figure 19:
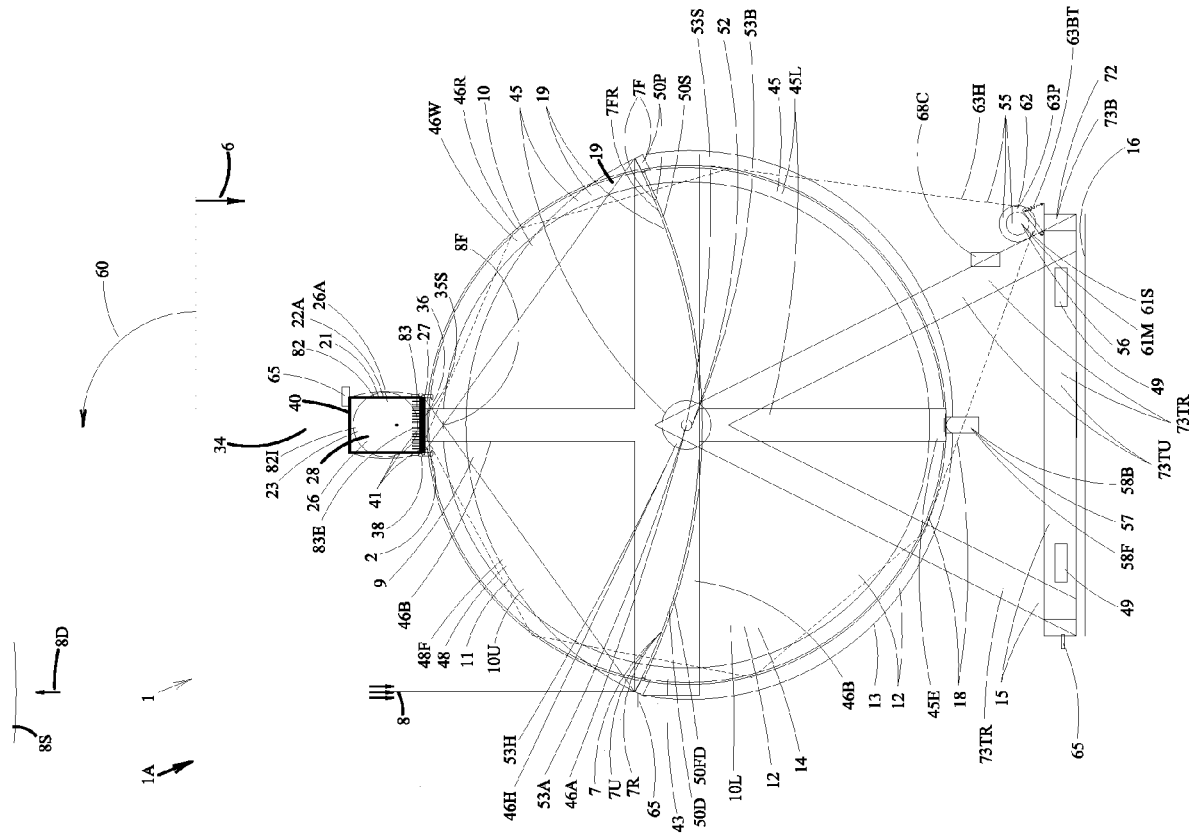
FIG. 19 shows a partial end view of an embodiment similar to the embodiment of FIG. 1B.

FIG. 19 shows a partial end view of an embodiment similar to the embodiment of FIG. 1B (and FIG. 1A) from the left end, at approximately the scale of FIG. 1B.

The illustrated left end structure 45L portion of the left and right end structures 45 shown in FIG. 19, is similar to the right end structure 45R portion of the left and right end structures 45 shown in FIG. 11D. A beam member 46B is shown in a substantially vertical orientation when the solar module is operational at solar noon (e.g., an orientation similar to that shown in FIGS. 1A and 1B), and further comprises a second beam member 46SB that is shown in a substantially horizontal orientation (substantially perpendicular to and integral with or attached to the beam member 46B). The second beam member 46SB is preferably designed to attach or mate with the left end member of the frame 7F that surrounds the reflection and concentration surface 7, at an interface that serves as structural connection means 43. The use of crossed beams for the end structures 45 is similar to the embodiment illustrated in FIG. 11D.

The embodiment of FIG. 19 shows a motor 61M that is a stepper motor 61S, that drives a chain 63H as actuation means for the heliostatic control means 18 to actuate rotation of the rotatable portion 19 of said solar photovoltaic module 1 to a commanded desired orientation. The embodiment of FIG. 19 also shows sensors 65, which is at least one of sensors from the set of a Sun angle sensor, a light sensor, a temperature sensor, a wind sensor, an adverse weather sensor, an adverse condition sensor, a precipitation sensor, a time sensor, a power sensor, an energy sensor, a voltage sensor, a current sensor, a maintenance sensor, a failure sensor, a diagnostic sensor, a fluid flow sensor, a position sensor, an angle sensor, and a digital or count sensor. The embodiment of FIG. 19 also shows a computer 68C which may comprise a microprocessor, digital computer, calculator or analog computer. The computer 68C serves as at least one of (i) user input computer means for receiving and executing a user input instruction, (ii) sensor input computer means for receiving and processing an input signal from a sensor 65, (iii) aiming computer means for algorithmically computing and commanding desired orientation of said rotatable portion 19 of said solar photovoltaic module 1, (iv) stow computer means for computing and commanding a protective stow position of said rotatable portion 19 of said solar photovoltaic module 1, and (v) diagnostic computer means for identifying at least one of nonoptimal operation, faulty operation and a failure condition of said solar photovoltaic module 1.

FIG. 19 also illustrates lift element engagement means 49 (such as the illustrated hole in structure or other means known in the art) for engaging an element of a lift such as a forklift, a high lift, a crane, a jack, or other lift device, mechanism or machine for lifting all or part of the solar module 1A, for installation, relocation, adjustment, maintenance or repair, for example. This feature will be particularly useful for installation of solar modules 1A on the roof of a house or building.

Figure 20:
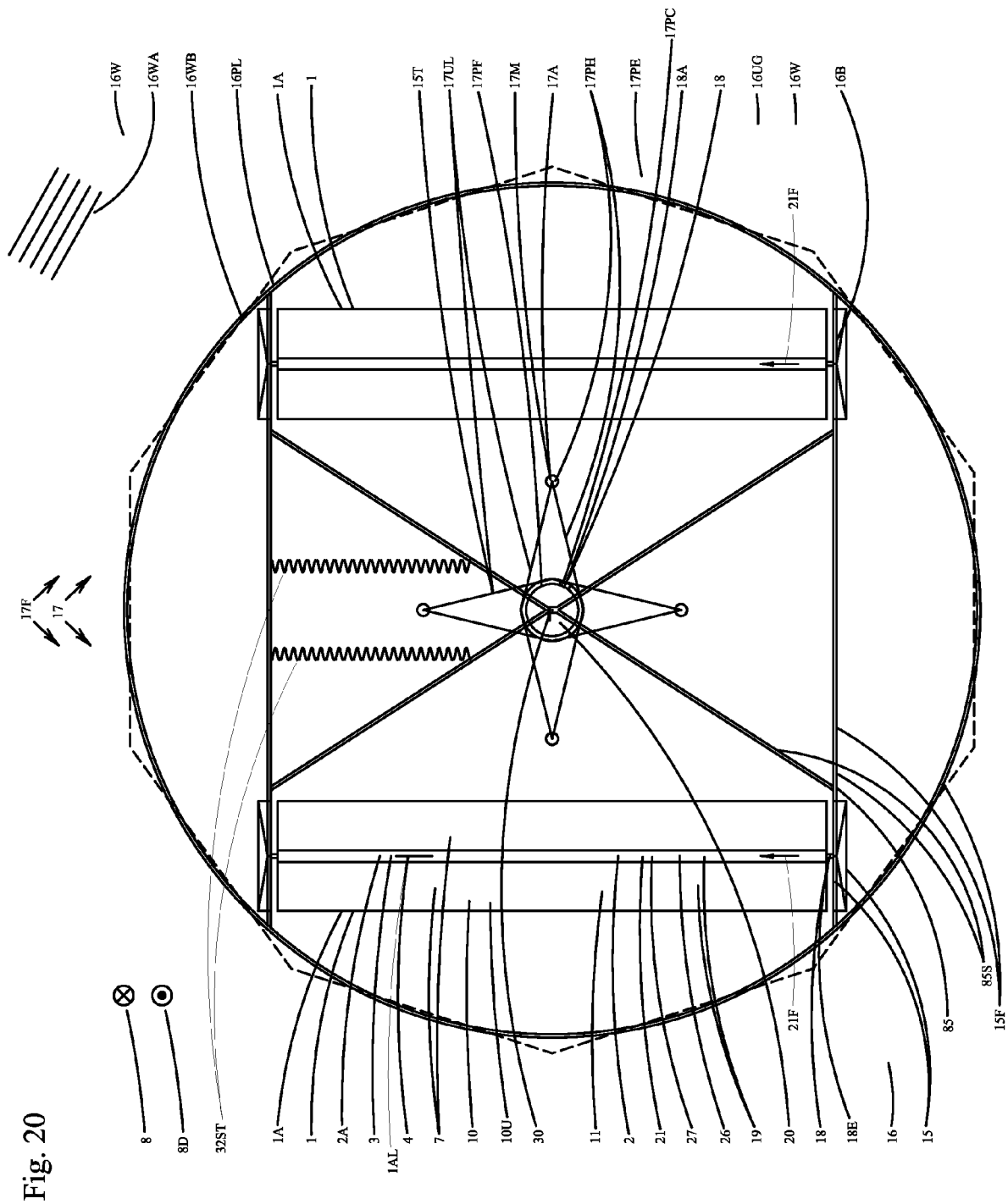
FIG. 20 shows a plan view of a floating embodiment with a connected array of plural inflatable linear heliostatic concentrating solar modules, with two axis heliostatic tracking.

FIG. 20 shows a plan view of a floating embodiment with a connected array 17 of plural inflatable linear heliostatic concentrating solar modules 1A.

More specifically, FIG. 20 illustrates a connected array 17 of plural inflatable linear heliostatic concentrating solar modules 1A including at least one inflatable linear cooled heliostatic concentrating solar photovoltaic module 1, wherein:

each said solar module 1A comprises an elongated solar receiver 2A including a portion of substantially linear geometry 3 with a linear axis 4;

each said solar module 1A comprises a reflection and concentration surface 7 for reflecting and concentrating sunrays 8;

each said solar module 1A comprises a substantially enclosed elongated inflatable volume 10 comprising (i) an upper inflatable volume 10U above said reflection and concentrating surface 7, with a substantially transparent surface 11 above said upper inflatable volume 10U, and further comprising (ii) a lower volume 14 (hidden and not visible in this view) below said reflection and concentrating surface 7, with a bottom surface 13 (hidden and not visible in this view) below said lower volume 14;

each said solar photovoltaic module 1 includes cooling means 21 for removing excess heat 27 from its elongated solar receiver 2A comprising an elongated solar photovoltaic receiver 2, said cooling means 21 including a heated cooling fluid 26 that is heated by heat 27 from said elongated photovoltaic receiver 2;

further comprising connecting means 85 for connecting said plural inflatable linear heliostatic concentrating solar modules 1A comprising at least one of (i) structural connecting means 85S (shown) for structurally connecting a first solar photovoltaic module 1F to a second solar module 1S and (ii) heated fluid connecting means 85F (not shown and not present in this embodiment) for conveying heat energy in heated cooling fluid 26 outflow from a first solar photovoltaic module 1F to a heated fluid stream 26S inflow into a higher temperature non-photovoltaic solar module comprising a solar thermal module 1T wherein the heated fluid stream 26S is further heated by concentrated radiation energy received from the reflection and concentration surface 7 for reflecting and concentrating sunrays 8 in the solar thermal module 1T;

further comprising support structure 15 for supporting said plural inflatable linear heliostatic concentrating solar modules 1A on a supporting surface 16;

further comprising heliostatic control means 18 for aiming at least one rotatable portion 19 of said connected array 17 of plural inflatable linear heliostatic concentrating solar modules 1A, as a function of at least one of time and other parameters, such that incoming sunrays 8 from a sunward direction 8D will be reflected and concentrated by said reflection and concentration surfaces 7, onto said elongated solar receivers 2A at a concentration ratio of at least two suns; and further comprising electrical power means 20 for collecting and transmitting electrical power from said elongated solar photovoltaic receiver 2.

Floating support structure 15F is shown, which serves both a structures purpose and a buoyancy purpose. An example of floating support structure 15F entails the use of sealed hollow structural members such as pipe section material. The cooling means 21 for removing excess heat 27 can optionally use air cooling means or liquid cooling means, as described in detail with reference to earlier described embodiments of the invention. Air cooling means can use fan powered cooling air flow in a air cooling pipe 22A (not shown). Liquid cooling means (shown) can use a pump 30 to pump cooling liquid in cooling fluid flow direction 21F in tubes and/or chambers adjacent to the elongated solar photovoltaic receivers 2 so as to keep the solar cells therein at low risk of heat damage and high photovoltaic conversion efficiency. A closed loop liquid cooling system is shown, wherein a pump 30 pumps cooling liquid through the cooling means 21, and then return flow of heated cooling fluid runs through underwater spiral tube heat transfer means 32ST where heat is dumped into the water under the water surface 16W.

FIG. 20 also illustrates a connected array 17 of plural inflatable linear heliostatic concentrating solar modules 1A of claim 3, wherein said supporting surface 16 comprises a water surface 16W above an underwater ground surface 16UG, wherein said connected array 17 of plural inflatable linear heliostatic concentrating solar modules 1A comprises a floating connected array 17F supported at least in part by a buoyancy force 16B;

wherein said heliostatic control means 18 comprises at least one of (i) (not shown) azimuth heliostatic control means 18A for rotating said floating connected array 17F on said water surface 16W to substantially follow the azimuth angle 8A (not visible in this view with vertical downward sunrays 8 illustrated, corresponding to a solar noon azimuth) of the incoming sunrays 8 over a period of solar time with the linear axis 1AL of each said solar module 1A aligned substantially parallel with said azimuth angle 8A of the incoming sunrays; and (ii) (shown) a combination of (a) azimuth heliostatic control means 18A for rotating said floating connected array 17F on said water surface 16W to substantially follow the azimuth angle 8A (not visible in this view with vertical downward sunrays 8 illustrated, corresponding to a solar noon azimuth) of the incoming sunrays 8 over a period of solar time with the linear axis 1AL of each said solar module 1A aligned substantially perpendicular to said azimuth angle 8A of the incoming sunrays, and (b) elevation heliostatic control means 18E (not visible in this view with vertical downward sunrays 8 illustrated, corresponding to a 90 degree elevation angle) for controlling the elevation orientation of rotatable portions 19 of said plural inflatable linear heliostatic concentrating solar modules 1A including said reflection and concentration surfaces 7 and said solar receivers 2A, to substantially follow the elevation angle 8E of the incoming sunrays 8 over a period of solar time.

Thus the embodiment of FIG. 20 has two axis heliostatic tracking of the Sun's apparent motion in azimuth and elevation, resulting in maximum solar power harvest.

The embodiment of FIG. 20 can be built at any arbitrary size scale. Some examples include solar modules 1A with elongated solar receivers 2A that are about 21 feet long, so two disassembled solar modules 1A can fit end on end in a 45 foot long high cube container; solar modules 1A with elongated solar receivers 2A that are about 42 feet long, so one disassembled solar module 1A can fit lengthwise in a 45 foot long high cube container, and other scales from small to gigantic.

FIG. 20 also illustrates a connected array 17 of plural inflatable linear heliostatic concentrating solar modules 1A of claim 22, wherein said floating connected array 17F can be held in a desired position envelope 17PE by position holding means 17PH for holding said floating connected array 17F in said desired position envelope 17PE, which position holding means 17PH includes anchor means 17A for anchoring members 17M in said underwater ground surface 16UG, and underwater link means 17UL comprising at least one of underwater tethers 15T, cables, rods, posts, beams, trusses and plates for linking the underwater anchor means to at least one positioning float 17F; and wherein said azimuth heliostatic control means 18A includes powered control means 17PC for azimuthally rotating said floating connected array 17F relative to at least one positioning float 17F.

Note that the illustrated embodiment has a single central positioning float 17F, while variant embodiments may have plural positioning floats 17F around the periphery of the connected array 17, such as connected to the illustrated wave breaking means 16WB. Note also that the underwater link means 17UL such as the underwater tethers 15T can also be beneficially used to tow the floating solar module to an installation site (e.g., being pulled by a tugboat of some sort), where it is subsequently tethered.

FIG. 20 also illustrates a connected array 17 of plural inflatable linear heliostatic concentrating solar modules 1A of claim 22, further comprising wave breaking means 16WB located at least in part along a perimeter location 16PL on the periphery around said floating connected array 17F, which wave breaking means 16WB serves as means for at least one of blocking and reducing the magnitude of incoming waves 16WA on the water surface 16W that approach said floating connected array 17F from outside the vicinity of said floating connected array 17F.

Note that a variety of wave breaking means 16WB may be used, including rigid or semirigid walls, perforated or mesh walls, inflated ring or tube or sphere elements, shaped hulls, flow deflection vanes or foils, etc.

Figure 21:
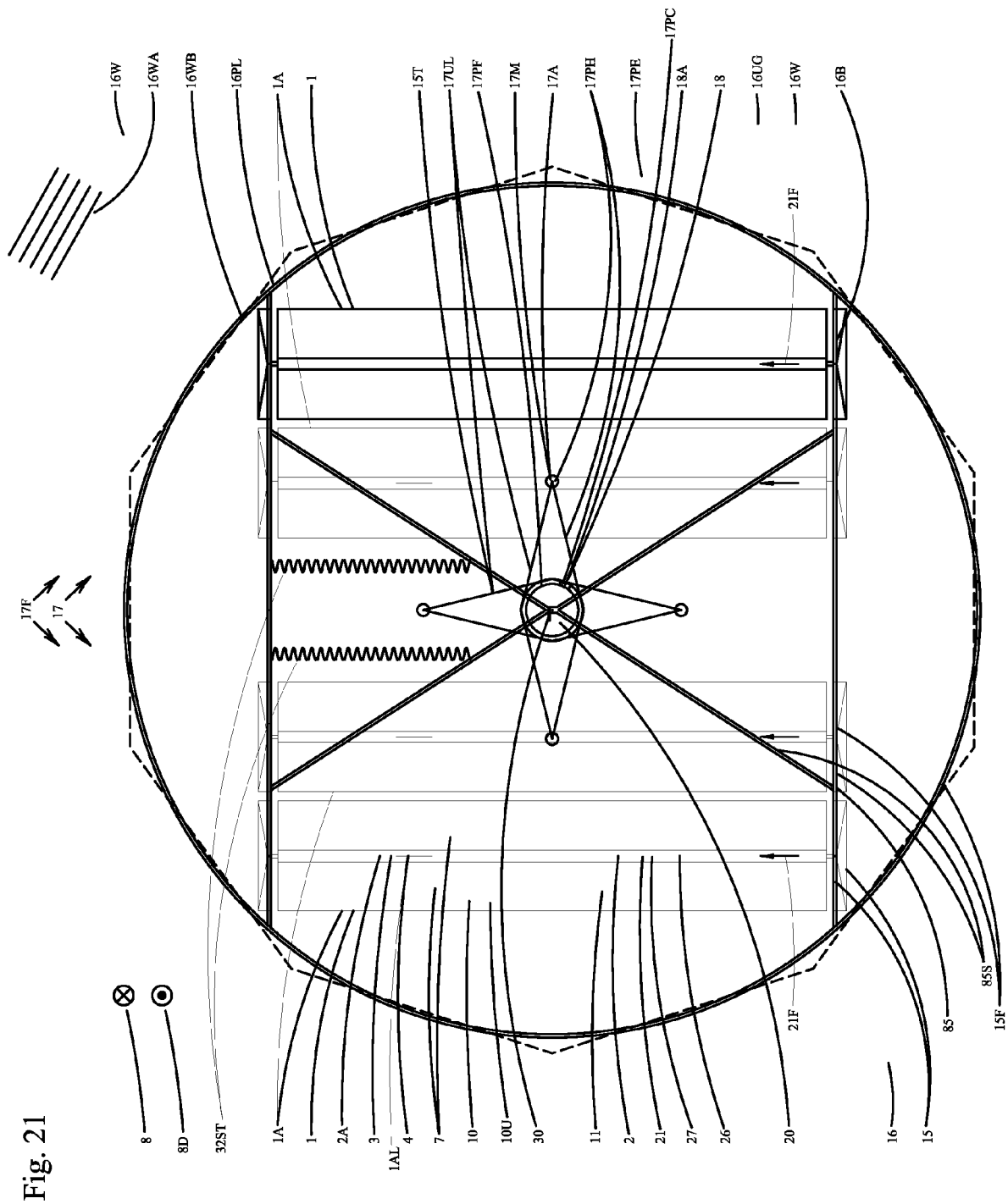
FIG. 21 shows a plan view of a floating embodiment with a connected array of plural inflatable linear heliostatic concentrating solar modules, with one axis heliostatic tracking.

FIG. 21 shows a plan view of a floating embodiment with a connected array 17 of plural inflatable linear heliostatic concentrating solar modules 1A, similar to FIG. 20 but with one axis heliostatic tracking. The only heliostatic tracking provided is azimuth tracking, with azimuth heliostatic control means 18A for rotating said floating connected array 17F on said water surface 16W to substantially follow the azimuth angle 8A (not visible in this view with vertical downward sunrays 8 illustrated, corresponding to a solar noon azimuth) of the incoming sunrays 8 over a period of solar time with the linear axis 1AL of each said solar module 1A aligned substantially parallel (NOT perpendicular as for the embodiment of FIG. 20) with said azimuth angle 8A of the incoming sunrays.

Note that in FIG. 21 no elevation heliostatic control means 18E exist to substantially follow the elevation angle 8E of the incoming sunrays 8 over a period of solar time; and there are no rotatable portions 19 of the solar module 1A that rotate in elevation angle. Since the azimuth control aligns parallel rather than perpendicular to the linear axis 1AL of each said solar module 1A, it is possible for the embodiment of FIG. 21 to have solar modules located close to each other without shadowing losses, and this enables the connected array 17 of the embodiment of FIG. 21 to have 4 rather than 2 solar modules 1A, as illustrated.

FIG. 21 thus illustrates a connected array 17 of plural inflatable linear heliostatic concentrating solar modules 1A of claim 3, wherein said supporting surface 16 comprises a water surface 16W above an underwater ground surface 16UG, wherein said connected array 17 of plural inflatable linear heliostatic concentrating solar modules 1A comprises a floating connected array 17F supported at least in part by a buoyancy force 16B;

wherein said heliostatic control means 18 comprises at least one of (i) (shown) azimuth heliostatic control means 18A for rotating said floating connected array 17F on said water surface 16W to substantially follow the azimuth angle 8A (not visible in this view with vertical downward sunrays 8 illustrated, corresponding to a solar noon azimuth) of the incoming sunrays 8 over a period of solar time with the linear axis 1AL of each said solar module 1A aligned substantially parallel with said azimuth angle 8A of the incoming sunrays; and (ii) (not shown) a combination of (a) azimuth heliostatic control means 18A for rotating said floating connected array 17F on said water surface 16W to substantially follow the azimuth angle 8A (not visible in this view with vertical downward sunrays 8 illustrated, corresponding to a solar noon azimuth) of the incoming sunrays 8 over a period of solar time with the linear axis 1AL of each said solar module 1A aligned substantially perpendicular to said azimuth angle 8A of the incoming sunrays, and (b) elevation heliostatic control means 18E (not visible in this view with vertical downward sunrays 8 illustrated, corresponding to a 90 degree elevation angle) for controlling the elevation orientation of rotatable portions 19 of said plural inflatable linear heliostatic concentrating solar modules 1A including said reflection and concentration surfaces 7 and said solar receivers 2A, to substantially follow the elevation angle 8E of the incoming sunrays 8 over a period of solar time.

Figure 22A:
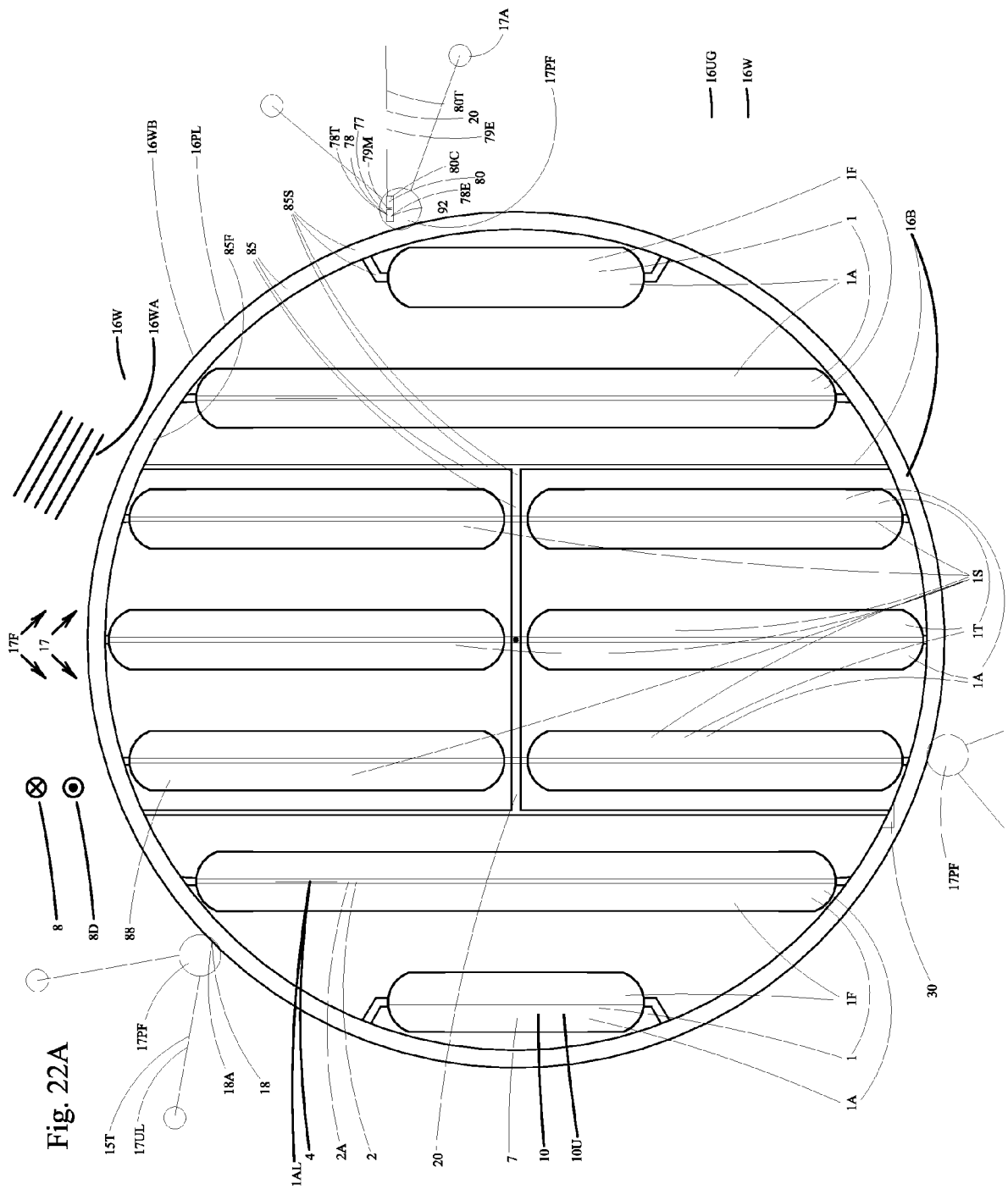

FIG. 22A shows a plan view of a floating embodiment with some of the features of the embodiment of FIG. 20, but with a combination of solar modules 1A, similar to the embodiment of FIG. 6A. Reference numerals for features shown in FIG. 22A correspond to the same reference numerals as described in detail with respect to FIGS. 20 and 6A preceding. FIG. 22A shows two types of solar modules 1A in sequence, where the modules on the left and right of the Figure are solar photovoltaic modules 1 that are first solar photovoltaic modules 1F; while the modules in the center of the Figure are solar thermal modules 1T that are second solar modules 1S. The relationship and functioning of the different solar modules 1A in sequence are similar to the case described in detail with regard to FIG. 6A. A total of 10 solar modules 1A are shown in this floating embodiment, with two-axis heliostatic tracking similar to the embodiment of FIG. 20.

FIG. 22B shows a plan view of a floating embodiment with similar features to that of FIG. 22A, but with a combination of solar modules 1A, similar to the embodiment of FIG. 6B. Reference numerals for features shown in FIG. 22B correspond to the same reference numerals as described in detail with respect to FIGS. 20 and 6B preceding. FIG. 22B shows three types of solar modules 1A in sequence, where the first in sequence are solar photovoltaic modules 1 that are first solar photovoltaic modules 1F (2 rightmost modules and 2 leftmost modules in the view shown); while the second in sequence modules comprise second solar modules 15 that are solar thermal modules 1T combined with a higher temperature solar photovoltaic modules 1H with higher temperature elongated solar photovoltaic receivers 2H (4 modules that are 3rd from right and 3rd from left in the view shown); and the last in sequence in the string of connected modules comprising downstream solar modules 1D (2 center modules, or 4th from either left or right in the view shown) that in this case are also solar thermal modules 1T that are intended to operate at a still higher solar receiver temperature than the second solar modules 1S. Note that the higher temperature solar photovoltaic modules 1H in FIG. 22B include higher temperature solar photovoltaic receivers 99.

FIG. 22B also shows a tethered barge 17TB attached to or integral with a positioning float 17PF, which tethered barge 17TB also carries the thermodynamic cycle engine 78E and other members described in detail earlier in the context of FIG. 6B. Note that alternate locations for all modules and members at various locations in the floating connected array 17F, are also of course possible within the spirit and scope of the invention as claimed.

Figure 22C:
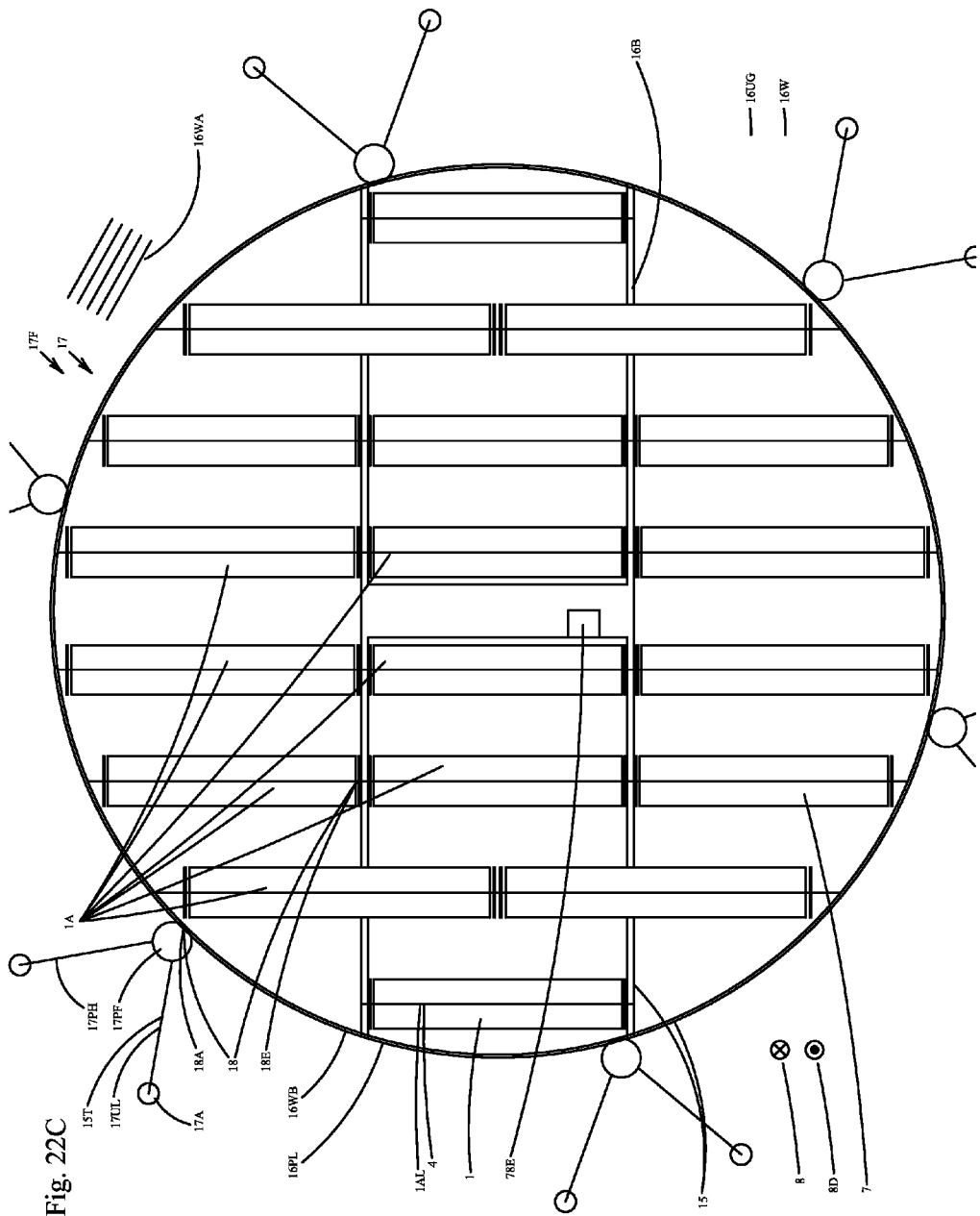

FIG. 22C shows a plan view of an embodiment of a floating connected array 17F similar in many aspects to the embodiments of FIGS. 22A and 22B, but with more inflatable linear heliostatic concentrating solar modules 1A, numbering 18. Some features illustrated in this embodiment include use of different length solar modules 1A to more effectively utilize the available plan view area for solar collection; a central platform location for a thermodynamic cycle engine 78E; the use of six positioning floats 17PF for more precise and fault-tolerant position holding of the floating connected array 17F in the presence of water currents and wind; and the optional use of heliostatic control means 18 wherein the linear axis 1AL of the solar modules 1A aligns with the solar azimuth angle for very low Sun elevation angles at times close to sunrise and sunset, to minimize shadowing losses, while the linear axis 1AL of the solar modules 1A is rotated to align perpendicular to the solar azimuth angle for most of the day, where shadowing losses are small or nonexistent, and two axis tracking using both azimuth heliostatic control means 18A and elevation heliostatic control means 18E effectively places the plane of each reflection and concentration surface 7 perpendicular or normal to the incident sunrays 8.

Figure 22D:
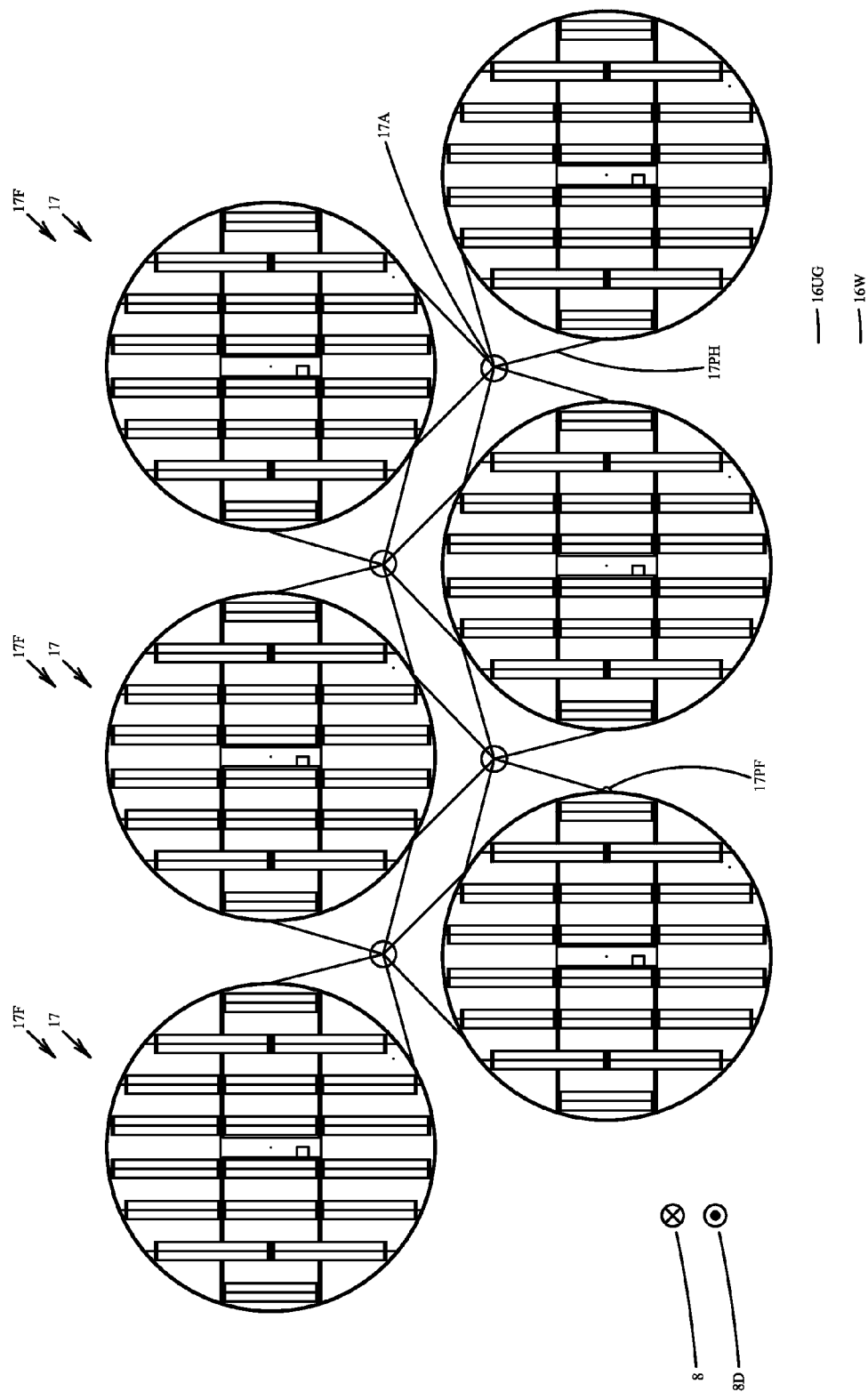

FIG. 22D shows multiple floating connected arrays 17F of the type shown in FIG. 22C, arranged in a pattern on the water surface 16W above the underwater ground surface 16UG, that includes a triangular pattern as shown. It will be understood that with shared anchor means 17A connected by position holding means 17PH (such as underwater tethers) to multiple proximal floating connected arrays 17F, alternate geometric arrangements such as space filling triangular, space filling square, space filling rectangular, space filling hexagonal, and other space filling or non space filling two dimensional geometric arrangements, are possible within the spirit and scope of the invention.

Figure 22E:
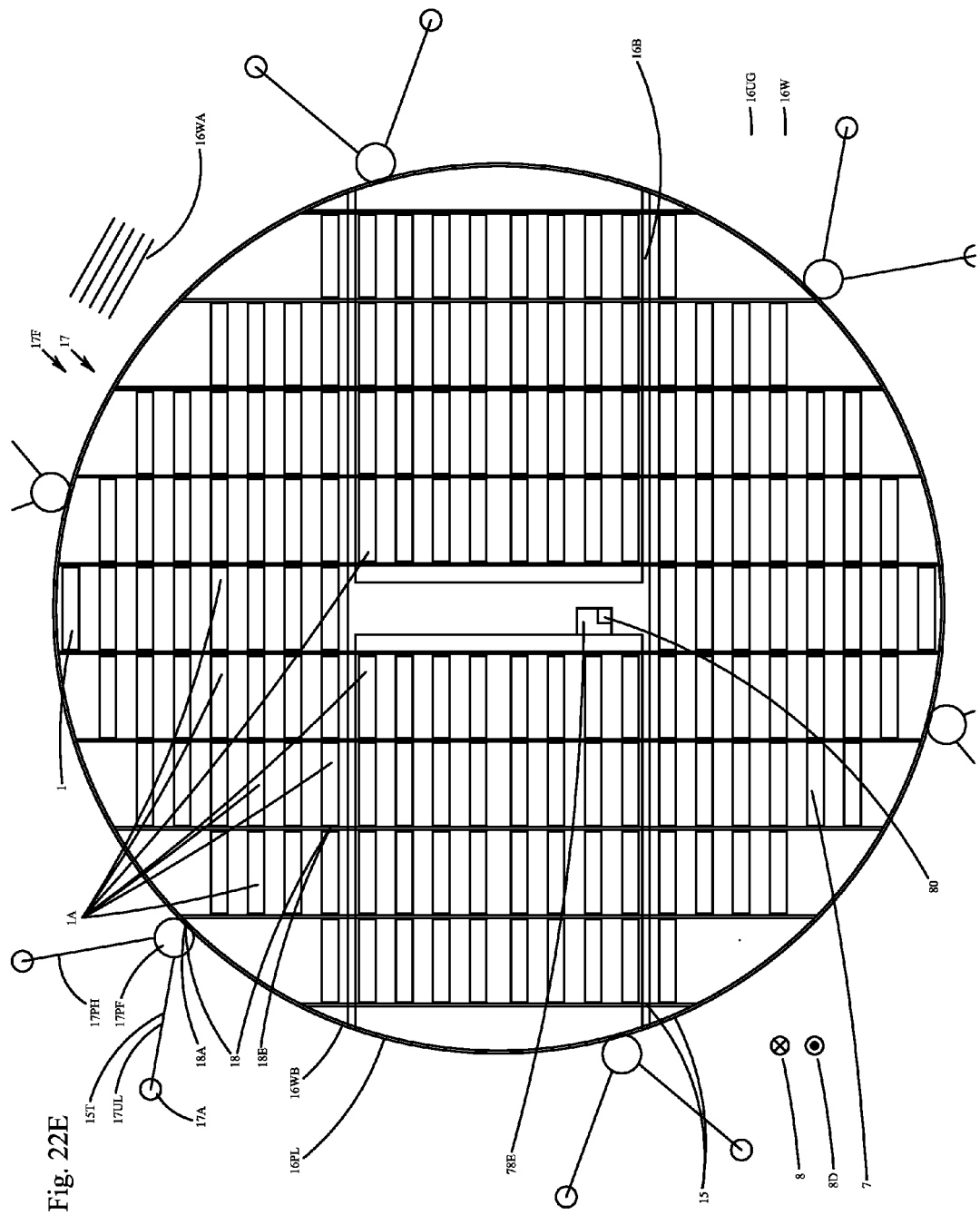

FIG. 22E shows a plan view of an embodiment of a floating connected array 17F similar in many aspects to the embodiments of FIGS. 22A, 22B and 22C, but with more inflatable linear heliostatic concentrating solar modules 1A, numbering 152 but number not limiting. The scale of this embodiment will typically but not necessarily be larger than the scale of the embodiments of FIGS. 22A, 22B and 22C. Representative diameters of the floating connected array 17F may range from 20 meters to 20,000 meters, without limitation.

Figure 22F:
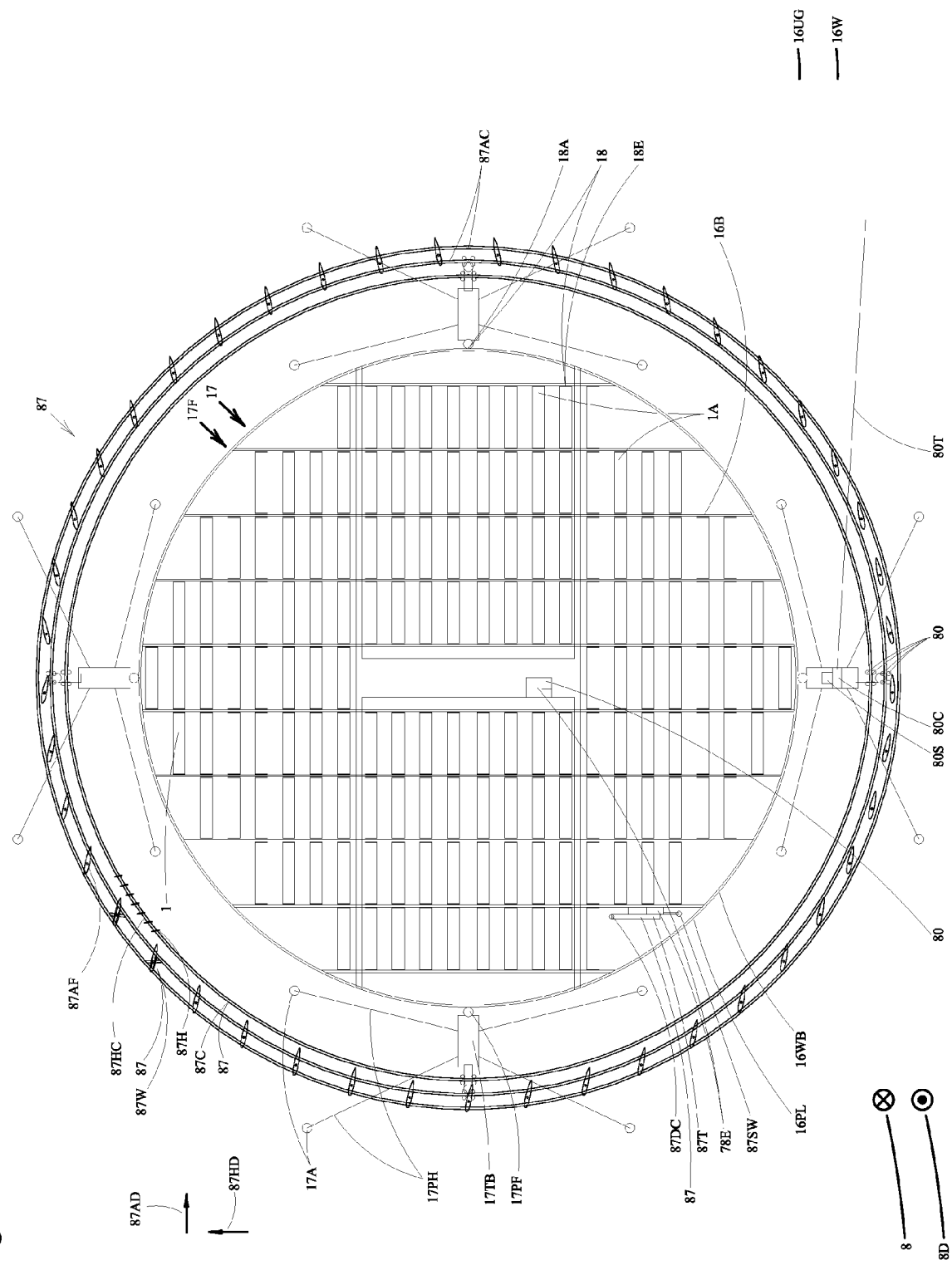

FIG. 22F shows a plan view of the embodiment of a connected array 17 of plural inflatable linear heliostatic concentrating solar modules 1A illustrated in FIG. 22E, but now further comprising offshore wind and water current renewable energy harvesting subsystems substantially surrounding and connected to the connected array 17 that is a floating connected array 17F. The illustrated wind and water current renewable energy harvesting subsystems are of a class previously described in U.S. patent application Ser. No. 11/986,240 entitled "Fluid-Dynamic Renewable Energy Harvesting System."

FIG. 22F shows the connected array 17 that is a floating connected array 17F, held in place by perimeter positioning floats 17PF connected to tethered barges 17TB, that are held in place relative to the underwater ground surface 16UG by position holding means 17PH such as underwater tethers that are anchored in the underwater ground surface 16UG by anchor means 17A. Features described earlier in the context of FIG. 20 and FIG. 22C also apply to this embodiment of a connected array 17 of plural inflatable linear heliostatic concentrating solar modules 1A. The connected array 17 of plural inflatable linear heliostatic concentrating solar modules 1A harvests solar renewable energy using photovoltaic means supplemented in some preferred embodiments by solar thermal energy harvesting means.

The same tethered barges 17TB that hold the floating connected array 17F (for collecting solar energy) in place, also hold in place (i) a water current energy harvesting system 87C with plural hydrofoils 87H connected by a hydrofoil connecting structure 87HC that is a ring shaped structure in the illustrated embodiment, and (ii) a wind energy harvesting system 87W with plural airfoils 87AF connected by an airfoil connecting structure 87AC that comprises two concentric ring structures in the illustrated embodiment. Note for illustration clarity, only a few of the plural hydrofoils 87H that are connected all around the ring shaped hydrofoil connecting structure 87HC are shown in the Figure. The angles of attack of the airfoils 87AF and hydrofoils 87H are intended to be controllable as these fluid foils move along substantially circular paths, to optimize energy extraction from the wind and water current vector fields present at any given time. For the illustrated wind direction 87AD (assumed uniform vector field for illustrative purposes) and the illustrated water current direction 87HD (assumed uniform vector field for illustrative purposes), the illustrated angles of attack will cause both the airfoil connecting structure 87AC and the hydrofoil connecting structure 87HC to rotate clockwise in the illustrated view, with mechanical energy then convertible to electrical energy by generator means 80 at the interface between these connecting structures and the structural connections with the tethered barges 17TB. These generator means 80 are over and above the generator means 80 associated with the thermodynamic cycle engine 78E associated with the connected array 17 of plural inflatable linear heliostatic concentrating solar modules 1A. Electrical power from the various generator means 80 as well as the solar cells of the solar photovoltaic modules 1 can be consolidated and conditioned at electric power conditioning means 80C, optionally stored in electric energy storage means 80S (e.g., a variety of means such as battery means, electrolysis plus fuel cell means, thermal storage means, mechanical storage means such as flywheel means, supercapacitor means, etc.), and transmitted by electric power transmission means 80T such as underwater power transmission cables leading to utility or commercial or private customers or users. The electric power transmission means 80T may comprise superconducting cables, high to ultra high voltage AC cables, high to ultra high voltage DC cables, and other transmission means known from the state-of-the-art.

It will be understood that in variant embodiments of the embodiment of FIG. 22F, water current and wind energy harvesting systems may not both be provided, but only one or the other. Representative diameters of the floating connected array 17F may range from 20 meters to 20,000 meters, without limitation. As illustrated, these would correspond with solar module 1A lengths ranging from about 1.9 to 1900 meters, chords of airfoils 87AF ranging from about 0.9 to 900 meters, and chords of hydrofoils 87H ranging from about 0.25 meter to 250 meters. While airfoil and hydrofoil heights (or spans, out of the page and into the page in the plan view of FIG. 22F) may vary considerably for aspect ratios ranging from 2 to 40, as is known from the art of airfoil and hydrofoil wing design, for representative and not limiting aspect ratios of 5 and some typical taper ratios, the corresponding ranges of airfoils 87AF heights would range approximately from 3 to 3,000 meters, while the corresponding range of hydrofoil 87H heights (or depths under the water surface 16W) would range approximately from 1 meter to 1000 meters. It will also be understood that varying scales of devices such as solar modules 1A, airfoils 87AF and hydrofoils 87H, can be mixed and matched in embodiments of this class, within the spirit and scope of the invention.

In addition to the illustrated wind energy harvesting subsystem and ocean current/tidal current energy harvesting subsystem that are connected with the connected array 17 of plural inflatable linear heliostatic concentrating solar modules 1A, FIG. 22F further illustrates a connected ocean thermal energy harvesting system 87T that includes deep cold water inlet means 87DC for intaking deep cold water for use at the low temperature part of a thermodynamic cycle engine 78E, which may be the same and/or different from a thermodynamic cycle engine 78E using heat energy collected by at least some of the plural inflatable linear heliostatic concentrating solar modules 1A. Where different, the high temperature part of the Ocean Thermal Energy Conversion (OTEC) subsystem may use heat from warmer water collected from near-surface warm water inlet means 87SW. Electrical power from the OTEC will also preferably connect with the aforementioned electric power conditioning means 80C, electric energy storage means 80S, and electric power transmission means 80T.

FIG. 22F thus illustrates a connected array 17 of plural inflatable linear heliostatic concentrating solar modules 1A, further comprising an additional renewable energy harvesting system 87 that is connected to said floating connected array 17F, which additional renewable energy harvesting system 87 comprises at least one of (i) a wind energy harvesting system 87W with airfoils 87AF that revolve around said floating connected array 17F, (ii) a water current energy harvesting system 87C with hydrofoils 87H that revolve around said floating connected array 17F, and (iii) an ocean thermal energy harvesting system 87T that includes deep cold water inlet means 87DC for intaking deep cold water for use at the low temperature part of a thermodynamic cycle engine 78E.

Note that the airfoils 87AF may be airfoils, wings, semi-rigid airfoils, inflated or partially inflated airfoils, wire or strut braced airfoils, sails, and other airfoil types known in the art. Various airfoil planforms, spans, chords, aspect ratios, tapers, twist distributions, camber distributions and airfoil sections may similarly be used. Various airfoil structures may also be used. Similarly a wide variety of hydrofoils 87H may also be used.

Figure 22G:
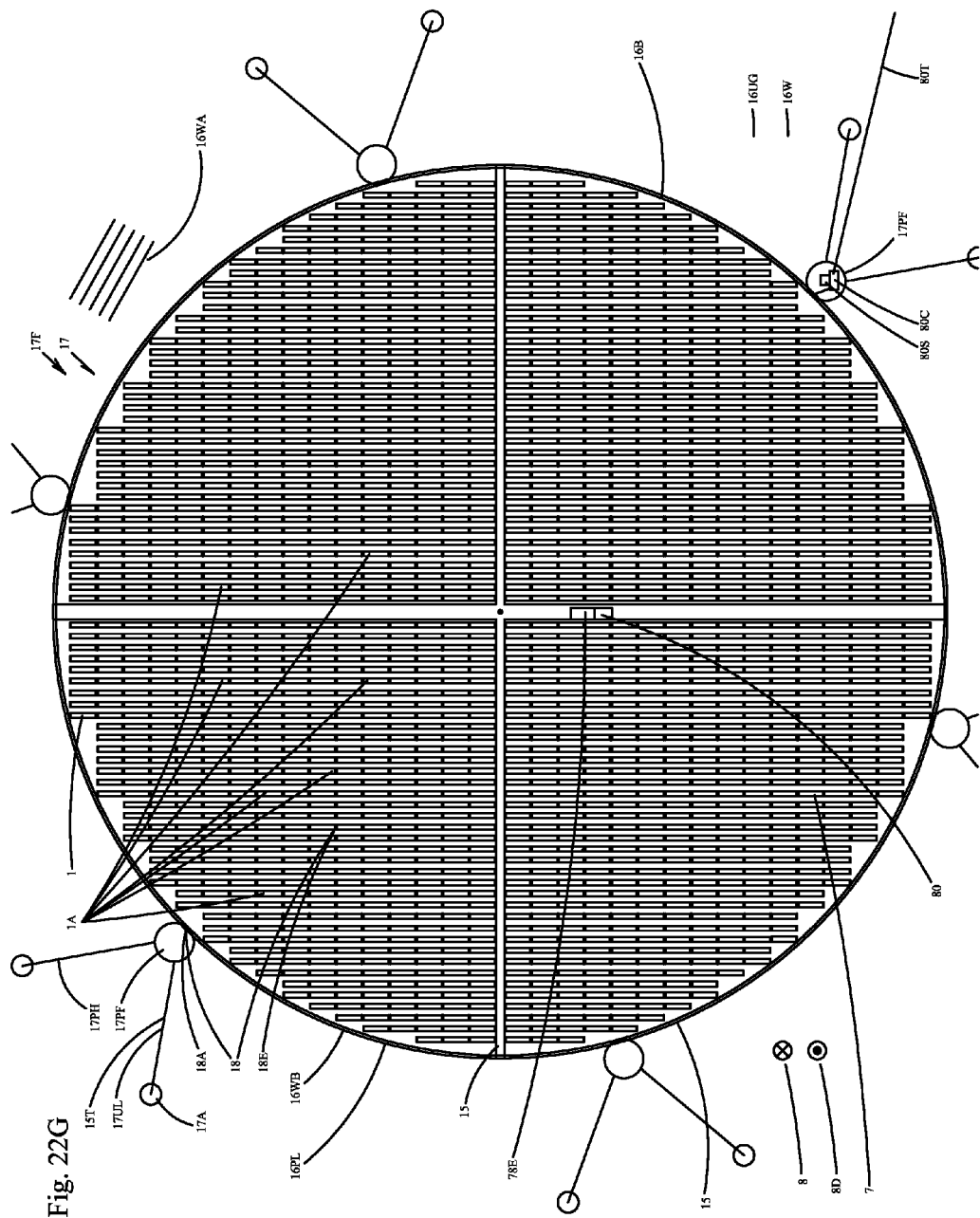

FIG. 22G shows a plan view of an embodiment of a floating connected array 17F similar in many aspects to the embodiments of FIGS. 22A, 22B, 22C and 22E, but with more inflatable linear heliostatic concentrating solar modules 1A, numbering 1,920 but number not limiting. The scale of this embodiment will typically but not necessarily be larger than the scale of the embodiments of FIGS. 22A, 22B, 22C and 22E. Representative diameters of the floating connected array 17F may range from 50 meters to 50 kilometers, without limitation. Electrical power from the generator means 80 as well as the solar cells of the solar photovoltaic modules 1 can be consolidated and conditioned at electric power conditioning means 80C, optionally stored in electric energy storage means 80S (e.g., a variety of means such as battery means, electrolysis plus fuel cell means, thermal storage means, mechanical storage means such as flywheel means, supercapacitor means, etc.), and transmitted by electric power transmission means 80T such as underwater power transmission cables leading to utility or commercial or private customers or users. The electric power transmission means 80T may comprise superconducting cables, high to ultra high voltage AC cables, high to ultra high voltage DC cables, and other transmission means known from the state-of-the-art.

Figure 23A:
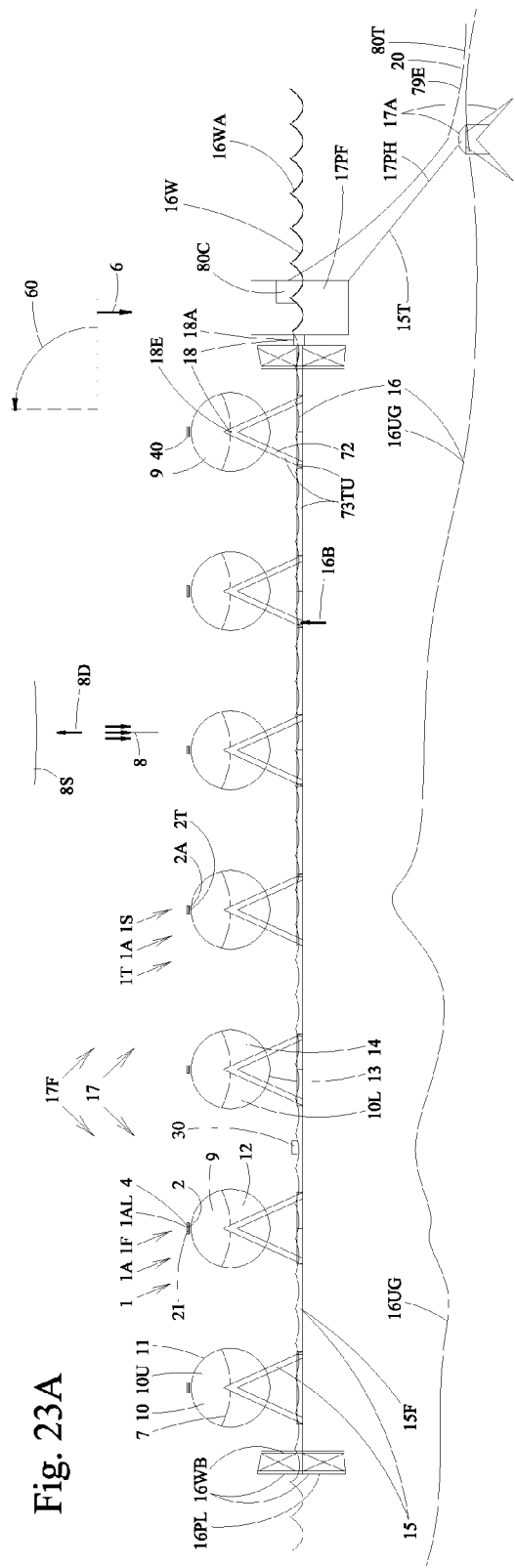
FIGS. 23A through 23D show partial sectional views of various floating embodiments of the invention.

FIG. 23A shows a partial sectional view of the floating embodiment described earlier with reference to the plan view shown in FIG. 22A. Some features of the embodiment of FIG. 22A can be better understood from the partial sectional view shown in FIG. 23A. Note that the buoyancy force 16B acts on support structure 15 that is floating support structure 15F that uses plural tubular frame elements 73TU with many watertight compartments (not visible in this view) so as to maintain buoyancy even in the event of damage or rupture of one watertight compartment. Note also that the illustrated wave breaking means 16WB at the perimeter location 16PL uses two spaced wall like members that may be continuous or have holes or slats or water flow deflection foils; and that the two spaced wall like members are shown connected by bracing wire and/or truss structure. Many alternate wave breaking means 16WB using a variety of wave reflection and/or wave deflection and/or wave energy absorption elements, are possible within the spirit and scope of the invention.

Figure 23B:
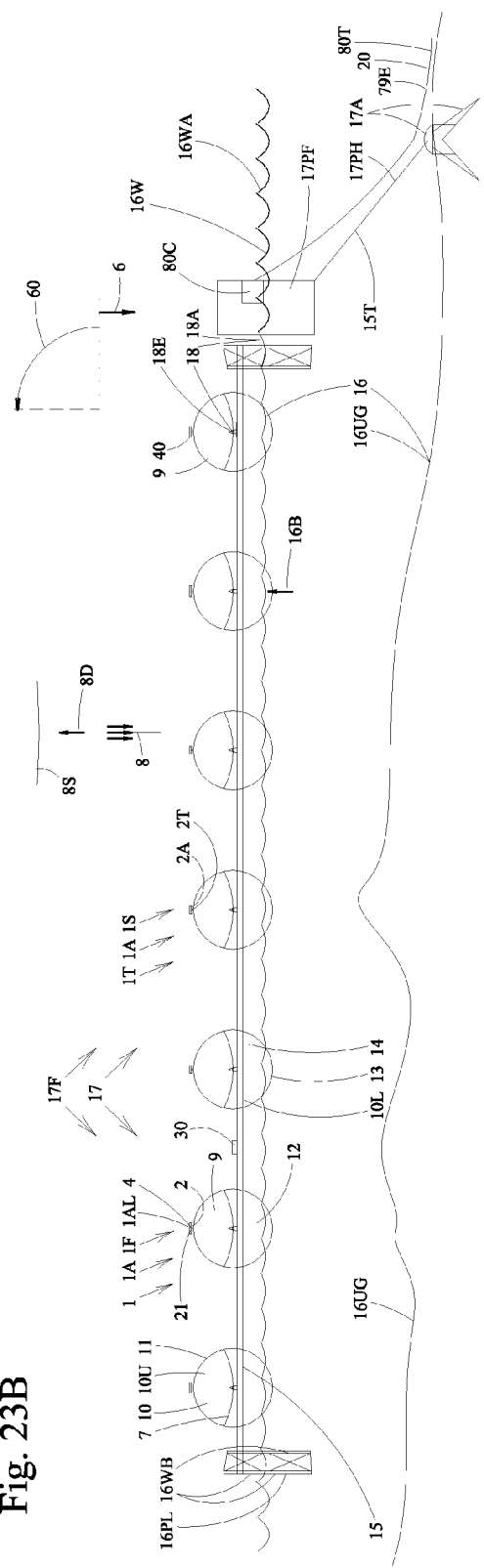

FIG. 23B shows a partial sectional view of another floating embodiment, in which the buoyancy force 16B acts directly on the inflatable linear heliostatic concentrating solar modules 1A, with the water surface 16W displaced by the bottom surfaces 13.

Figure 23C:
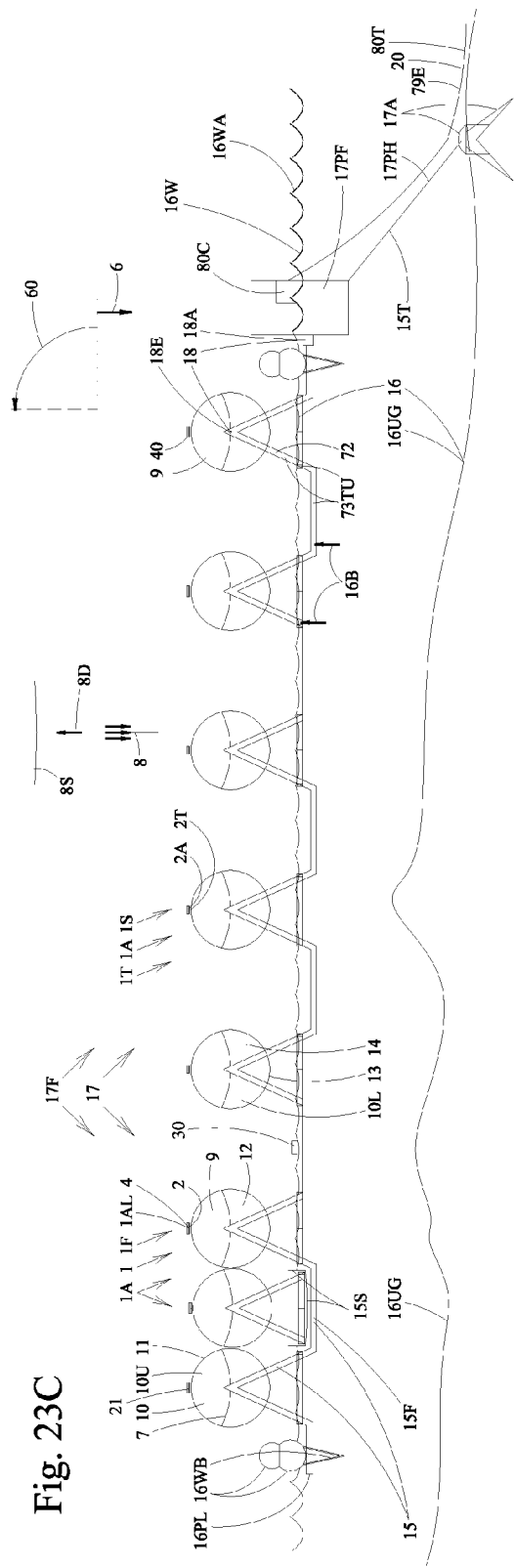

FIG. 23C shows a partial sectional view of a floating embodiment similar in many ways to that described in FIG. 23A, with a few notable differences. One difference is the use of inflated perimeter rings combined with underwater skinned truss structure for the wave breaking means 16WB, as illustrated. Another difference is the use of a support structure 15 that has portions significantly below the mean level of the water surface 16W, to permit installation, removal and maintenance access using a shallow draught boat serving as a movable service support structure 15S, as illustrated. The movable service support structure 15S is shown in the process of transporting a replacement solar module 1A between adjacent rows of installed solar modules 1A. Lift or jack or crane means (not shown) may optionally be provided on the movable service support structure 15S, for facilitating installation and de-installation of solar modules 1A. In alternate embodiments a movable service support structure 15S may utilize a wheel supported device (not shown) rather than a buoyancy supported device, with the wheels running on tracks or paved or fabricated support strips with edge guides.

Figure 23D:
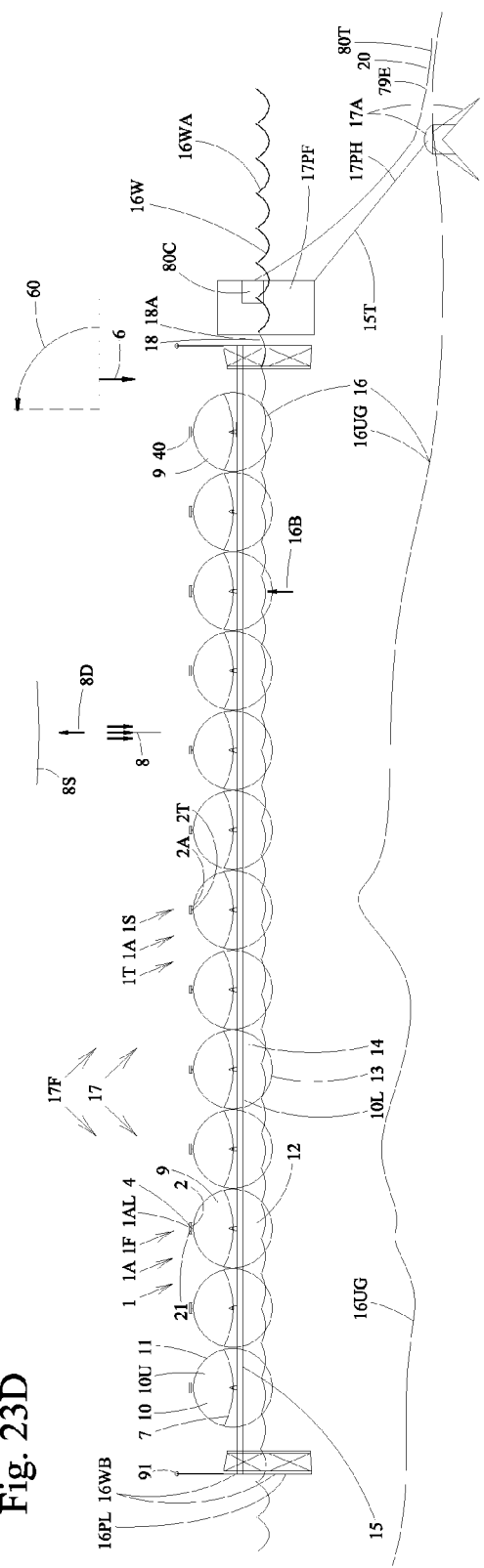

FIG. 23D shows a partial sectional view of a floating embodiment in many ways similar to that of FIG. 23B, but different in having much more closely spaced solar modules 1A that go with the type of floating solar energy harvesting system that has only azimuth heliostatic tracking with no elevation tracking, as described earlier in the context of the embodiment of FIG. 21. FIG. 23D also illustrates the installation of a warning device 91, such as a light or beacon or flag or sign, to warn people in vehicles (e.g., boats or ships or planes) from coming dangerously close to the floating solar energy harvesting system.

The various embodiments described above will preferably incorporate appropriate safety features, warning labels to keep eyes away from concentrated light, fingers and body parts away from high temperature areas, and features to minimize risk of inflatable explosion, among others.

While several preferred embodiments have been described in detail above with reference to the Figures, it should be understood that further variations and modifications are possible within the spirit and scope of the invention as claimed.

REFERENCES

U.S. Pat. No. 5,404,868, "Apparatus Using a Balloon Supported Reflective Surface for Reflecting Light from the Sun"
U.S. patent application Ser. No. 11/651,396, "Inflatable Heliostatic Solar Power Collector"
U.S. patent application Ser. No. 11/986,240, "Fluid-Dynamic Renewable Energy Harvesting System"

What is claimed is:

1. A connected array of plural inflatable linear heliostatic concentrating solar modules, which solar modules include at least one inflatable linear heliostatic concentrating cooled solar photovoltaic module,
   wherein each said solar module comprises an elongated solar receiver including a portion of substantially linear geometry with a linear axis;
   wherein each said solar module comprises a reflection and concentration surface for reflecting and concentrating sunrays;
   wherein each said solar module comprises a substantially enclosed elongated inflatable volume comprising (i) an upper inflatable volume above said reflection and concentrating surface, with a substantially transparent surface above said upper inflatable volume, and further comprising (ii) a lower volume below said reflection and concentrating surface, with a bottom surface below said lower volume;
   wherein said solar photovoltaic module comprises an elongated solar receiver that is an elongated solar photovoltaic receiver and wherein said solar photovoltaic module includes cooling means for removing excess heat from said elongated solar photovoltaic receiver, said cooling means including a heated cooling fluid that is heated by heat from said elongated solar photovoltaic receiver;
   further comprising connecting means for connecting said plural inflatable linear heliostatic concentrating solar modules comprising heated fluid connecting means for conveying heat energy in heated cooling fluid outflow from said solar photovoltaic module to a heated fluid stream inflow into a higher temperature second solar module wherein the heated fluid stream is further heated by concentrated radiation energy received from the reflection and concentration surface for reflecting and concentrating sunrays in the second solar module;
   further comprising support structure for supporting said plural inflatable linear heliostatic concentrating solar modules on a supporting surface;
   further comprising heliostatic control means for aiming at least one rotatable portion of said connected array of plural inflatable linear heliostatic concentrating solar modules, as a function of time, such that incoming sunrays from a sunward direction will be reflected and concentrated by said reflection and concentration surfaces, onto said elongated solar receivers at a concentration ratio of at least two suns; and further comprising electrical power means for collecting and transmitting electrical power from said elongated solar photovoltaic receiver.

2. The connected array of plural inflatable linear heliostatic concentrating solar modules of claim 1, wherein the elongated solar receiver of the second solar module includes an elongated solar thermal receiver which heats the heated fluid stream to a higher temperature by using concentrated radiation energy received from the reflection and concentration surface for reflecting and concentrating sunrays in the second solar module;
and further comprising beneficial heat use means for beneficially using heat from said heated fluid stream outflow from said second solar module, which beneficial heat use means comprises at least one of:
(i) supplemental electrical power means for harvesting additional power from the Sun, which supplemental electrical power means comprises supplemental thermodynamic power means for harvesting additional power from the Sun, wherein said heated fluid stream outflow from said second solar module that has been heated by the elongated solar thermal receiver serves at least in contributory part to heating a working fluid for a thermodynamic cycle engine, which thermodynamic cycle engine serves as means for harvesting mechanical energy from heat energy in said heated fluid stream outflow, with generator means for converting at least some of said mechanical energy into electrical energy;
(ii) supplemental electrical power means for harvesting additional power from the Sun, which supplemental electrical power means comprises supplemental thermoelectric means for harvesting additional power from the Sun, which supplemental thermoelectric means acts as means for directly harvesting electrical energy from heat energy in said heated fluid stream outflow from said second solar module; and
(iii) beneficial means for using heat energy in said heated fluid stream outflow from said second solar module for providing beneficial heat to at least one of a building, a home, a swimming pool, a hot water tank, a heating appliance, a heating device, a dryer, a cooking appliance, a cooking device, an industrial process, and a chemical process.

3. The connected array of plural inflatable linear heliostatic concentrating solar modules of claim 1, wherein said supporting surface comprises a water surface above an underwater ground surface, wherein said connected array of plural inflatable linear heliostatic concentrating solar modules comprises a floating connected array supported at least in part by a buoyancy force;
wherein said heliostatic control means comprises at least one of (i) azimuth heliostatic control means for rotating said floating connected array on said water surface to substantially follow the azimuth angle of the incoming sunrays over a period of solar time with the linear axis of each said solar module aligned substantially parallel with said azimuth angle of the incoming sunrays; and (ii) a combination of (a) azimuth heliostatic control means for rotating said floating connected array on said water surface to substantially follow the azimuth angle of the incoming sunrays over a period of solar time with the linear axis of each said solar module aligned substantially perpendicular to said azimuth angle of the incoming sunrays, and (b) elevation heliostatic control means for controlling the elevation orientation of rotatable portions of said plural inflatable linear heliostatic concentrating solar modules including said reflection and concentration surfaces and said solar receivers, to substantially follow the elevation angle of the incoming sunrays over a period of solar time.

4. The connected array of plural inflatable linear heliostatic concentrating solar modules of claim 3, wherein said floating connected array can be held in a desired position envelope by position holding means for holding said floating connected array in said desired position envelope, which position holding means includes anchor means for anchoring members in said underwater ground surface, and underwater link means comprising at least one of tethers, cables, rods, posts, beams, trusses and plates for linking the underwater anchor means to at least one positioning float; and wherein said azimuth heliostatic control means includes powered control means for azimuthally rotating said floating connected array relative to at least one positioning float.

5. The connected array of plural inflatable linear heliostatic concentrating solar modules of claim 3, further comprising wave breaking means located at least in part along a perimeter location on the periphery around said floating connected array, which wave breaking means serves as means for at least one of blocking and reducing the magnitude of incoming waves on the water surface that approach said floating connected array from outside the vicinity of said floating connected array.

6. The connected array of plural inflatable linear heliostatic concentrating solar modules of claim 3, further comprising an additional renewable energy harvesting system that is connected to said floating connected array, which additional renewable energy harvesting system comprises at least one of (i) a wind energy harvesting system with airfoils that revolve around said floating connected array, (ii) a water current energy harvesting system with hydrofoils that revolve around said floating connected array, and (iii) an ocean thermal energy harvesting system that includes deep cold water inlet means for intaking deep cold water for use at the low temperature part of a thermodynamic cycle engine.

* * * * *